United States Patent
Kuroiwa et al.

(10) Patent No.: US 11,803,122 B2
(45) Date of Patent: Oct. 31, 2023

(54) CHEMICAL AMPLIFICATION-TYPE PHOTOSENSITIVE COMPOSITION, PHOTOSENSITIVE DRY FILM, PRODUCTION METHOD OF PATTERNED RESIST LAYER, PRODUCTION METHOD OF PLATED MOLDED ARTICLE, COMPOUND, AND PRODUCTION METHOD OF COMPOUND

(71) Applicant: TOKYO OHKA KOGYO CO., LTD., Kawasaki (JP)

(72) Inventors: Yasushi Kuroiwa, Kawasaki (JP); Kazuaki Ebisawa, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 206 days.

(21) Appl. No.: 17/302,667

(22) Filed: May 10, 2021

(65) Prior Publication Data
US 2021/0356863 A1 Nov. 18, 2021

(30) Foreign Application Priority Data
May 18, 2020 (JP) ................. 2020-086809

(51) Int. Cl.
| | | |
|---|---|---|
| *G03F 7/027* | (2006.01) | |
| *G03F 7/039* | (2006.01) | |
| *G03F 7/20* | (2006.01) | |
| *C25D 5/38* | (2006.01) | |
| *C25D 7/12* | (2006.01) | |
| *C25D 5/02* | (2006.01) | |
| *G03F 7/004* | (2006.01) | |

(52) U.S. Cl.
CPC ............ *G03F 7/027* (2013.01); *C25D 5/022* (2013.01); *C25D 5/38* (2013.01); *C25D 7/12* (2013.01); *G03F 7/0045* (2013.01); *G03F 7/0392* (2013.01); *G03F 7/20* (2013.01)

(58) Field of Classification Search
CPC . G03F 7/26; G03F 7/40; G03F 7/0397; G03F 7/20; G03F 7/0045; G03F 7/027; C07C 323/29; C07C 319/20; C07C 323/25; C25D 7/12; C25D 5/38; C25D 5/022
See application file for complete search history.

(56) References Cited

U.S. PATENT DOCUMENTS

2012/0003436 A1*  1/2012  Saie .................. G03F 7/0047
                                               430/323
2013/0078572 A1*  3/2013  Shimizu ............. G03F 7/0045
                                               430/281.1

FOREIGN PATENT DOCUMENTS

| EP | 2684869 B1 * | 10/2015 | ........... C07C 319/06 |
|---|---|---|---|
| JP | H 09-176112 A | 7/1997 | |
| JP | H 11-052562 A | 2/1999 | |

* cited by examiner

*Primary Examiner* — Mark F. Huff
*Assistant Examiner* — Andrew Preston Traywick
(74) *Attorney, Agent, or Firm* — Knobbe, Martens, Olson & Bear, LLP

(57) ABSTRACT

A chemically amplified photosensitive composition used for forming a patterned resist film by photolithography on a metal surface of a substrate which at least partly has a surface consisting of metal. The composition includes an acid generator which generates an acid by irradiation of active rays or radioactive rays; and a compound and/or a precursor compound, in which the molar absorption coefficient ε at a wavelength of 365 nm of the compound is at least 3000, the compound has a metal coordination group, and the compound can be formed from the precursor compound during formation of the patterned resist film.

8 Claims, No Drawings

CHEMICAL AMPLIFICATION-TYPE PHOTOSENSITIVE COMPOSITION, PHOTOSENSITIVE DRY FILM, PRODUCTION METHOD OF PATTERNED RESIST LAYER, PRODUCTION METHOD OF PLATED MOLDED ARTICLE, COMPOUND, AND PRODUCTION METHOD OF COMPOUND

This application claims priority to Japanese Patent Application No. 2020-086809, filed May 18, 2020, the content of which is incorporated herein by reference in its entirety.

BACKGROUND OF THE INVENTION

Field of the Invention

The present invention relates to a chemically amplified photosensitive composition used in order to form a resist film which was patterned by photolithography on a metal surface of a substrate which at least partly has a surface consisting of metal; a photosensitive dry film including a photosensitive layer consisting of this chemically amplified photosensitive composition; a production method of a resist film patterned using the aforementioned chemically amplified photosensitive composition; a production method of a plated article using the aforementioned patterned resist film as a template; a compound which is preferably used in the aforementioned chemically amplified photosensitive composition photosensitive composition; and a production method of a compound preferably used in the aforementioned chemically amplified photosensitive composition photosensitive composition.

Related Art

Photofabrication is now the mainstream of a microfabrication technique. Photofabrication is a generic term describing the technology used for manufacturing a wide variety of precision components such as semiconductor packages. The manufacturing is carried out by applying a photoresist composition to the surface of a processing target to form a photoresist layer, patterning this photoresist layer using photolithographic techniques, and then conducting chemical etching, electrolytic etching, or electroforming based mainly on electroplating, using the patterned photoresist layer (photoresist pattern) as a mask.

In recent years, high density packaging technologies have progressed in semiconductor packages along with downsizing electronics devices, and the increase in package density has been developed on the basis of mounting multi-pin thin film in packages, miniaturizing of package size, two-dimensional packaging technologies in flip-tip systems or three-dimensional packaging technologies. In these types of high density packaging techniques, connection terminals, for example, protruding electrodes (mounting terminals) known as bumps that protrude above the package or metal posts that extend from peripheral terminals on the wafer and connect rewiring with the mounting terminals, are disposed on the surface of the substrate with high precision.

In the photofabrication as described above, a photoresist composition is used, and chemically amplified photosensitive compositions containing an acid generator have been known as such a photoresist composition (see Patent Documents 1, 2 and the like). According to the chemically amplified photosensitive composition, an acid is generated from the acid generator upon irradiation with radiation (exposure) and diffusion of the acid is promoted through heat treatment, to cause an acid catalytic reaction with a base resin and the like in the composition resulting in a change to the alkali-solubility of the same.

Such chemically amplified positive-type photosensitive compositions are used, for example, in formation of plated articles such as bumps, metal posts, and Cu-rewiring by a plating step, in addition to patterned insulating film or formation of etching mask. Specifically, a photoresist layer having a desired film thickness is formed on a support such as a metal substrate using a chemically amplified photosensitive composition, and the photoresist layer is exposed through a predetermined mask pattern and is developed. Thereby, a patterned resist film used as a template in which portions for forming plated articles have been selectively removed (stripped) is formed. Then, bumps or metal posts, and Cu rewiring can be formed by embedding a conductor such as copper into the removed portions (nonresist portions) using plating, and then removing the surrounding resist film.

Patent Document 1: Japanese Unexamined Patent Application, Publication No. H09-176112
Patent Document 2: Japanese Unexamined Patent Application, Publication No. H11-52562

SUMMARY OF THE INVENTION

As semiconductor packages become even denser, the further increased density and increased accuracy of bump electrodes, metal posts, etc. has become demanded. In order to realize further increased density and increased accuracy of bump electrodes, a chemically amplified photosensitive composition which can form a resist film for which dimensions are precisely controlled is demanded.

Bump electrodes, metal posts, etc. are often formed on a metal surface consisting of a metal such as copper on the substrate. However, in the case of forming a patterned resist film which can be used as a template for plating on a metal surface using a conventionally known chemically amplified resist composition such as those disclosed in Patent Documents 1, 2, etc., there has been a problem in that variations tend to arise in the dimensions of the patterned resist film, due to a slight film thickness difference in the resist film.

The present invention has been made taking account of the above-mentioned problems, and has an object of providing a chemically amplified photosensitive composition which can suppress variation in dimensions of a patterned resist film caused by film thickness differences in the resist film, in the case of forming a patterned resist film on the metal surface of a substrate; a photosensitive dry film including a photosensitive layer consisting of this chemically amplified photosensitive composition; a production method of a resist film patterned using the aforementioned chemically amplified positive photosensitive composition; a production method of a plated article using the aforementioned patterned resist film as a template; a compound which is preferably used in the aforementioned chemically amplified photosensitive composition; and a production method of a compound preferably used in the aforementioned chemically amplified photosensitive composition.

As a result of diligently researching in order to achieve the above-mentioned object, the present inventors found that it was possible to solve the above-mentioned problem, by blending a compound (C1) having a metal orientation group having a molar absorption coefficient ε at a wavelength of 365 nm of at least 3,000, or a precursor compound (C2) thereof, into a chemically amplified photosensitive composition containing an acid generator (A) which generates an acid by irradiation of active rays or radioactive rays. More specifically, the present invention provides the following.

A first aspect of the present invention is a chemically amplified photosensitive composition used for forming a patterned resist film by photolithography on a metal surface of a substrate which at least partly has a surface consisting of metal, the composition including:

an acid generator (A) which generates an acid by irradiation of active rays or radioactive rays; and a compound (C1) and/or a precursor compound (C2), in which molar absorption coefficient ε at a wavelength of 365 nm of the compound (C1) is at least 3000, the compound (C1) has a metal coordination group, and the compound (C1) can be formed from the precursor compound (C2) during formation of the patterned resist film.

A second aspect of the present invention is a photosensitive dry film including: a base film, and a photosensitive layer formed on a surface of the base film, in which the photosensitive layer consisting of the chemically amplified photosensitive composition according to the first aspect.

A third aspect of the present invention is a production method for a patterned resist film, the method including: laminating a photosensitive layer consisting of the chemically amplified photosensitive composition according to the first aspect, on a metal surface of a substrate which at least partly has a surface consisting of metal; position selectively irradiating active rays or radioactive rays onto the photosensitive layer; and developing the photosensitive layer after exposure.

A fourth aspect of the present invention is a production method of a plated article, the method including: producing a patterned resist film on a metal surface of a substrate which at least partly has a surface consisting of metal, by way of the production method for a patterned resist film according to the third aspect; and forming a plated article with the resist film which was patterned as a template.

A fifth aspect of the present invention is a compound represented by Formula (C2-1) below:

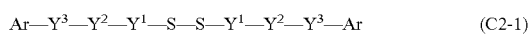

$$Ar-Y^3-Y^2-Y^1-S-S-Y^1-Y^2-Y^3-Ar \quad (C2\text{-}1)$$

in which, in Formula (C2-1), $Y^1$ is a single bond or an alkylene group having 1 or more and 5 or less carbon atoms, $Y^2$ is —CO—O— or —O—CO—, $Y^3$ is a single bond or an alkylene group having 1 or more and 5 or less carbon atoms, and Ar is an aromatic group which may have a substituent.

A sixth aspect of the present invention is a production method for the compound according to the fifth aspect, including a condensation step of condensing a compound represented by Formula (C2-1a) below and a compound represented by Formula (C2-1b) below, or condensing a compound represented by Formula (C2-1c) below and a compound represented by Formula (C2-1d) below:

$$Ar-Y^3-OH \quad (C2\text{-}1a)$$

$$Y^4-CO-Y^1-S-S-Y^1-CO-Y^4 \quad (C2\text{-}1b)$$

$$Ar-Y^3-CO-Y^4 \quad (C2\text{-}1c)$$

$$HO-Y^1-S-S-Y^1-OH \quad (C2\text{-}1d)$$

in which, in Formula (C2-1a), Formula (C2-1b), Formula (C2-1c) and Formula (C2-1d), $Y^1$, $Y^2$, $Y^3$ and Ar are the same as in Formula (C2-1), and $Y^4$ is a hydroxyl group or a halogen atom.

A seventh aspect of the present invention is a production method for a compound represented by Formula (C1-1) below, the method including a reduction step of reducing the compound according to the fifth aspect to generate a compound represented by Formula (C1-1) below:

$$Ar-Y^3-Y^2-Y^1-SH \quad (C1\text{-}1)$$

in which, in Formula (C1-1), $Y^1$, $Y^2$, $Y^3$ and Ar are the same as in Formula (C2-1).

According to the present invention, it is possible to provide a chemically amplified photosensitive composition which can suppress variation in dimensions of a patterned resist film caused by film thickness differences in the resist film, in the case of forming a patterned resist film on the metal surface; a photosensitive dry film including a photosensitive layer consisting of this chemically amplified photosensitive composition; a production method of a resist film patterned using the aforementioned chemically amplified photosensitive composition; a production method of a plated article using the aforementioned patterned resist film as a template; a compound which is preferably used in the aforementioned chemically amplified photosensitive composition; and a production method of a compound preferably used in the aforementioned chemically amplified photosensitive composition.

DETAILED DESCRIPTION OF THE INVENTION

<<Chemically Amplified Photosensitive Composition>>

The chemically amplified photosensitive composition is used in order to form a resist film patterned by a photolithography method, on a metal surface of a substrate having at least partly a surface consisting of metal. The chemically amplified photosensitive composition contains an acid generator (A) (also noted below as acid generator (A)) which generates an acid by irradiation of active rays or radioactive rays; and a compound (C1) described later and/or a precursor compound (C2) thereof. The compound (C1) shows at least 3000 as the molar absorption coefficient ε at a wavelength of 365 nm, and has a metal coordination group.

By using a chemical amplification-type photosensitive composition satisfying the above requirements, it is possible to suppress variation in the dimensions of a patterned resist film caused by film thickness differences in the resist film, in the case of forming a patterned resist film on a metal surface.

The chemically amplified photosensitive composition is the same as a conventionally known chemically amplified photosensitive composition including an acid generator (A) except that the acid generator (A), and a compound (C1) and/or a precursor compound (C2) thereof described later. The chemically amplified photosensitive composition may be a positive-type photosensitive composition whose solubility in a developing solution increases under the action of acid generated upon exposure to light, and may be a negative-type photosensitive composition whose solubility in a developing solution decreases under the action of acid under generated upon exposure to light.

Examples of the positive-type chemically amplified photosensitive composition include a photosensitive composition including a resin (B) whose solubility in alkali increases under an action of acid, including an alkali soluble group protected by a group to be deprotected by the action of acid such as a tert-butyl group, a tert-butoxy carbonyl group, a tetrahydropyranyl group, an acetal group, and a trimethylsilyl group in addition to the acid generator (A) and a compound (C1) and/or a precursor compound (C2) thereof described later. Examples of the negative-type chemically amplified photosensitive composition include a photosensitive composition including the acid generator (A) and the compound (C1) and/or the precursor compound (C2) thereof described later as well as a condensing agent such as methylol melamine, and a resin which can be crosslinked by a condensing agent such as novolak resin. When such a photosensitive composition is exposed to light, the photosensitive composition is cured by a crosslinking reaction caused by an acid generated by the exposure. Furthermore, as the negative-type chemically amplified photosensitive composition, a photosensitive composition including an epoxy compound together with the acid generator (A) and the compound (C1) and/or the precursor compound (C2) thereof described later is preferable. When such a photosensitive composition is exposed to light, cationic polymerization of the epoxy compound proceeds by an acid generated by exposure to light, and as a result, the photosensitive composition is cured.

Among these chemically amplified photosensitive compositions, the chemically amplified positive-type photosensitive composition including an acid generator (A), a resin (B) whose solubility in alkali increases under an action of acid, and a compound (C1) and/or a precursor compound (C2) thereof described later is preferable, because desired high sensitivity can be achieved particularly easily, and because the patterned resist film is easily provided with desired characteristics by adjusting the types of constituent units or the ratio of the constituent units of a resin (B) whose solubility in alkali increases under an action of acid.

Hereinafter, as a representative example of the chemically amplified photosensitive composition, as to a chemically amplified positive-type photosensitive composition (hereinafter, also referred to as "photosensitive composition") including an acid generator (A), a resin (B) whose solubility in alkali increases under an action of acid (hereinafter, also referred to as "resin (B)", and a compound (C1) and/or a precursor compound (C2) thereof described later, essential or optional components, and the manufacturing method will be described. Note here that the below-mentioned acid generator (A) and the compound (C1) and/or the precursor compound (C2) thereof described later are applicable to photosensitive compositions other than the positive-type photosensitive composition mentioned below.

<Acid Generator (A)>

The acid generator (A) is a compound capable of producing an acid when irradiated with an active ray or radiation, and is not particularly limited as long as it is a compound which directly or indirectly produces an acid under the action of light. The acid generator (A) is preferably any one of the acid generators of the first to fifth aspects that will be described below. Hereinafter, among the suitably used acid generators (A) in the photosensitive composition, suitable acid generators (A) will be described as the first to fifth aspects.

The first aspect of the acid generator (A) may be a compound represented by the following formula (a1).

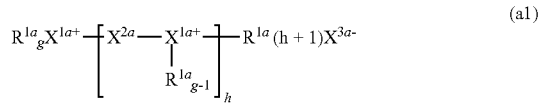

(a1)

In the formula (a1), $X^{1a}$ represents a sulfur atom or iodine atom respectively having a valence of g; g represents 1 or 2. h represents the number of repeating units in the structure within parentheses. $R^{1a}$ represents an organic group that is bonded to $X^{1a}$, and represents an aryl group having 6 or more and 30 or less carbon atoms, a heterocyclic group having 4 or more and 30 or less carbon atoms, an alkyl group having 1 or more and 30 or less carbon atoms, an alkenyl group having 2 or more and 30 or less carbon atoms, or an alkynyl group having 2 or more and 30 or less carbon atoms, and $R^{1a}$ may be substituted with at least one selected from the group consisting of an alkyl group, a hydroxyl group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, an alkyleneoxy group, an amino group, a cyano group, a nitro group, and halogen atoms. The number of $R^{1a}$s is g+h(g−1)+1, and the $R^{1a}$s may be respectively identical to or different from each other. Furthermore, two or more $R^{1a}$s may be bonded to each other directly or via —O—, —S—, —SO—, —SO$_2$—, —NH—, —NR$^{2a}$—, —CO—, —COO—, —CONH—, an alkylene group having 1 or more and 3 or less carbon atoms, or a phenylene group, and may form a ring structure including $X^{1a}$. $R^{2a}$ represents an alkyl group having 1 or more and 5 or less carbon atoms, or an aryl group having 6 or more and 10 or less carbon atoms.

$X^{2a}$ epresents a structure represented by the following formula (a2).

(a2)

In the above formula (a2), $X^{4a}$ represents an alkylene group having 1 or more and 8 or less carbon atoms, an arylene group having 6 or more and 20 or less carbon atoms, or a divalent group of a heterocyclic compound having 8 or more and 20 or less carbon atoms, and $X^{4a}$ may be substituted with at least one selected from the group consisting of an alkyl group having 1 or more and 8 or less carbon atoms, an alkoxy group having 1 or more and 8 or less carbon atoms, an aryl group having 6 or more and 10 or less carbon atoms, a hydroxyl group, a cyano group, a nitro group, and halogen atoms. $X^5$a represents —O—, —S—, —SO—, —SO$_2$—, —NH—, —NR$^{2a}$—, —CO—, —COO—, —CONH—, an alkylene group having 1 or more and 3 or less carbon atoms, or a phenylene group.

h represents the number of repeating units of the structure in parentheses. $X^{4a}$s in the number of h+1 and $X^{5a}$s in the number of h may be identical to or different from each other. $R^{2a}$ has the same definition as described above.

$X^{3a}$ represents a counterion of an onium, and examples thereof include a fluorinated alkylfluorophosphoric acid anion represented by the following formula (a17) or a borate anion represented by the following formula (a18).

(a17)

In the formula (a17), $R^{3a}$ represents an alkyl group having 80% or more of the hydrogen atoms substituted with fluorine atoms. j represents the number of $R^{3a}$s and is an integer of 1 or more and 5 or less. $R^{3a}$s in the number of j may be respectively identical to or different from each other.

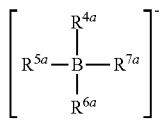

(a18)

In the formula (a18), $R^{4a}$ to $R^{7a}$ each independently represents a fluorine atom or a phenyl group, and a part or all of the hydrogen atoms of the phenyl group may be substituted with at least one selected from the group consisting of a fluorine atom and a trifluoromethyl group.

Examples of the onium ion in the compound represented by the above formula (a1) include triphenylsulfonium, tri-p-tolylsulfonium, 4-(phenylthio)phenyldiphenylsulfonium, bis[4-(diphenylsulfonio)phenyl]sulfide, bis[4-{bis[4-(2-hydroxyethoxy)phenyl]sulfonio}phenyl]sulfide, bis{4-[bis(4-fluorophenyl)sulfonio]phenyl}sulfide, 4-(4-benzoyl-2-chlorophenylthio)phenylbis(4-fluorophenyl)sulfonium, 7-isopropyl-9-oxo-10-thia-9,10-dihydroanthracen-2-yldi-p-tolylsulfonium, 7-isopropyl-9-oxo-10-thia-9,10-dihydroanthracen-2-yldiphenylsulfonium, 2-[(diphenyl)sulfonio]thioxanthone, 4-[4-(4-tert-butylbenzoyl)phenylthio]phenyldi-p-tolylsulfonium, 4-(4-benzoylphenylthio)phenyldiphenylsulfonium, diphenylphenacylsulfonium, 4-hydroxyphenylmethylbenzylsulfo-nium, 2-naphthylmethyl(1-ethoxycarbonyl)ethylsulfonium, 4-hydroxyphenylmethylphenacylsulfonium, phenyl[4-(4-biphenylthio)phenyl]-4-biphenylsulfonium, phenyl[4-(4-biphenylthio)phenyl]-3-biphenylsulfonium, [4-(4-acetophenylthio)phenyl]diphenylsulfonium, octadecylmethylphenacylsulfonium, diphenyliodonium, di-p-tolyliodonium, bis(4-dodecylphenyl)iodonium, bis(4-methoxyphenyl)iodonium, (4-octyloxyphenyl)phenyliodonium, bis(4-decyloxy)phenyliodonium, 4-(2-hydroxytetradecyloxy)phenylphenyliodonium, 4-isopropylphenyl(p-tolyl)iodonium, 4-isobutylphenyl(p-tolyl)iodonium, or the like.

Among the onium ions in the compound represented by the above formula (a1), a preferred onium ion may be a sulfonium ion represented by the following formula (a19).

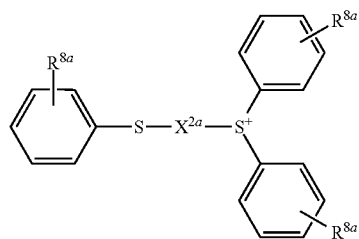

(a19)

In the above formula (a19), $R^{8a}$s each independently represents a hydrogen atom or a group selected from the group consisting of alkyl, hydroxyl, alkoxy, alkylcarbonyl, alkylcarbonyloxy, alkyloxycarbonyl, a halogen atom, an aryl, which may be substituted, and arylcarbonyl. $X^{2a}$ has the same definition as $X^{2a}$ in the above formula (a1).

Specific examples of the sulfonium ion represented by the above formula (a19) include 4-(phenylthio)phenyldiphenylsulfonium, 4-(4-benzoyl-2-chlorophenylthio)phenylbis(4-fluorophenyl)sulfonium, 4-(4-benzoylphenylthio)phenyldiphenylsulfonium, phenyl[4-(4-biphenylthio)phenyl]-4-biphenylsulfonium, phenyl[4-(4-biphenylthio)phenyl]-3-biphenylsulfonium, [4-(4-acetophenylthio)phenyl]diphenylsulfonium, and diphenyl[4-(p-terphenylthio)phenyl]diphenylsulfonium.

In regard to the fluorinated alkylfluorophosphoric acid anion represented by the above formula (a17), $R^{1a}$ represents an alkyl group substituted with a fluorine atom, and a preferred number of carbon atoms is 1 or more and 8 or less, while a more preferred number of carbon atoms is 1 or more and 4 or less. Specific examples of the alkyl group include linear alkyl groups such as methyl, ethyl, propyl, butyl, pentyl and octyl; branched alkyl groups such as isopropyl, isobutyl, sec-butyl and tert-butyl; and cycloalkyl groups such as cyclopropyl, cyclobutyl, cyclopentyl, and cyclohexyl. The proportion of hydrogen atoms substituted with fluorine atoms in the alkyl groups is usually 80% or more, preferably 90% or more, and even more preferably 100%. If the substitution ratio of fluorine atoms is less than 80%, the acid strength of the onium fluorinated alkylfluorophosphate represented by the above formula (a1) decreases.

A particularly preferred example of $R^{1a}$ is a linear or branched perfluoroalkyl group having 1 or more and 4 or less carbon atoms and a substitution ratio of fluorine atoms of 100%. Specific examples thereof include $CF_3$, $CF_3CF_2$, $(CF_3)_2CF$, $CF_3CF_2CF_2$, $CF_3CF_2CF_2CF_2$, $(CF_3)_2CFCF_2$, $CF_3CF_2(CF_3)CF$, and $(CF_3)_3C$. j which is the number of Rias represents an integer of 1 or more and 5 or less, and is preferably 2 or more and 4 or less, and particularly preferably 2 or 3.

Preferred specific examples of the fluorinated alkylfluorophosphoric acid anion include $[(CF_3CF_2)_2PF_4]^-$, $[(CF_3CF_2)_3PF_3]^-$, $[((CF_3)_2CF)_2PF_4]^-$, $[((CF_3)_2CF)_3PF_3]^-$, $[(CF_3CF_2CF_2)_2PF_4]^-$, $[(CF_3CF_2CF_2)_3PF_3]^-$, $[((CF_3)_2CFCF_2)_2PF_4]^-$, $[((CF_3)_2CFCF_2)_3PF_3]^-$, $[(CF_3CF_2CF_2CF_2)_2PF_4]^-$, or $[(CF_3CF_2CF_2)_3PF_3]^-$. Among these, $[(CF_3CF_2)_3PF_3]^-$, $[(CF_3CF_2CF_2)_3PF_3]^-$, $[((CF_3)_2CF)_3PF_3]^-$, $[((CF_3)_2CF)_2PF_4]^-$, $[((CF_3)_2CFCF_2)_3PF_3]^-$, or $[((CF_3)_2CFCF_2)_2PF_4]^-$ are particularly preferred.

Preferred specific examples of the borate anion represented by the above formula (a18) include tetrakis(pentafluorophenyl)borate ($[B(C_6F_5)_4]^-$), tetrakis[(trifluoromethyl)phenyl]borate ($[B(C_6H_4CF_3)_4]^-$), difluorobis(pentafluorophenyl)borate ($[(C_6F_5)_2BF_2]^-$), trifluoro(pentafluorophenyl)borate ($[(C_6F_5)BF_3]^-$), and tetrakis(difluorophenyl)borate ($[B(C_6H_3F_2)_4]^-$). Among these, tetrakis(pentafluorophenyl)borate ($[B(C_6F_5)_4]^-$) is particularly preferred.

The second aspect of the acid generator (A) include halogen-containing triazine compounds such as 2,4-bis(trichloromethyl)-6-piperonyl-1,3,5-triazine, 2,4-bis(trichloromethyl)-6-[2-(2-furyl)ethenyl]-s-triazine, 2,4-bis(trichloromethyl)-6-[2-(5-methyl-2-furyl)ethenyl]-s-triazine, 2,4-bis(trichloromethyl)-6-[2-(5-ethyl-2-furyl)ethenyl]-s-triazine, 2,4-bis(trichloromethyl)-6-[2-(5-propyl-2-furyl)ethenyl]-s-triazine, 2,4-bis(trichloromethyl)-6-[2-(3,5-dimethoxyphenyl)ethenyl]-s-triazine, 2,4-bis(trichloromethyl)-6-[2-(3,5-diethoxyphenyl)ethenyl]-s-triazine, 2,4-bis(trichloromethyl)-6-[2-(3,5-dipropoxyphenyl)ethenyl]-s-triazine, 2,4-bis(trichloromethyl)-6-[2-(3-methoxy-5-ethoxyphenyl)ethenyl]-s-triazine, 2,4-bis(trichloromethyl)-6-[2-(3-methoxy-5-propoxyphenyl)ethenyl]-s-triazine, 2,4-bis(trichloromethyl)-6-[2-(3,4-methylenedioxyphenyl)ethenyl]-s-triazine, 2,4-bis(trichloromethyl)-6-(3,4-methylenedioxyphenyl)-s-triazine, 2,4-bis-trichloromethyl-6-(3-bromo-4-methoxy)phenyl-s- triazine, 2,4-bis-trichloromethyl-6-(2-bromo-4-methoxy)phenyl-s-triazine, 2,4-bis-trichloromethyl-6-(2-bromo-4-methoxy)styrylphenyl-s-triazine, 2,4-bis-trichloromethyl-6-(3-bromo-4-methoxy)styrylphenyl-s-triazine, 2-(4-methoxyphenyl)-4,6-bis(trichloromethyl)-1,3,5-triazine, 2-(4-methoxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis(trichloromethyl)-1,3,5-triazine, tris(1,3-dibromopropyl)-1,3,5-triazine and tris(2,3-dibromopropyl)-1,3,5-triazine, and halogen-containing triazine compounds represented by the following formula (a3) such as tris(2,3-dibromopropyl)isocyanurate.

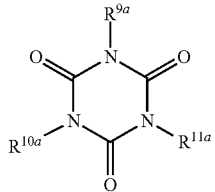

(a3)

In the above formula (a3), $R^{9a}$, $R^{10a}$, and $R^{11a}$ each independently represent a halogenated alkyl group.

Further, the third aspect of the acid generator (A) include α-(p-toluenesulfonyloxyimino)-phenylacetonitrile, α-(benzenesulfonyloxyimino)-2,4-dichlorophenylacetonitrile, α-(benzenesulfonyloxyimino)-2,6-dichlorophenylacetonitrile, α-(2-chlorobenzenesulfonyloxyimino)-4-methoxyphenylacetonitrile and α-(ethylsulfonyloxyimino)-1-cyclopentenylacetonitrile, and compounds represented by the following formula (a4) having an oximesulfonate group.

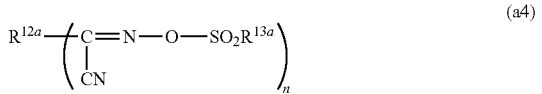

(a4)

In the above formula (a4), $R^{12a}$ represents a monovalent, bivalent or trivalent organic group, $R^{13a}$ represents a substituted or unsubstituted saturated hydrocarbon group, an unsaturated hydrocarbon group, or an aromatic group, and n represents the number of repeating units of the structure in the parentheses.

In the formula (a4), examples of the aromatic group include aryl groups such as a phenyl group and a naphthyl group, and heteroaryl groups such as a furyl group and a thienyl group. These may have one or more appropriate substituents such as halogen atoms, alkyl groups, alkoxy groups and nitro groups on the rings. It is particularly preferable that $R^{13a}$ is an alkyl group having 1 or more and 6 or less carbon atoms such as a methyl group, an ethyl group, a propyl group, and a butyl group. In particular, compounds in which $R^{12a}$ represents an aromatic group, and $R^{13a}$ represents an alkyl group having 1 or more and 4 or less carbon atoms are preferred.

Examples of the acid generator represented by the above formula (a4) include compounds in which $R^{12a}$ is any one of a phenyl group, a methylphenyl group and a methoxyphenyl group, and $R^{13a}$ is a methyl group, provided that n is 1, and specific examples thereof include α-(methylsulfonyloxyimino)-1-phenylacetonitrile, α-(methylsulfonyloxyimino)-1-(p-methylphenyl)acetonitrile, α-(methylsulfonyloxyimino)-1-(p-methoxyphenyl)acetonitrile, [2-(propylsulfonyloxyimino)-2,3-dihydroxythiophene-3-ylidene](o-tolyl)acetonitrile and the like. Provided that n is 2, the acid generator represented by the above formula (a4) is specifically an acid generator represented by the following formulae.

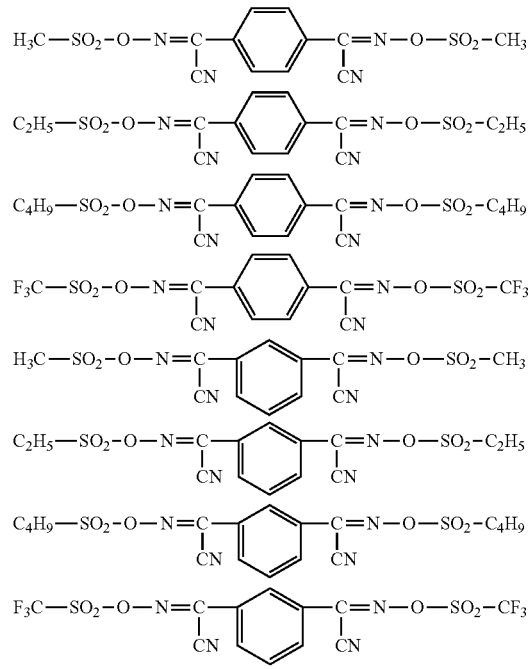

In addition, the fourth aspect of the acid generator (A) include onium salts that have a naphthalene ring at their cation moiety. The expression "have a naphthalene ring" indicates having a structure derived from naphthalene and also indicates at least two ring structures and their aromatic properties are maintained. The naphthalene ring may have a substituent such as a linear or branched alkyl group having 1 or more and 6 or less carbon atoms, a hydroxyl group, a linear or branched alkoxy group having 1 or more and 6 or less carbon atoms or the like. The structure derived from the naphthalene ring, which may be of a monovalent group (one free valance) or of a bivalent group (two free valences), is desirably of a monovalent group (in this regard, the number of free valance is counted except for the portions connecting with the substituents described above). The number of naphthalene rings is preferably 1 or more and 3 or less.

Preferably, the cation moiety of the onium salt having a naphthalene ring at the cation moiety is of the structure represented by the following formula (a5).

(a5)

In the above formula (a5), at least one of $R^{14a}$, $R^{15a}$ and $R^{16a}$ represents a group represented by the following formula (a6), and the remaining represents a linear or branched alkyl group having 1 or more and 6 or less carbon atoms, a phenyl group optionally having a substituent, a hydroxyl group, or a linear or branched alkoxy group having 1 or more and 6 or less carbon atoms. Alternatively, one of $R^{14a}$, $R^{15a}$ and $R^{16a}$ is a group represented by the following formula (a6), and the remaining two are each independently a linear or branched alkylene group having 1 or more and 6 or less carbon atoms, and these terminals may bond to form a ring structure.

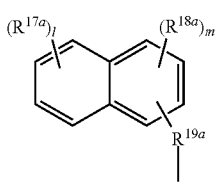
(a6)

In the formula (a6), $R^{17a}$ and $R^{18a}$ each independently represent a hydroxyl group, a linear or branched alkoxy group having 1 or more and 6 or less carbon atoms, or a linear or branched alkyl group having 1 or more and 6 or less carbon atoms, and $R^{19a}$ represents a single bond or a linear or branched alkylene group having 1 or more and 6 or less carbon atoms that may have a substituent. l and m each independently represent an integer of 0 or more and 2 or less, and l+m is 3 or less. Herein, when there exists a plurality of $R^{17a}$, they may be identical to or different from each other. Furthermore, when there exists a plurality of $R^{18a}$, they may be identical to or different from each other.

Preferably, among $R^{14a}$, $R^{15a}$ and $R^{16a}$ as above, the number of groups represented by the above formula (a6) is one in view of the stability of the compound, and the remaining are linear or branched alkylene groups having 1 or more and 6 or less carbon atoms of which the terminals may bond to form a ring. In this case, the two alkylene groups described above form a 3 to 9 membered ring including sulfur atom(s). Preferably, the number of atoms to form the ring (including sulfur atom(s)) is 5 or more and 6 or less.

Examples of the substituent, which the alkylene group may have, include an oxygen atom (in this case, a carbonyl group is formed together with a carbon atom that constitutes the alkylene group), a hydroxyl group or the like.

Furthermore, examples of the substituent, which the phenyl group may have, include a hydroxyl group, a linear or branched alkoxy group having 1 or more and 6 or less carbon atoms, a linear or branched alkyl group having 1 or more and 6 or less carbon atoms, or the like.

Examples of suitable cations for the suitable cation moiety include cations represented by the following formulae (a7) and (a8), and the structure represented by the following formula (a8) is particularly preferable.

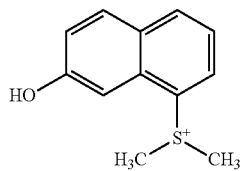
(a7)

(a8)

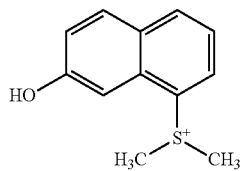

The cation moieties, which may be of an iodonium salt or a sulfonium salt, are desirably of a sulfonium salt in view of acid-producing efficiency.

It is, therefore, desirable that the suitable anions for the anion moiety of the onium salt having a naphthalene ring at the cation moiety is an anion capable of forming a sulfonium salt.

The anion moiety of the acid generator is exemplified by fluoroalkylsulfonic acid ions or aryl sulfonic acid ions, of which hydrogen atom(s) being partially or entirely fluorinated.

The alkyl group of the fluoroalkylsulfonic acid ions may be linear, branched or cyclic and have 1 or more and 20 or less carbon atoms. Preferably, the carbon number is 1 or more and 10 or less in view of bulkiness and diffusion distance of the produced acid. In particular, branched or cyclic alkyl groups are preferable due to shorter diffusion length. Also, methyl, ethyl, propyl, butyl, octyl groups and the like are preferable due to being inexpensively synthesizable.

The aryl group of the aryl sulfonic acid ions may be an aryl group having 6 or more and 20 or less carbon atoms, and is exemplified by a phenol group or a naphthyl group that may be unsubstituted or substituted with an alkyl group or a halogen atom. In particular, aryl groups having 6 or more and 10 or less carbon atoms are preferable due to being inexpensively synthesizable. Specific examples of preferable aryl group include phenyl, toluenesulfonyl, ethylphenyl, naphthyl, methylnaphthyl groups and the like.

When hydrogen atoms in the above fluoroalkylsulfonic acid ion or the aryl sulfonic acid ion are partially or entirely substituted with a fluorine atom, the fluorination rate is preferably 10% or more and 100% or less, and more preferably 50% or more and 100% or less; it is particularly preferable that all hydrogen atoms are each substituted with a fluorine atom in view of higher acid strength. Specific examples thereof include trifluoromethane sulfonate, perfluorobutane sulfonate, perfluorooctane sulfonate, perfluorobenzene sulfonate, and the like.

Among these, the preferable anion moiety is exemplified by those represented by the following formula (a9).

$$R^{20a}SO_3^-$$ (a9)

In the above formula (a9), $R^{20}$ represents groups represented by the following formulae (a10), (a11), and (a12).

—$C_xF_{2x+1}$ (a10)

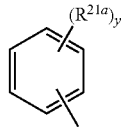
(a11)

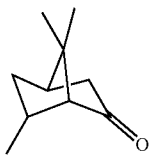

(a12)

In the above formula (a10), x represents an integer of 1 or more and 4 or less. Also, in the above formula (a11), $R^{21a}$ represents a hydrogen atom, a hydroxyl group, a linear or branched alkyl group having 1 or more and 6 or less carbon atoms, or a linear or branched alkoxy group having 1 or more and 6 or less carbon atoms, and y represents an integer of 1 or more and 3 or less. Of these, trifluoromethane sulfonate, and perfluorobutane sulfonate are preferable in view of safety.

In addition, a nitrogen-containing moiety represented by the following formulae (a13) and (a14) may also be used for the anion moiety.

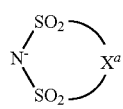

(a13)

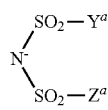

(a14)

In the formulae (a13) and (a14), $X^a$ represents a linear or branched alkylene group in which at least one hydrogen atom is substituted with a fluorine atom, the carbon number of the alkylene group is 2 or more and 6 or less, preferably 3 or more and 5 or less, and most preferably the carbon number is 3. In addition, $Y^a$ and $Z^a$ each independently represent a linear or branched alkyl group of which at least one hydrogen atom is substituted with a fluorine atom, the number of carbon atoms of the alkyl group is 1 or more and 10 or less, preferably 1 or more and 7 or less, and more preferably 1 or more and 3 or less.

The smaller number of carbon atoms in the alkylene group of $X^a$, or in the alkyl group of $Y^a$ or $Z^a$ is preferred since the solubility into organic solvent is preferable.

In addition, a larger number of hydrogen atoms each substituted with a fluorine atom in the alkylene group of $X^a$, or in the alkyl group of $Y^a$ or $Z^a$ is preferred since the acid strength becomes greater. The percentage of fluorine atoms in the alkylene group or alkyl group, i.e., the fluorination rate is preferably 70% or more and 100% or less and more preferably 90% or more and 100% or less, and most preferable are perfluoroalkylene or perfluoroalkyl groups in which all of the hydrogen atoms are each substituted with a fluorine atom.

Examples of preferable compounds for onium salts having a naphthalene ring at their cation moieties include compounds represented by the following formulae (a15) and (a16).

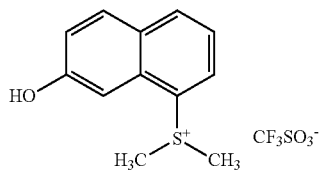

(a15)

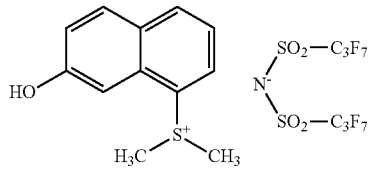

(a16)

Also, the fifth aspect of the acid generator (A) include bissulfonyldiazomethanes such as bis(p-toluenesulfonyl)diazomethane, bis(1,1-dimethyl ethylsulfonyl)diazomethane, bis(cyclohexylsulfonyl)diazomethane and bis(2,4-dimethylphenylsulfonyl)diazomethane; nitrobenzyl derivatives such as 2-nitrobenzyl p-toluenesulfonate, 2,6-dinitrobenzyl p-toluenesulfonate, nitrobenzyl tosylate, dinitrobenzyl tosylate, nitrobenzyl sulfonate, nitrobenzyl carbonate and dinitrobenzyl carbonate; sulfonates such as pyrogalloltrimesylate, pyrogalloltritosylate, benzyltosylate, benzylsulfonate, N-methylsulfonyloxysuccinimide, N-trichloromethylsulfonyloxysuccinimide, N-phenylsulfonyloxymaleimide and N-methylsulfonyloxyphthalimide; trifluoromethane sulfonates such as N-(trifluoromethylsulfonyloxy)phthalimide, N-(trifluoromethylsulfonyloxy)-1,8-naphthalimide and N-(trifluoromethylsulfonyloxy)-4-butyl-1,8-naphthalimide; onium salts such as diphenyliodonium hexafluorophosphate, (4-methoxyphenyl)phenyliodonium trifluoromethanesulfonate, bis(p-tert-butylphenyl)iodonium trifluoromethanesulfonate, triphenylsulfonium hexafluorophosphate, (4-methoxyphenyl) diphenylsulfonium trifluoromethanesulfonate and (p-tert-butylphenyl)diphenylsulfonium trifluoromethanesulfonate; benzointosylates such as benzointosylate and α-methylbenzointosylate; other diphenyliodonium salts, triphenylsulfonium salts, phenyldiazonium salts, benzylcarbonates and the like.

As the acid generator (A), a naphthalic acid derivative represented by the below Formula (a21) is also preferable.

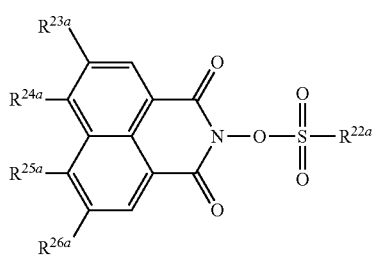

(a21)

(In the Formula (a21), $R^{22a}$ is a monovalent organic group, $R^{23a}$, $R^{24a}$, $R^{25a}$ and $R^{26a}$ are each independently a hydrogen atom or a monovalent organic group, $R^{23a}$ and $R^{24a}$, $R^{24a}$ and $R^{25a}$, or $R^{25a}$ and $R^{26a}$ may respectively bind to each other to form a ring.)

The organic group as $R^{22a}$ is not particularly limited in a scope not inhibiting the object of the present invention. This organic group may be a hydrocarbon group, or may include a heteroatom such as O, N, S, P and halogen atoms. In addition, the structure of this organic group may be linear, may be branched, may be cyclic, or may be a combination of these structures.

A preferred organic group as $R^{22a}$ can be exemplified by an aliphatic hydrocarbon group having 1 or more and 18 or less carbon atoms which may be substituted by a halogen atom, and/or an alkylthio group; an aryl group having 6 or more and 20 or less carbon atoms which may have a substituent; an aralkyl group having 7 or more and 20 or less carbon atoms which may have a substituent; an alkylaryl group having 7 or more and 20 or less carbon atoms which may have a substituent, a camphor-10-yl group; and a group represented by the Formula (a21a) below.

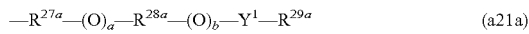

$$-R^{27a}-(O)_a-R^{28a}-(O)_b-Y^1-R^{29a} \quad (a21a)$$

(In the Formula (a21a), $Y^1$ is a single bond or an alkanediyl group having 1 or more and 4 or less carbon atoms. $R^{27a}$ and $R^{28a}$ are each an alkanediyl group having 2 or more and 6 or less carbon atoms which may be substituted by a halogen atom, or an arylene group having 6 or more and 20 or less carbon atoms which may be substituted by a halogen atom. $R^{29a}$ is an alkyl group having 1 or more and 18 or less carbon atoms which may be substituted by a halogen atom, an alicyclic hydrocarbon group having 3 or more and 12 or less carbon atoms, an aryl group having 6 or more and 20 or less carbon atoms which may be substituted by a halogen atom, or an aralkyl group having 7 or more and 20 or less carbon atoms which may be substituted by a halogen atom. a and b are each 0 or 1, and at least one of a and b is 1.)

In the case of the organic group as $R^{22a}$ having a halogen atom as the substituent, a chlorine atom, bromine atom, iodine atom or fluorine atom can be exemplified as the halogen atom.

In the case of organic group as $R^{22a}$ being an alkyl group having 1 or more and 18 or less carbon atoms substituted by an alkylthio group, the carbon number of the alkylthio group is preferably 1 or more and 18 or less. As the alkylthio group having 1 or more and 18 or less carbon atoms, a methylthio group, ethylthio group, n-propylthio group, isopropylthio group, n-butylthio group, sec-butylthio group, tert-butylthio group, isobutylthio group, n-pentylthio group, isopentylthio group, n-pentylthio group, isopentylthio group, tert-pentylthio group, n-hexylthio group, n-heptylthio group, isoheptylthio group, tert-heptylthio group, n-octylthio group, isooctylthio group, tert-octylthio group, 2-ethylhexylthio group, n-nonylthio group, n-decylthio group, n-undecylthio group, n-dodecylthio group, n-tridecylthio group, n-tetradecylthio group, n-pentadecylthio group, n-hexadecylthio group, n-heptadecylthio group, and n-octadecylthio group can be exemplified.

In the case of the organic group as $R^{22a}$ being an aliphatic hydrocarbon group having 1 or more and 18 or less carbon atoms which may be substituted by a halogen atom and/or alkylthio group, the aliphatic hydrocarbon group may include an unsaturated double bond. In addition, the structure of this aliphatic hydrocarbon group is not particularly limited, and may be linear, may be branched, may be cyclic, or may be a combination of these structures.

As an ideal example of a case of the organic group as $R^{22a}$ being an alkenyl group, an allyl group or 2-methyl-2-propenyl group can be exemplified.

As an ideal example of the case of the organic group as $R^{22a}$ being an alkyl group, a methyl group, ethyl group, n-propyl group, isopropyl group, n-butyl group, sec-butyl group, tert-butyl group, isobutyl group, n-pentyl group, isopentyl group, tert-pentyl group, n-hexyl group, n-hexane-2-yl group, n-hexane-3-yl group, n-heptyl group, n-heptane-2-yl group, n-heptane-3-yl group, isoheptyl group, tert-heptyl group, n-octyl group, isooctyl group, tert-octyl group, 2-ethylhexyl group, n-nonyl group, isononyl group, n-decyl group, n-undecyl group, n-dodecyl group, n-tridecyl group, n-tetradecyl group, n-pentadecyl group, n-hexadecyl group, n-heptadecyl group and n-octadecyl group can be exemplified.

In the case of the organic group as $R^{22a}$ being an aliphatic hydrocarbon group, as an example of the aliphatic hydrocarbon constituting the main skeleton of this aliphatic hydrocarbon group, cyclopropane, cyclobutene, cyclopentane, cyclohexane, cycloheptane, cyclooctane, cyclodecane, bicyclo(2.1.1)hexane, bicyclo(2.2.1)heptane, bicyclo(3.2.1)octane, bicyclo(2.2.2)octane and adamantane can be exemplified. As the aliphatic hydrocarbon group, a group excluding one hydrogen atom from these aliphatic hydrocarbons is preferable.

As an ideal example of a case of the organic group as $R^{22a}$ being an aliphatic hydrocarbon group substituted by a halogen atom, a trifluoromethyl group, pentafluoroethyl group, 2-chloroethyl group, 2-bromoethyl group, heptafluoro-n-propyl group, 3-bromopropyl group, nonafluoro-n-butyl group, tridecafluoro-n-hexyl group, heptadecafluoro-n-octyl group, 2,2,2-trifluoroethyl group, 1,1-difluoroethyl group, 1,1-difluoro-n-propyl group, 1,1,2,2-tetrafluoro-n-propyl group, 3,3,3-trifluoro-n-propyl group, 2,2,3,3,3-pentafluoro-n-propyl group, 2-norbornyl-1,1-difluoroethyl group, 2-norbornyl tetrafluoroethyl group, and 3-adamantyl-1,1,2,2-tetrafluoropropyle group can be exemplified.

As an ideal example of a case of the organic group as $R^{22a}$ being an aliphatic hydrocarbon group substituted by an alkylthio group, a 2-methylthioehtyl group, 4-methylthio-n-butyl group and 2-n-butylthioethyl group can be exemplified.

As an ideal example of the case of the organic group as $R^{22a}$ being an aliphatic hydrocarbon group substituted by a halogen atom or alkylthio group, 3-methylthio-1,1,2,2-tetrafluoro-n-propyl group can be exemplified.

As an ideal example of the case of the organic group as $R^{22a}$ being an aryl group, a phenyl group, naphthyl group and biphenylyl group can be exemplified.

As an ideal example of the case of the organic group as $R^{22a}$ being an aryl group substituted by a halogen atom, a pentafluorophenyl group, chlorophenyl group, dichlorophenyl group and trichlorophenyl group can be exemplified.

As an ideal example of the case of the organic group as $R^{22a}$ being an aryl group substituted by an alkylthio group, a 4-methylthiophenyl group, 4-n-butylthiophenyl group, 4-n-octylthiophenyl group and 4-n-dodecylthiophenyl group can be exemplified.

As an ideal example of the case of the organic group as $R^{22a}$ being an aryl group substituted by a halogen atom and alkylthio group, a 1,2,5,6-tetrafluoro-4-methylthiophenyl group, 1,2,5,6-tetrafluoro-4-n-butylthiophenyl group and 1,2,5,6-tetrafluoro-4-n-dodecylthiophenyl group can be exemplified.

As an ideal example of the case of the organic group as $R^{22a}$ being an aralkyl group, a benzyl group, phenethyl group, 2-phenylpropane-2-yl group, diphenylmethyl group and triphenylmethyl group can be exemplified.

As an ideal example of the case of the organic group as $R^{22a}$ being an aralkyl group substituted by a halogen atom, a pentafluorophenylmethyl group, phenyldifluoromethyl group, 2-phenyltetrafluoroethyl group and 2-(pentafluorophenyl)ethyl group can be exemplified.

As an ideal example of the case of the organic group as $R^{22a}$ being an aralkyl group substituted by an alkylthio group, a p-methylthiobenzyl group can be exemplified.

As an ideal example of the case of the organic group as $R^{22a}$ being an aralkyl group substituted by a halogen atom and alkylthio group, a 2-(2,3,5,6-tetrafluoro-4-methylthiophenyl)ethyl group can be exemplified.

As an ideal example of the case of the organic group as $R^{22a}$ being an alkylaryl group, a 2-methylphenyl group, 3-methylphenyl group, 4-methylphenyl group, 3-isopropylphenyl group, 4-isopropylphenyl group, 4-n-butylphenyl group, 4-isobutylphenyl group, 4-tert-butylphenyl group, 4-n-hexylphenyl group, 4-cyclohexylphenyl group, 4-n-octylphenyl group, 4-(2-ethyl-n-hexyl)phenyl group, 2,3-dimethylphenyl group, 2,4-dimethylphenyl group, 2,5-dimethylphenyl group, 2,6-dimethylphenyl group, 3,4-dimethylphenyl group, 3,5-dimethylphenyl group, 2,4-di-tert-butylphenyl group, 2,5-di-tert-butylphenyl group, 2,6-di-tert-butylphenyl group, 2,4-di-tert-pentylphenyl group, 2,5-di-tert-pentylphenyl group, 2,5-di-tert-octylphenyl group, 2-cyclohexylphenyl group, 3-cyclohexylphenyl group, 4-cyclohexylphenyl group, 2,4,5-trimethylphenyl group, 2,4,6-trimethylphenyl group and 2,4,6-triisopropylphenyl group can be exemplified.

The group represented by the Formula (a21a) is an ether-group containing group. In the Formula (a21a), as the alkanediyl group having 1 or more and 4 or less carbon atoms represented by $Y^1$, a methylene group, ethane-1,2-diyl group, ethane-1,1-diyl group, propane-1,3-diyl group, propane-1,2-diyl group, butane-1,4-diyl group, butane-1,3-diyl group, butane-2,3-diyl group and butane-1,2-diyl group can be exemplified. In the Formula (a21a), as the alkanediyl group having 2 or more and 6 or less carbon atoms represented by $R^{27a}$ or $R^{28a}$, an ethane-1,2-diyl group, propane-1,3-diyl group, propane-1,2-diyl group, butane-1,4-diyl group, butane-1,3-diyl group, butane-2,3-diyl group, butane-1,2-diyl group, pentane-1,5-diyl group, pentane-1,3-diyl group, pentane-1,4-diyl group, pentane-2,3-diyl group, hexane-1,6-diyl group, hexane-1,2-diyl group, hexane-1,3-diyl group, hexane-1,4-diyl group, hexane-2,5-diyl group, hexane-2,4-diyl group and hexane-3,4-diyl group can be exemplified.

In the Formula (a21a), in the case of the $R^{27a}$ or $R^{28a}$ being an alkanediyl group having 2 or more and 6 or less carbon atoms substituted by a halogen atom, a chlorine atom, bromine atom, iodine atom and fluorine atom can be exemplified as the halogen atom. As an example of the alkanediyl group substituted by a halogen atom, a tetrafluoroethane-1,2-diyl group, 1,1-difluoroethane-1,2-diyl group, 1-fluoroethane-1,2-diyl group, 1,2-difluoroethane-1,2-diyl group, hexafluoropropane-1,3-diyl group, 1,1,2,2-tetrafluoropropane-1,3-diyl group, and 1,1,2,2-tetrafluoropentane-1,5-diyl group can be exemplified.

As an example of the case of $R^{27a}$ or $R^{28a}$ in Formula (a21a) being an arylene group, a 1,2-phenylene group, 1,3-phenylene group, 1,4-phenyl group, 2,5-dimethyl-1,4-phenylene group, biphenyl-4,4'-diyl group, diphenylmethane-4,4'-diyl group, 2,2-diphenylpropane-4,4'-diyl group, naphthalene-1,2-diyl group, napthalene-1,3-diyl group, naphthalene-1,4-diyl group, naphthalene-1,5-diyl group, naphthalene-1,6-diyl group, naphthalene-1,7-diyl group, naphthalene-1,8-diyl group, naphthalene-2,3-diyl group, naphthalene-2,6-diyl group and naphthalene-2,-7-diyl group can be exemplified.

In the case of $R^{27a}$ or $R^{28a}$ in the Formula (a21a) being an arylene group substituted by a halogen atom, a chlorine atom, bromine atom, iodine atom and fluorine atom can be exemplified as the halogen atom. As an example of the arylene group substituted by a halogen atom, a 2,3,5,6-tetrafluoro-1,4-phenylene group can be exemplified.

As the alkyl group having 1 or more and 18 or less carbon atoms which may have a branch represented by $R^{29a}$ in the Formula (a21a), a methyl group, ethyl group, n-propyl group, isopropyl group, n-butyl group, sec-butyl group, tert-butyl group, isobutyl group, n-pentyl group, isopentyl group, tert-pentyl group, n-hexyl group, n-hexane-2-yl group, n-hexane-3-yl group, n-heptyl group, n-heptane-2-yl group, n-heptane-3-yl group, isoheptyl group, tert-heptyl group, n-octyl group, isooctyl group, tert-octyl group, 2-ethylhexyl group, n-nonyl group, isononyl group, n-decyl group, n-undecyl group, n-dodecyl group, n-tridecyl group, n-tetradecyl group, n-pentadecyl group, n-hexadecyl group, n-heptadecyl group and n-octadecyl group can be exemplified.

In the case of $R^{29a}$ in the Formula (a21a) being an alkyl group having 1 or more and 18 or less carbon atoms and substituted by a halogen atom, a chlorine atom, bromine atom, iodine atom and fluorine atom can be exemplified as the halogen atom. As examples of the alkyl group substituted by a halogen atom, a trifluoromethyl group, pentafluoroethyl group, heptafluoro-n-propyl group, nonafluoro-n-butyl group, tridecafluoro-n-hexyl group, heptadecafluoro-n-octyl group, 2,2,2-trifluoroethyl group, 1,1-difluoroethyl group, 1,1-difluoro-n-propyl group, 1,1,2,2-tetrafluoro-n-propyl group, 3,3,3-trifluoro-n-propyl group, 2,2,3,3,3-pentafluoro-n-propyl group, and 1,1,2,2-tetrafluoropropyl group can be exemplified.

In the case of $R^{29a}$ in the Formula (a21a) being an aliphatic hydrocarbon group having 3 or more and 12 or less carbon atoms, as an example of the aliphatic hydrocarbon constituting the main skeleton of this aliphatic hydrocarbon group, cyclopropane, cyclobutene, cyclopentane, cyclohexane, cycloheptane, cyclooctane, cyclodecane, bicyclo(2.1.1)hexane, bicyclo(2.2.1)heptane, bicyclo(3.2.1)octane, bicyclo(2.2.2)octane and adamantane can be exemplified. As the aliphatic hydrocarbon group, a group excluding one hydrogen atom from these aliphatic hydrocarbons is preferable.

In the Formula (a21a), in the case of $R^{29a}$ being an aryl group, halogenated aryl group, aralkyl group or halogenated aralkyl group, suitable examples of these groups are the same as the case of $R^{22a}$ being these groups.

A suitable group among these groups represented by the Formula (a21a) is a group in which the carbon atom bonded to a sulfur atom among the groups represented by $R^{27a}$ is substituted by a fluorine atom. The number of carbon atoms of such suitable groups is preferably 2 or more and 18 or less.

As $R^{22a}$, perfluoroalkyl groups having 1 or more and 8 or less carbon atoms are preferred. In addition, due to tending to form a highly detailed patterned resist film, camphor-10-yl group is also preferable as $R^{22a}$.

In the Formula (a21), $R^{23a}$ to $R^{26a}$ is a hydrogen atom or a monovalent organic group. In addition, $R^{23a}$ and $R^{24a}$, $R^{24a}$ and $R^{25a}$, for $R^{25a}$ and $R^{26a}$ may form a ring by bonding to each other. For example, by forming a 5-member ring with naphthalene ring by $R^{25a}$ and $R^{26a}$ bonding, it may form an acenaphthene skeleton.

As the monovalent organic group, an alkyl group having 4 or more and 18 or less carbon atoms which may be substituted by an aliphatic hydrocarbon group, heterocyclic group (heterocyclyl group) or a halogen atom and may have a branch, an alkoxy group; a heterocyclyloxy group; an alkylthio group having 4 or more and 18 or less carbon atoms which may be substituted by an aliphatic hydrocarbon group, heterocyclic group (heterocyclyl group) or a halogen atom, and may have a branch; and a heterocyclylthio group are preferable. In addition, a group in which the methylene group at any position not adjacent to the carbon atom of this alkoxy group is substituted by —CO— is preferable. A group in which this alkoxy group is interrupted by a —O—CO— bond or —O—CO—NH— bond is also preferable. It should be noted that the right end of the —O—CO— bond and —O—CO—NH— bond is the side close to the naphthalic acid mother nucleus in the alkoxy group. Furthermore, an alkylthio group having 4 or more and 18 or less carbon atoms which may be substituted by an aliphatic hydrocarbon group, heterocyclic group or halogen atom, and may have a branch is also preferable as $R^{23a}$ to $R^{26a}$. A group in which a methylene group at a position not adjacent to the sulfur atom of this alkylthio group is substituted by —CO— is also preferable. A group in which this alkylthio group is interrupted by a —O—CO— bond or —O—CO—NH— bond is also preferable. It should be noted that the left end of the —O—CO— bond and —O—CO—NH— bond is a side closer to the naphthalic acid mother nucleus in the alkylthio group.

As $R^{23a}$ to $R^{26a}$, it is preferable for $R^{23a}$ to be an organic group, $R^{24a}$ to $R^{26a}$ to be hydrogen atoms, or $R^{24a}$ to be an organic group, and $R^{23a}$, $R^{25a}$ and $R^{26a}$ to be hydrogen atoms. In addition, $R^{23a}$ to $R^{26a}$ may all be hydrogen atoms.

As an example of the case of $R^{23a}$ to $R^{26a}$ being unsubstituted alkyl groups, an n-butyl group, sec-butyl group, tert-butyl group, isobutyl group, n-pentyl group, isopentyl group, tert-pentyl group, n-hexyl group, n-heptyl group, isoheptyl group, tert-heptyl group, n-octyl group, isooctyl group, tert-octyl group, 2-ethylhexyl group, n-nonyl group, n-decyl group, n-undecyl group, n-dodecyl group, n-tridecyl group, n-tetradecyl group, n-pentadecyl group, n-hexadecyl group, n-heptadecyl group and n-octadecyl group can be exemplified.

As an example of the case of $R^{23a}$ to $R^{26a}$ being unsubstituted alkoxy groups, an n-butyloxy group, sec-butyloxy group, tert-butyloxy group, isobutyloxy group, n-pentyloxy group, isopentyloxy group, tert-pentyloxy group, n-hexyloxy group, n-heptyloxy group, isoheptyloxy group, tert-heptyloxy group, n-octyloxy group, isooctyloxy group, tert-octyloxy group, 2-ethylhexyl group, n-nonyloxy group, n-decyloxy group, n-undecyloxy group, n-deodecyloxy group, n-tridecyloxy group, n-tetradecyloxy group, n-pentadecyloxy group, n-hexadecyloxy group, n-heptadecyloxy group and n-octadecyloxy group can be exemplified.

As an example of the case of $R^{23a}$ to $R^{26a}$ being unsubstituted alkylthio groups, an n-butylthio group, sec-butylthio group, tert-butylthio group, isobutylthio group, n-pentylthio group, isopentylthio group, tert-pentylthio group, n-pentylthio group, n-heptylthio group, isoheptylthio group, tert-heptylthio group, n-octylthio group, isooctylthio group, tert-octylthio group, 2-ethylhexylthio group, n-nonylthio group, n-decylthio group, n-undecylthio group, n-dodecylthio group, n-tridecylthio group, n-tetradecylthio group, n-pentadecylthio group, n-hexadecylthio group, n-heptadecylthio group and n-octadecylthio group can be exemplified.

In the case of $R^{23a}$ to $R^{26a}$ being an alkyl group, alkoxy group or alkylthio group substituted by an aliphatic hydrocarbon group, as examples of the aliphatic hydrocarbon constituting the main skeleton of the aliphatic hydrocarbon group, cyclopropane, cyclobutene, cyclopentane, cyclohexane, cycloheptane, cyclooctane, cyclodecane, bicyclo(2.1.1)hexane, bicyclo(2.2.1)heptane, bicyclo(3.2.1)octane, bicyclo(2.2.2)octane and adamantane can be exemplified. As the aliphatic hydrocarbon group, a group excluding one hydrogen atom from these aliphatic hydrocarbons is preferable.

In the case of $R^{23a}$ to $R^{26a}$ being an alkyl group, alkoxy group or alkylthio group substituted by heterocyclic group, or a case of $R^{23a}$ to $R^{26a}$ being heterocyclyloxy groups, as examples of the heterocyclic ring constituting the main skeleton of the heterocyclic group or heterocyclyl group, pyrrole, thiophene, furan, pyran, thiopyran, imidazole, pyrazole, triazole, isothiazole, oxazole, isoxazole, pyridine, pyrazine, pyrimidine, pyridazine, pyrrolidine, pyrazolidine, imidazolidine, isooxazolidine, isothiazolidine, piperidine, piperazine, morpholine, thiomorpholine, chroman, thiochroman, isochroman, isothiochroman, indoline, isoindolin, pyridine, indolizine, indole, indazole, purine, quinolizine, isoquinoline, quinoline, naphthyridine, phthalazine, quinoxaline, quinazoline, chinnoline, pteridine, acridine, perimidine, phenanthroline, carbazole, carboline, phenazine, anthyridine, thiadiazole, oxadiazole, triazine, triazole, tetrazole, benzimidazole, benzoxazole, benzothiazole, benzothiadiazole, benzofuroxan, naphthimidazole, benzotriazole and tetraazaindene can be exemplified. In addition, among these heterocycles, saturated hetereocycles hydrogenating a ring having conjugated bonds are also preferable. As the heterocyclic group substituting the alkyl group, alkoxy group or alkylthio group, or the heterocyclic group included in the heterocyclyl group, groups excluding one hydrogen atom from the above-mentioned heterocycle is preferable.

As an example of a case of $R^{23a}$ to $R^{26a}$ being an alkoxy group including an aliphatic hydrocarbon group, a cyclopentyloxy group, methylcyclopentaoxy group, cyclohexyloxy group, fluorocyclohexyloxy group, chlorocylcohexyloxy group, cyclohexylmethyloxyl group, methylcylcohexyloxy group, norbornyloxy group, ethylcyclohexyloxy group, cyclohexylethyloxy group, dimethylcyclohexyloxy group, methylcyclohexylmethyloxy group, norbornylmethyloxy group, trimethylcyclohexyloxy group, 1-cyclohexylbutyloxy group, adamantyloxy group, methyloxy group, n-butylcyclohexyloxy group, tert-butylcyclohexyloxy group, bornyloxy group, isobornyloxy group, decahydronaphthyloxy group, dicyclopentadienoxy group, 1-cyclohexylpentyloxy group, methyladamantylmethyloxy group, 4-pentylcyclohexyloxy group, cyclohexyl cyclohexyloxy group, adamantylethyloxy group, and dimethyladamantyloxy group can be exemplified.

As an example of a case of $R^{23a}$ to $R^{26a}$ being heterocyclyloxy groups, a tetrahydrofuranyloxy group, furfuryloxyl group, tetrahydrofurfuryloxy group, tetrahydropyranyloxy group, butyrolactonyloxy group, and indoyloxy group can be exemplified.

As an example of a case of $R^{23a}$ to $R^{26a}$ being alkylthio groups including an aliphatic hydrocarbon group, a cyclopentylthio group, cyclohexylthio group, cyclohexylmethylthio group, norbornylthio group and isonorbornylthio group can be exemplified.

As an example of a case of $R^{23a}$ to $R^{26a}$ being heterocyclylthio group, a furfuylthio group and tetrahydrofurfurylthio group can be exemplified.

As an example of a case of $R^{23a}$ to $R^{26a}$ being a group in which a methylene group at any position not adjacent to an oxygen atom of the alkoxy group is substituted by —CO—, a 2-ketobutyl-1-oxy group, 2-ketopentyl-1-oxy group, 2-ketohexyl-1-oxy group, 2-ketoheptyl-1-oxy group, 2-ketooctyl-1-oxy group, 3-ketobutyl-1-oxy group, 4-ketopentyl-1-oxy group, 5-ketohexyl-1-oxy group, 6-ketoheptyl-1-oxy group, 7-ketooctyl-1-oxy group, 3-methyl-2-ketopentane-4-oxy group, 2-ketopentane-4-oxy group, 2-methyl-2-ketopentane-4-oxy group, 3-ketoheptane-5-oxy group and 2-adamantanone-5-oxy group can be exemplified.

As an example of a case of $R^{23a}$ to $R^{26a}$ being groups in which a methylene group at any position not adjacent to a sulfur atom of the alkylthio group is substituted by —CO—, a 2-ketobutyl-1-thio group, 2-ketopentyl-1-thio group, 2-ketohexyl-1-thio group, 2-ketoheptyl-1-thio group, 2-ketoocyl-1-thio group, 3-ketobutyl-1-thio group, 4-ketopentyl-1-thio group, 5-ketohexyl-1-thio group, 6-ketoheptyl-1-thio group, 7-ketoocyl-1-thio group, 3-methyl-2-ketopentan-4-thio group, 2-ketopentan-4-thio group, 2-methyl-2-ketopentan-4-thio group and 3-ketoheptan-5-thio group can be exemplified.

As specific examples of compounds represented by the Formula (a21), the following compounds can be exemplified.

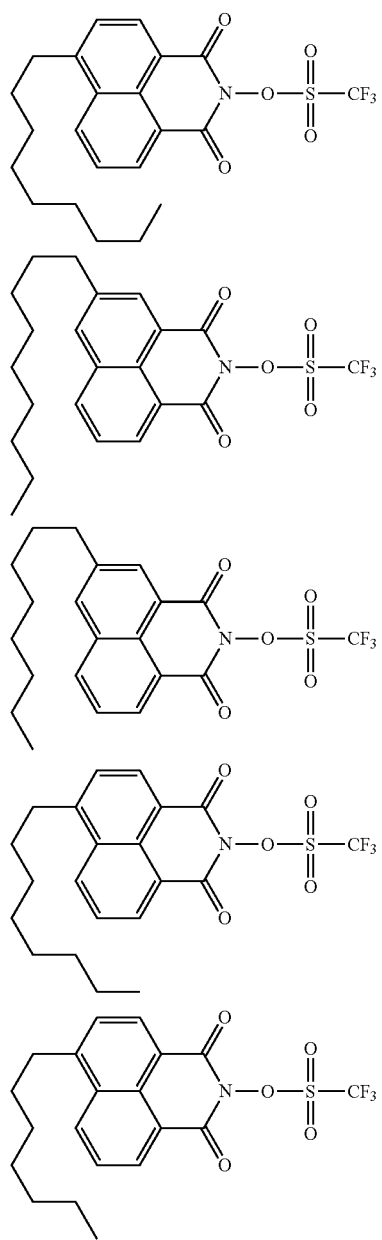

-continued

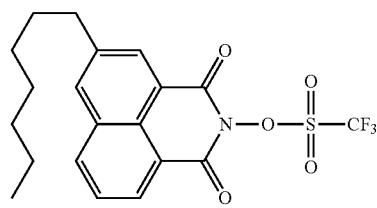
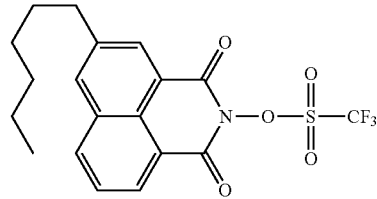
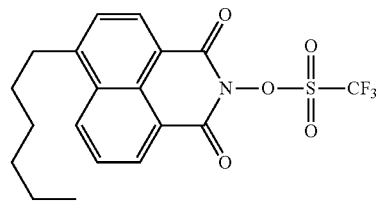
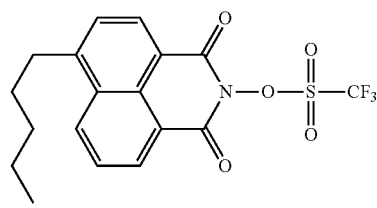
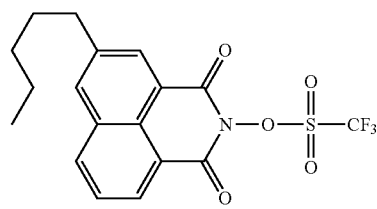
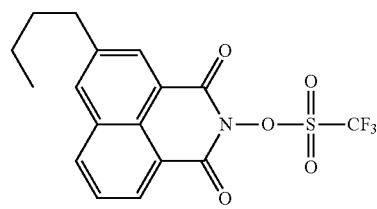
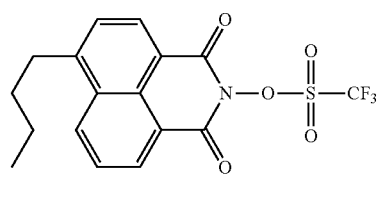
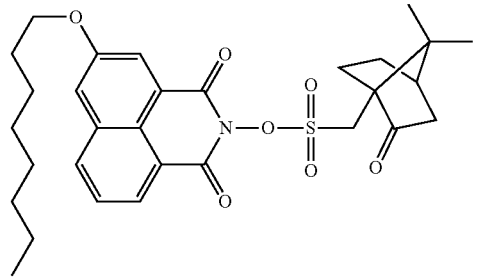

23
-continued
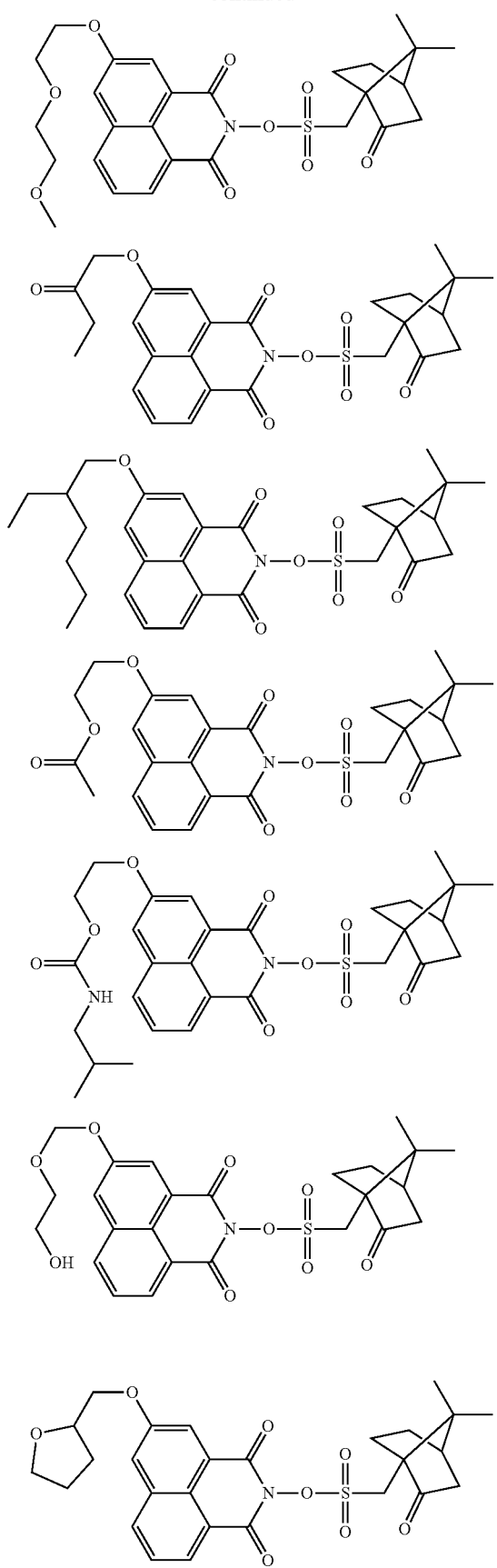
24
-continued
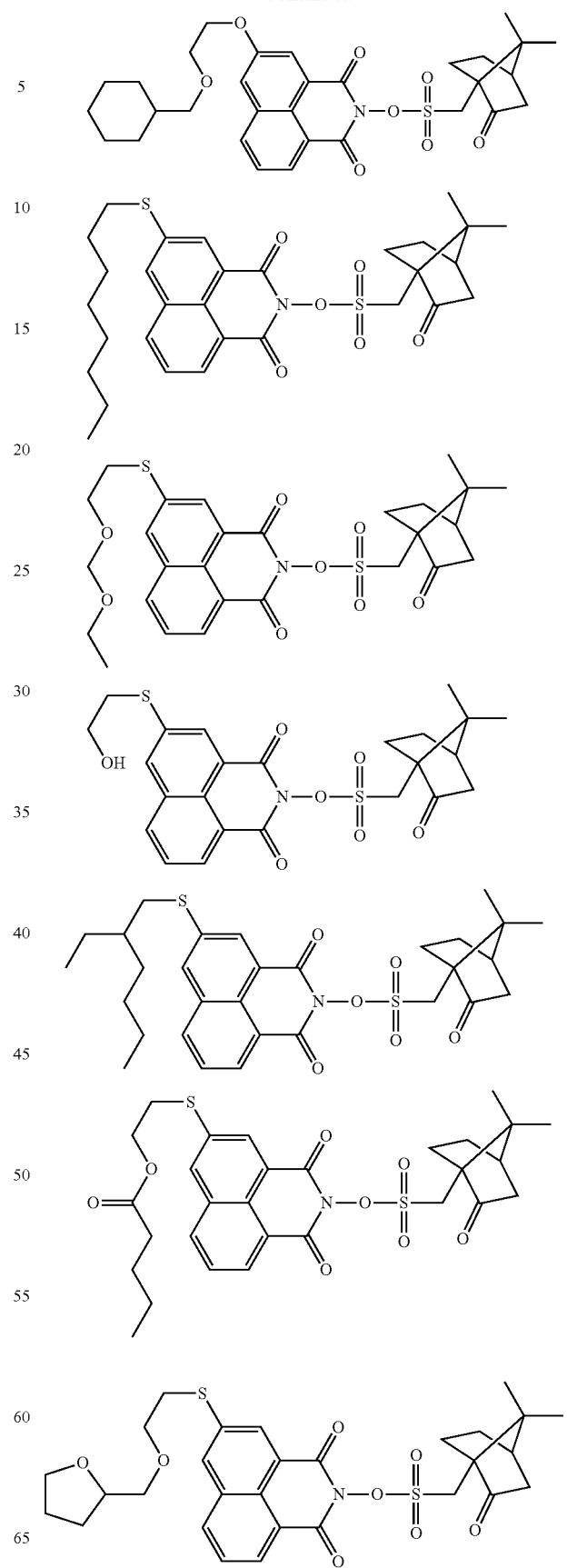

25
-continued
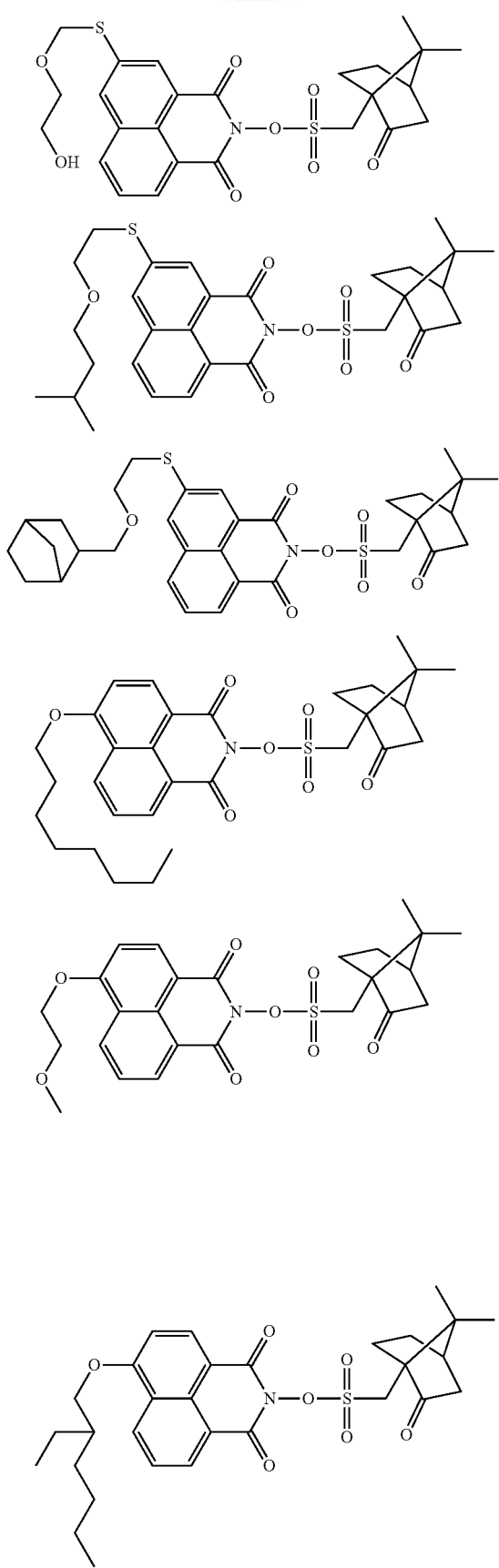
26
-continued
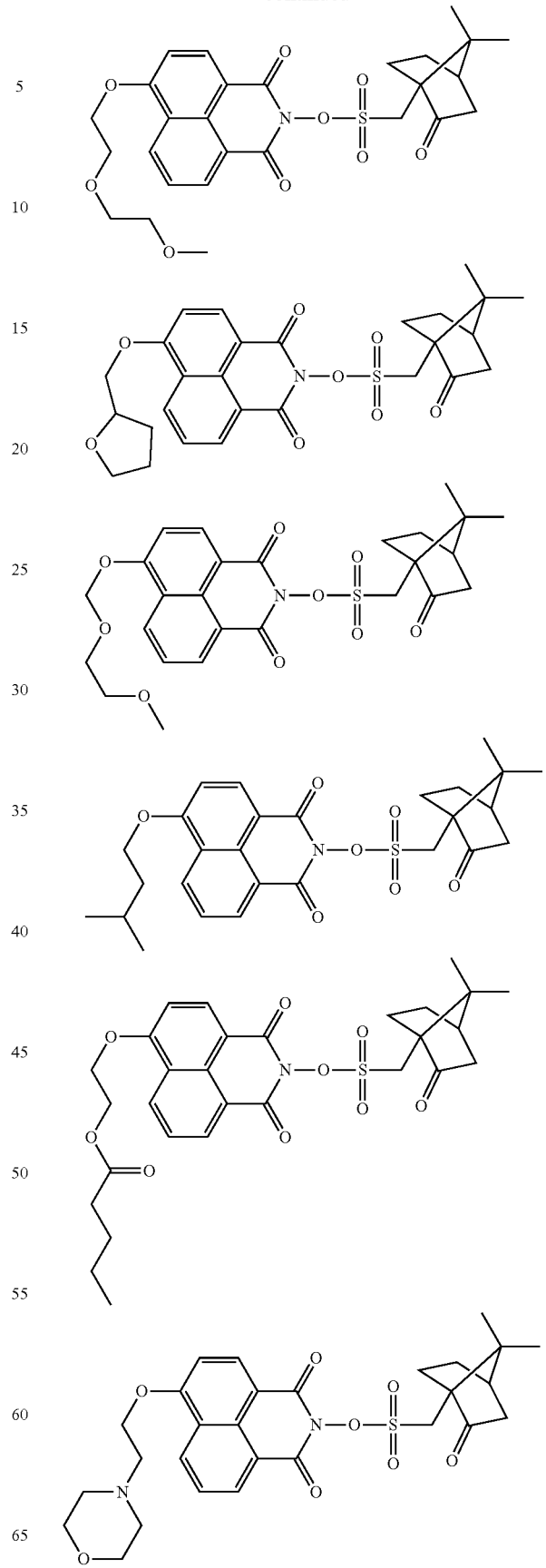

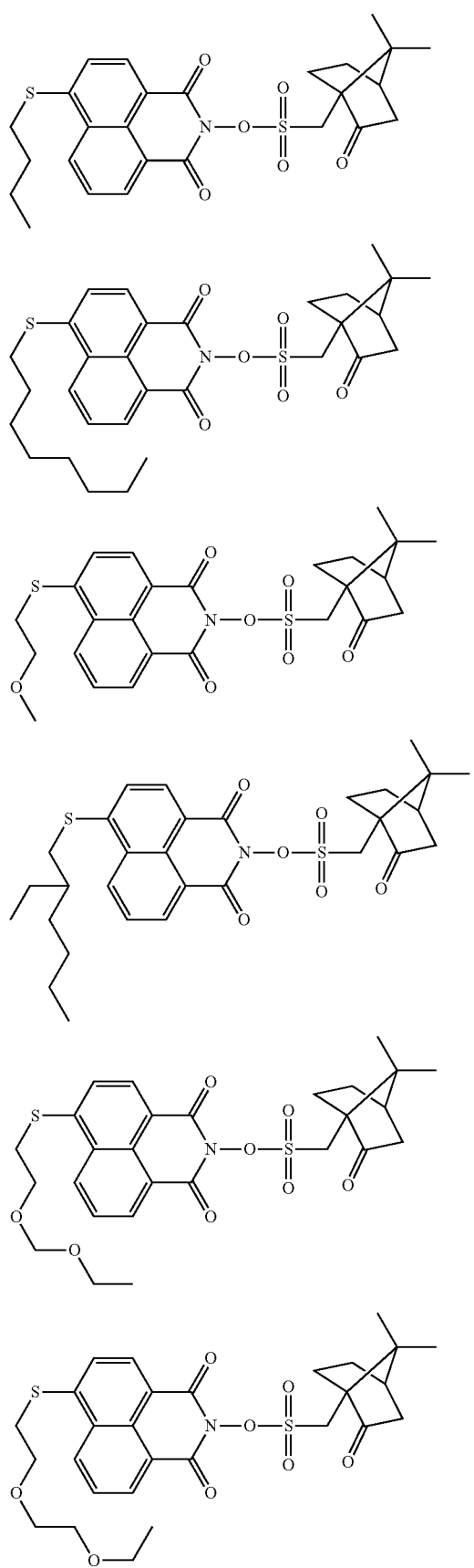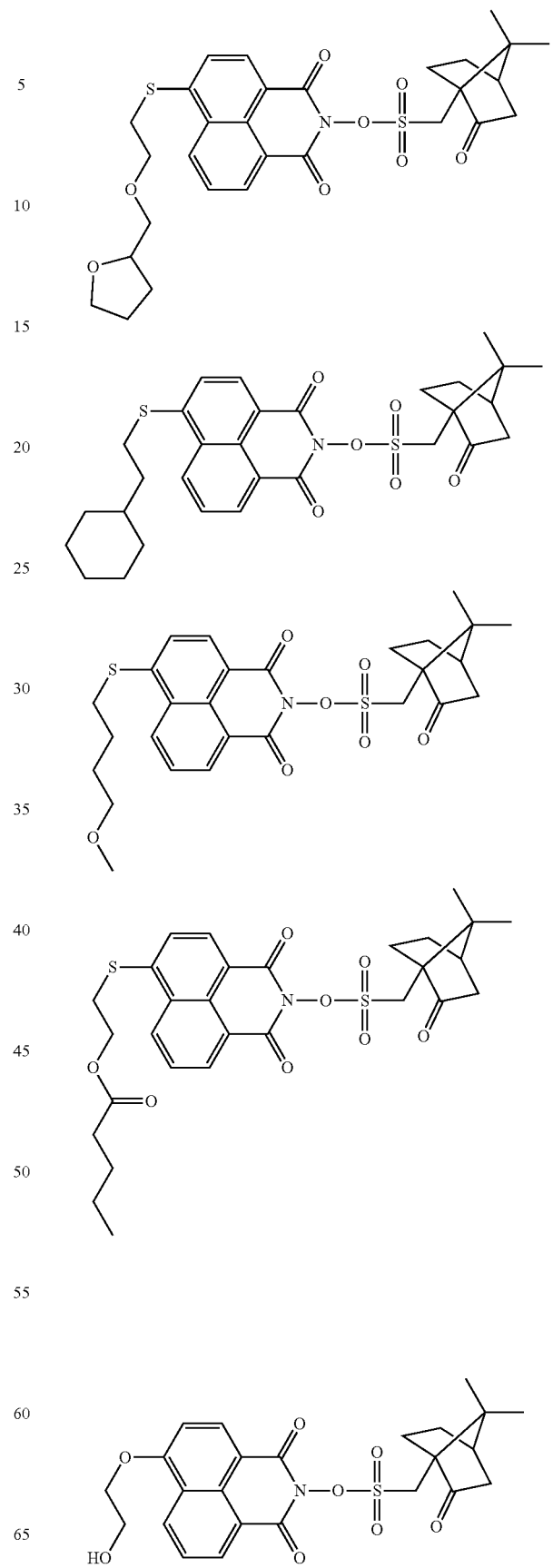

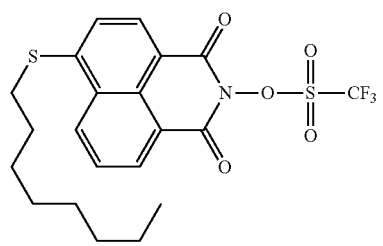
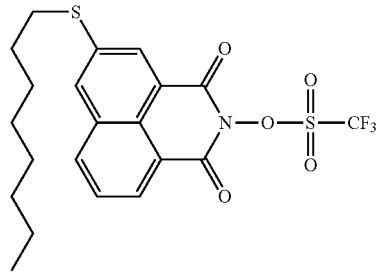
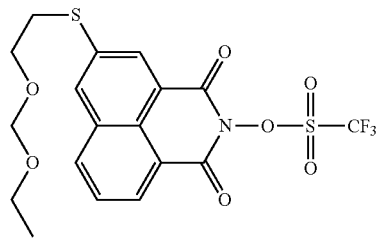
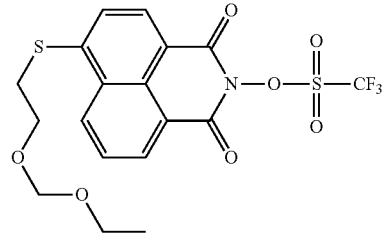
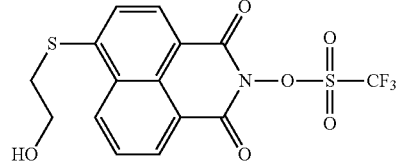
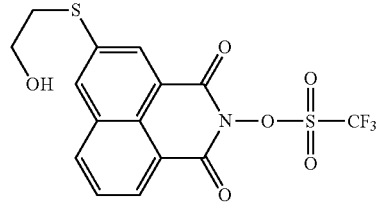
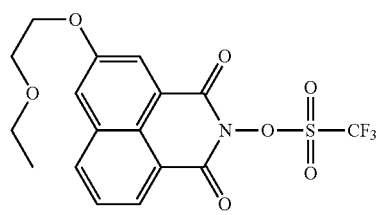
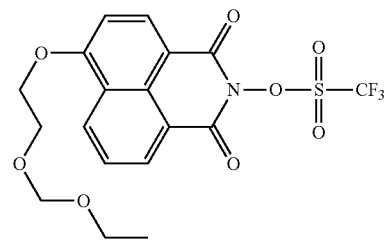
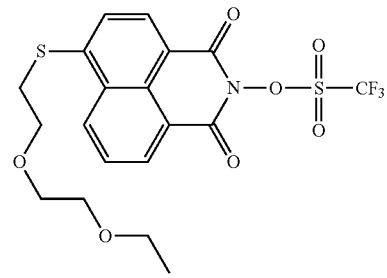
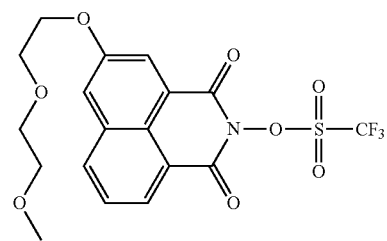
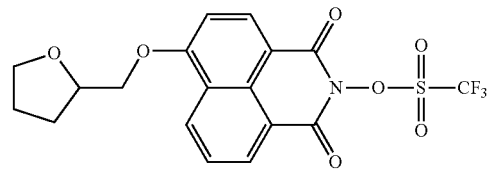
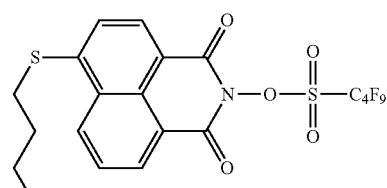
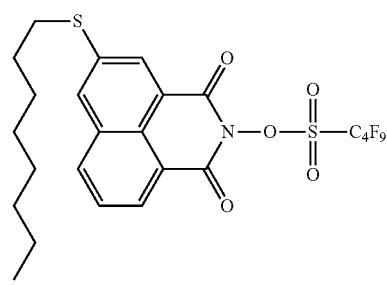
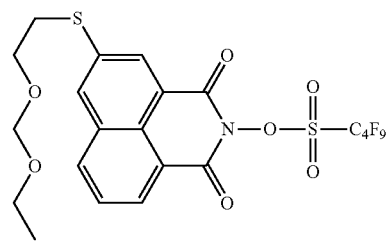

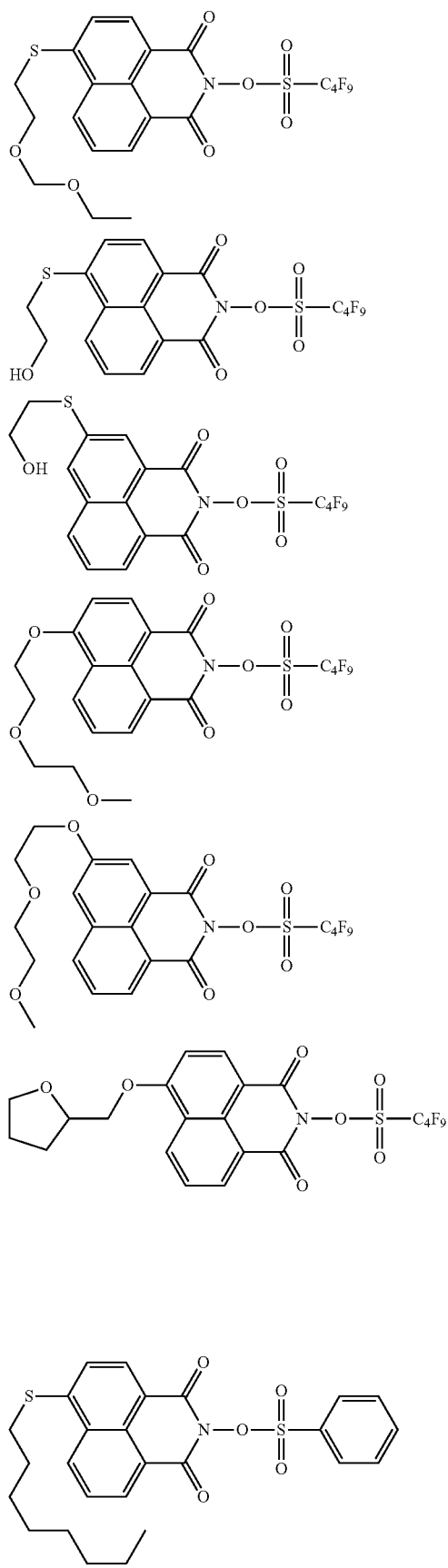
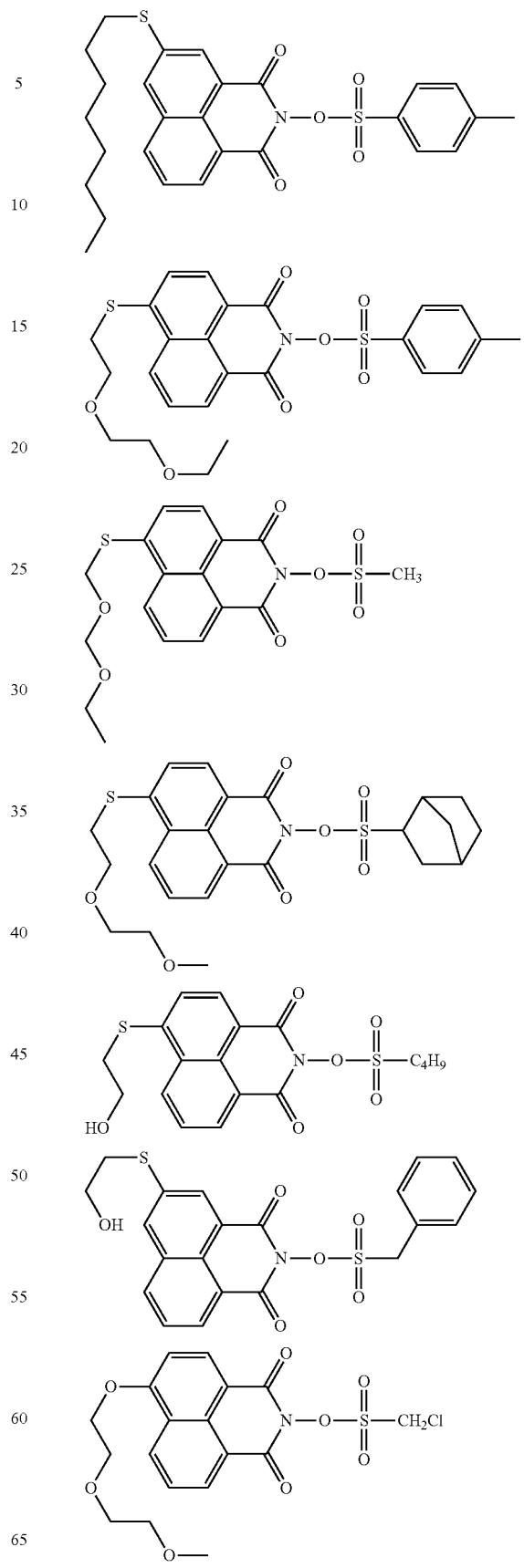

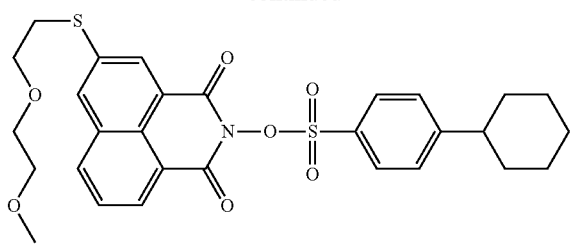
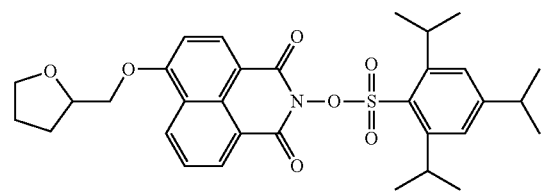 [SMILES: CC(C)c1cc(C(C)C)c(S(=O)(=O)ON2C(=O)c3cccc4c(OCC5CCCO5)ccc(c34)C2=O)c(C(C)C)c1]
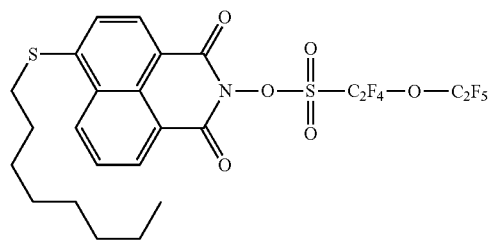
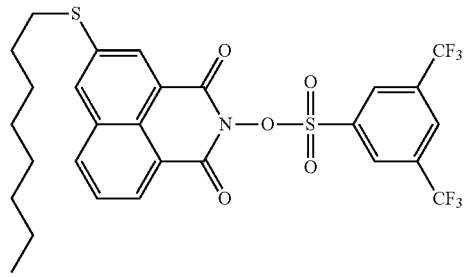
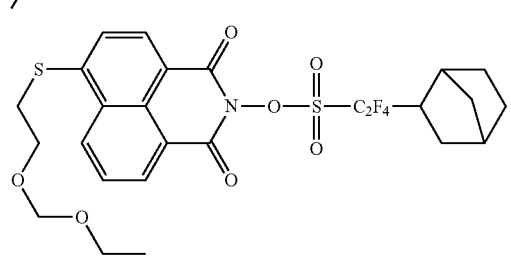
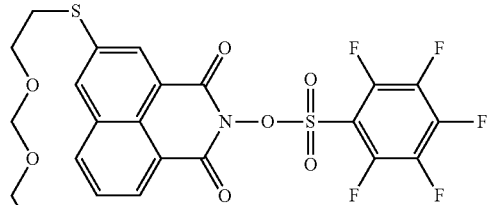
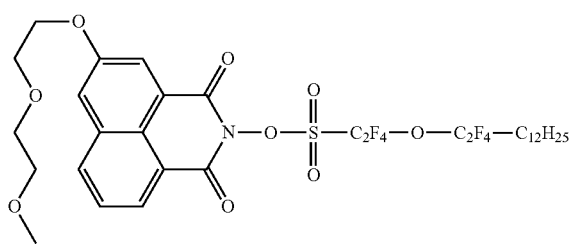
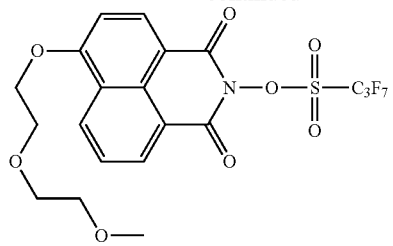
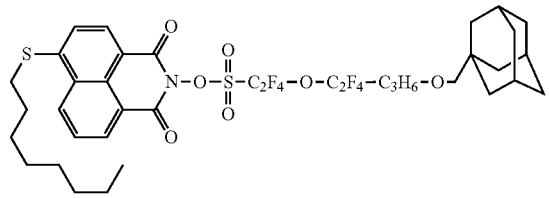
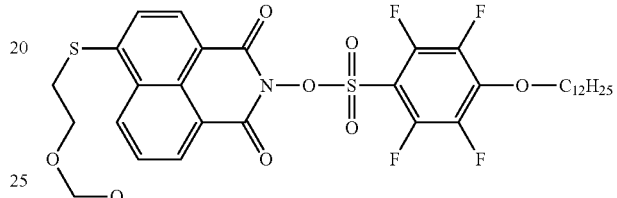
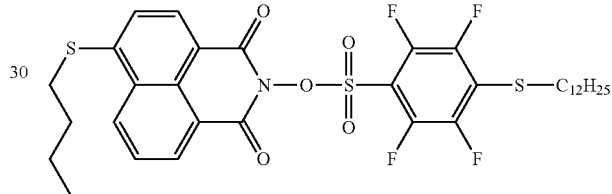
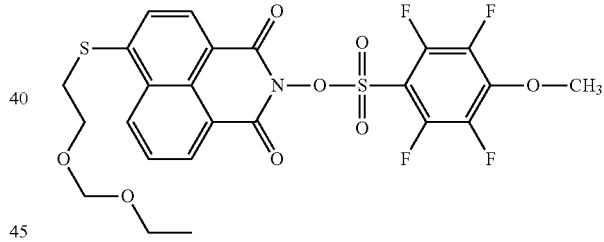
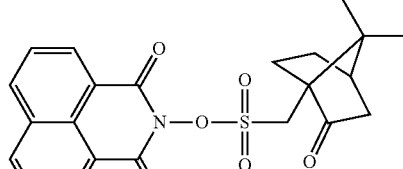
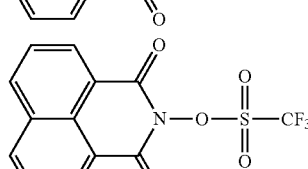
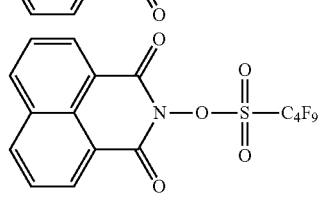

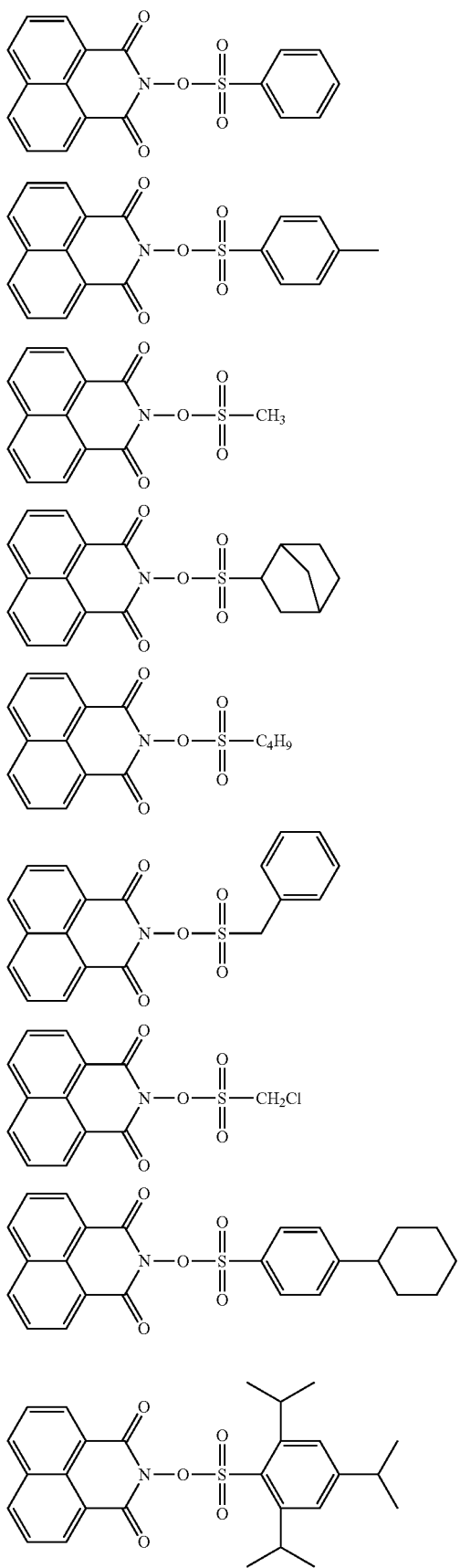
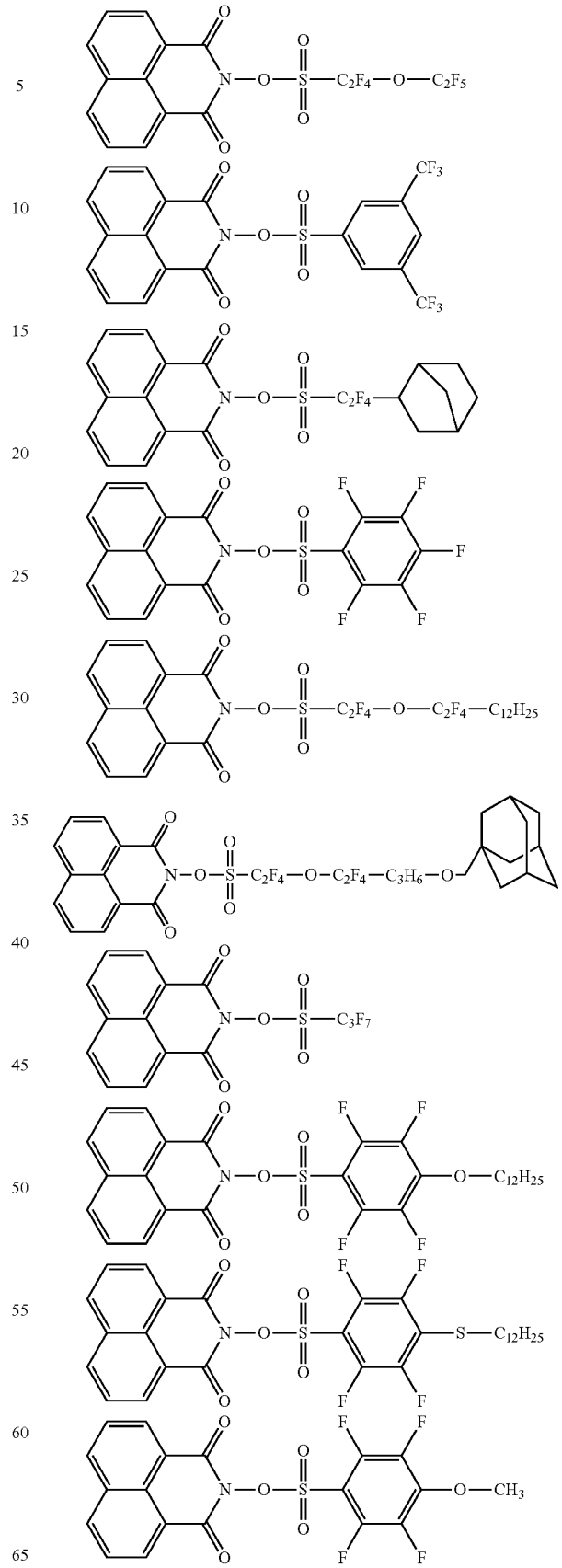

As the acid generator (A), a naphthalic acid derivative represented by the Formula (a22) below is also preferable.

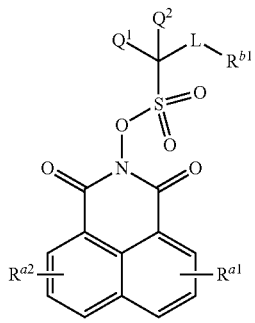

(a22)

In the Formula (a22), $R^{b1}$ is a hydrocarbon group having 1 or more and 30 or less carbon atoms. In the case of the hydrocarbon group as $R^{b1}$ including at least one methylene group, at least part of the methylene group may be substituted by a group selected from the group consisting of —O—, —S—, —CO—, —CO—O—, —SO—, —SO$_2$—, —CR$^{b4}$R$^{b5}$—, and —NR$^{b6}$—. In the case of the hydrocarbon group as $R^{1b}$ including a hydrocarbon ring, at least one of the carbon atoms constituting the hydrocarbon ring may be substituted by a heteroatom selected from the group consisting of N, O, P, S and Se, or an atomic group including this heteroatom. $R^{b4}$ and $R^{b5}$ are each independently a hydrogen atom or halogen atom, and at least one of $R^{b4}$ and $R^{b5}$ is a halogen atom. $R^{b6}$ is a hydrogen atom or a hydrocarbon group having 1 or more and 6 or less carbon atoms. $R^{a1}$ and $R^{2a}$ are each independently a hydrogen atom, an aliphatic hydrocarbon group having 1 or more and 20 or less carbon atoms which may have a substituent, an aromatic group having 5 or more and 20 or less carbon atoms which may have a substituent, or a group represented by —$R^{a3}$—$R^{a4}$. $R^{a1}$ and $R^{a2}$ are not simultaneously hydrogen atoms. In the case of an aliphatic hydrocarbon group as $R^{a1}$ or $R^{a2}$ including at least one methylene group, at least part of the methylene group may be substituted by a group selected from the group consisting of —O—, —S—, —CO—, —CO—O—, —SO—, —SO$_2$—, and —NR$^{a6}$—. $R^{a6}$ is a hydrogen atom, or a hydrocarbon group having 1 or more and 6 or less carbon atoms. Rai is a methylene group, —O—, —CO—, —CO—O—, —SO—, —SO$_2$—, or —NR$^{a6}$—. $R^{a6}$ is a hydrogen atom or a hydrocarbon group having 1 or more and 6 or less carbon atom. $R^{a4}$ is an aromatic group having 5 or more and 20 or less carbon atoms which may have a substituent, a perfluoroalkyl group having 1 or more and 6 or less carbon atoms, an aralkyl group having 7 or more and 20 or less carbon atoms which may have a substituent, or a heteroarylalkyl group including an aromatic ring having 5 or more and 20 or less carbon atoms which may have a substituent. Q1 and Q2 are each independently a fluorine atom, or a perfluoroalkyl group having 1 or more and 6 or less carbon atoms. L is an ester bond.

The aliphatic hydrocarbon group having 1 or more and 20 or less carbon atoms as $R^{a1}$ and $R^{a2}$ in the Formula (a22) may be linear, may be a branched chain, may be cyclic, or may be a combination of these structures. An alkyl group is preferable as the aliphatic hydrocarbon group. As suitable specific examples of the alkyl group, a methyl group, ethyl group, n-propyl group, isopropyl group, n-butyl group, isobutyl group, sec-butyl group, tert-butyl group, n-pentyl group, n-hexyl group, n-heptyl group, n-octyl group, 2-ethylhexyl group, n-nonyl group and n-decyl group can be exemplified. As the substituent which may be possessed by the aliphatic hydrocarbon group having 1 or more and 20 or less carbon atoms as $R^{a1}$ and $R^{a2}$, a hydroxyl group, mercapto group, amino group, halogen atom, oxygen atom, nitro group, cyano group, etc. can be exemplified. The number of substituents is arbitrary. As the aliphatic hydrocarbon group having 1 or more and 20 or less carbon atoms and having a substituent as $R^{a1}$ and $R^{a2}$, for example, a perfluoroalkyl group having 1 or more and 6 or less carbon atoms can be exemplified. As specific examples thereof, CF$_3$—, CF$_3$CF$_2$—, (CF$_3$)$_2$CF—, CF$_3$CF$_2$CF$_2$—, CF$_3$CF$_2$CF$_2$CF$_2$—, (CF$_3$)$_2$CFCF$_2$—, CF$_3$CF$_2$(CF$_3$)CF— and (CF$_3$)$_3$C— can be exemplified.

The aromatic group having 5 or more and 20 or less carbon atoms which may have a substituent as $R^{a1}$ and $R^{a2}$ in the Formula (a22) may be aromatic hydrocarbon groups, or aromatic heterocyclic groups. As the aromatic group, an aryl group such as a phenyl group and naphthyl group, and heteroaryl group such as a furyl group and thienyl group can be exemplified. The substituent which may be possessed by the aromatic group having 5 or more and 20 or less carbon atoms is the same as the substituent which may be possessed by the aliphatic hydrocarbon group having 1 or more and 20 or less carbon atoms and having a substituent as $R^{a1}$ and $R^{a2}$.

The aromatic group having 5 or more and 20 or less ring constituent atoms which may have a substituent as $R^{a4}$ in the Formula (a22) is similar to the aromatic group of having 5 or more and 20 or less ring constituent atoms which may have a substituent explained for $R^{a1}$ and $R^{a2}$. The perfluoroalkyl group having 1 or more and 6 or less carbon atoms as $R^{a4}$ in the Formula (a22) is similar to the perfluoroalkyl group having 1 or more and 6 or less carbon atoms explained as $R^{a1}$ and $R^{a2}$. As specific examples of the aralkyl group having 7 or more and 20 or less carbon atoms which may have a substituent as $R^{a4}$ in the Formula (a22), a benzyl group, phenethyl group, α-naphthylmethyl group, β-naphthylmethyl group, 2-α-naphthylethyl group, 2-β-naphthylethyl group, etc. can be exemplified. Heteroarylalkyl group in the Formula (a22) is a group in which part of the carbon atoms constituting the aromatic hydrocarbon ring in the arylalkyl group is substituted by a heteroatom such as N, O, S, etc. As specific examples of the heteroarylalkyl group including an aromatic heterocyclic group having 5 or more and 20 or less ring constituent atoms which may have a substituent as $R^{a4}$, a pyridine-2-ylmethyl group, pyridine-3-ylmethyl group, pyridine-4-ylmethyl group, etc. can be exemplified.

The hydrocarbon group having 1 or more and 6 or less carbon atoms as $R^{a5}$ in the Formula (a22) may be an aliphatic hydrocarbon group, aromatic hydrocarbon group, or a combination of these. The aliphatic hydrocarbon group may be linear, may be a branched chain, may be cyclic, or may be a combination of these structures. As the aliphatic hydrocarbon group, alkyl groups such as a methyl group, ethyl group, n-propyl group, isopropyl group, n-butyl group, isobutyl group, sec-butyl group, tert-butyl group, n-pentyl group and n-hexyl group can be exemplified. As the aromatic hydrocarbon group, a phenyl group can be exemplified.

The hydrocarbon group having 1 or more and 6 or less carbon atoms as $R^{a6}$ in the Formula (a22) is similar to the hydrocarbon groups having 1 or more and 6 or less carbon atoms explained for $R^{a5}$.

The hydrocarbon group having 1 or more and 30 or less carbon atoms as $R^{b1}$ in the Formula (a22) may be an aliphatic hydrocarbon group, aromatic hydrocarbon group, or a combination of these. The aliphatic hydrocarbon group may be linear, may be a branched chain, may be cyclic, or may be a combination of these structures. As the aliphatic hydrocarbon group, a linear aliphatic hydrocarbon group such as a methyl group, ethyl group, n-propyl group, isopropyl group, n-butyl group, isobutyl group, sec-butyl group, tert-butyl group, n-pentyl group and n-hexyl group; and a cyclic aliphatic hydrocarbon group (hydrocarbon ring) such as a cyclopropyl group, cyclobutyl group, cyclopentyl group, cyclohexyl group, adamantyl group and norbornyl group can be exemplified. As the aliphatic hydrocarbon group, a phenyl group and naphthyl group can be exemplified. As a group in which an aliphatic hydrocarbon group and aromatic hydrocarbon group are combined, a benzyl group, phenethyl group and furylmethyl group can be exemplified. In the case of the hydrocarbon group as $R^{b1}$ including a hydrocarbon ring, as an atomic group including a heteroatom substituting at least one of the carbon atoms constituting the hydrocarbon ring, —CO—, —CO—O—, —SO—, —SO$_2$—, —SO$_2$—O—, and —P(=O)—(OR$^{b7}$)$_3$ can be exemplified. $R^{b7}$ is a hydrocarbon group having 1 or more and 6 or less carbon atoms, and is similar to the hydrocarbon group having 1 or more and 6 or less carbon atoms explained for $R^{a5}$.

As specific examples of the heteroatom as $R^{b4}$ and $R^{b5}$ in the Formula (a22), a chlorine atom, fluorine atom, bromine atom and iodine atom can be exemplified.

The hydrocarbon group having 1 or more and 6 or less carbon atoms as $R^{b6}$ in the Formula (a22) is similar to the hydrocarbon group having 1 or more and 6 or less carbon atoms explained as $R^{a5}$ in the Formula (a22).

The perfluoroalkyl group having 1 or more and 6 or less carbon atoms as $Q^1$ and $Q^2$ in the Formula (a22) is similar to the perfluoroalkyl group having 1 or more and 6 or less carbon atoms explained as $R^{a1}$ and $R^{a2}$ in the Formula (a22).

In the compound represented by the Formula (a22), the orientation of the ester bond as L is not particularly limited, and may be either of —CO—O— and —O—CO—.

The compound represented by the Formula (a22) is preferably a compound represented by the Formula (a22-1) below.

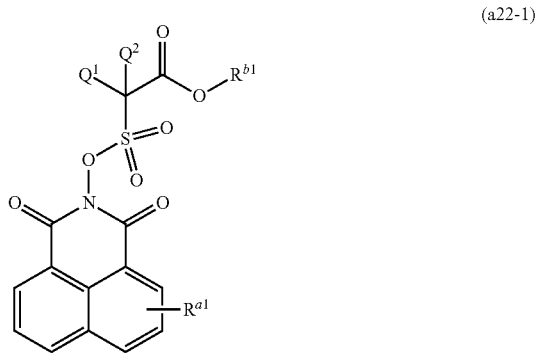

(a22-1)

$R^{b1}$, $R^{a1}$, $Q^1$ and $Q^2$ in the Formula (a22-1) are similar to those in the Formula (a22).

The $R^{a1}$ in the Formula (a22-1) is an aliphatic hydrocarbon group having 1 or more and 20 or less carbon atoms which may have a substituent, and in the case of the aliphatic hydrocarbon group as $R^{a1}$ including at least one methylene group, a compound represented by the Formula (a22-1) in which at least part of the methylene group may be substituted by a group selected from the group consisting of —O—, —S—, —CO—, —CO—O—, —SO—, —SO$_2$— and —NR$^{a5}$— is preferable.

The compound represented by the Formula (a22) can be produced by a production method of the N-organosulfonyloxy compound below. The production method of the N-organosulfonyloxy compound which can produce the compound represented by the Formula (a22) is a production method of a N-organosulfonyloxy compound, including a step of reacting the N-hydroxy compound (a') and sulfonic acid fluoride compound (b') under the presence of the basic compound (d'), characterized by a silylating agent (c') being present in the system upon reacting the N-hydroxy compound (a') and sulfonic acid fluoride compound (b'), the sulfonic acid fluoride compound (b') being represented by the Formula (b1-1) below, the silylating agent (c') being able to convert a hydroxy group on a nitrogen atom possessed by the N-hydroxy compound (a') into a silyloxy group represented by the Formula (ac1) below.

(ac1)

(In the Formula (ac1), $R^{c1}$ are each independently a hydrocarbon group having 1 or more and 10 or less carbon atoms.)

(b1-1)

(In the Formula (b1-1), $R^{b1}$, L, $Q^1$ and $Q^2$ are each similar to those in the above Formula (a22).)

In addition, the production method of the N-organosulfonyloxy compound which can produce the compound represented by the Formula (a22) is a production method of N-organosulfonyloxy compound including: a silylation step of silylating a N-hydroxy compound (a') by a silylating agent (c'); and a condensation step of condensing the silylation product of the N-hydroxy compound (a') generated in the silylation step, with a sulfonic acid fluoride compound (b') under the presence of a basic compound (d'), in which the sulfonic acid fluoride (b') is represented by the above Formula (b1-1), the silylating agent can convert a hydroxy group on a nitrogen atom possessed by the N-hydroxy compound (a') to a silyloxy group represented by the above Formula (ac1).

The N-hydroxy compound (a') is a compound represented by the Formula (a22-2) below.

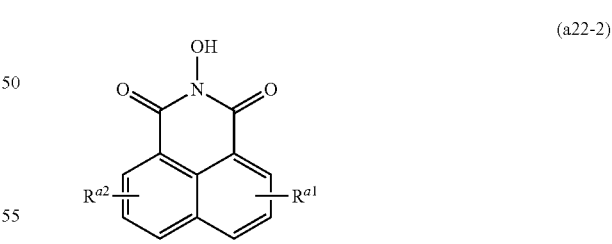

(a22-2)

$R^{a1}$ and $R^{a2}$ in the Formula (a22-2) are similar to those in the above Formula (a22).

The N-hydroxy compound (a') can be synthesized by a known method such as that disclosed in the pamphlet of PCT International Publication No. WO2014/084269 or Japanese Unexamined Patent Application (Translation of PCT Publication), Publication No. 2017-535595, for example. For example, the compound represented by the Formula (a22-1) in which $R^{a2}$ is a hydrogen atom can be synthesized by converting the bromo group on the naphthalic anhydride to $R^{a1}$, by the reaction shown in the following formula with a commercially available bromide as the starting material, and then forming a N-hydroxyimide by action of a hydroxylamine compound such as hydroxylamine hydrochloride on the acid anhydride group. In addition, a commercial product may be used as the N-hydroxy compound (a').

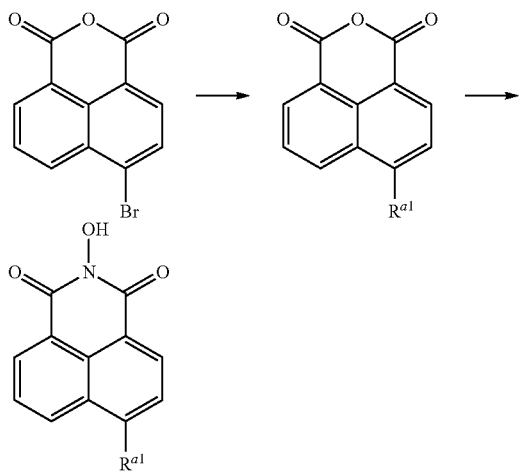

The sulfonic acid fluoride compound (b') can be synthesized by a known method. For example, the compound of (b1-1) in which $Q^1$ and $Q^2$ are fluorine atoms can be synthesized by the reaction represented by the following formula. In addition, a commercial product may be used as the sulfonic acid fluoride compound (b').

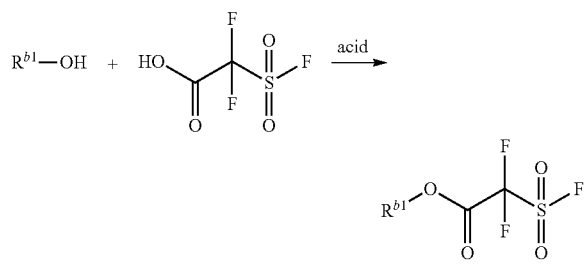

In the Formula (ac1), the hydrocarbon group having 1 or more and 10 or less carbon atoms as $R^{c1}$ may be an aliphatic hydrocarbon group, aromatic hydrocarbon group, or a combination of these. The aliphatic hydrocarbon group may be linear, may be a branched chain, may be cyclic, or may be a combination of these structures. As the aliphatic hydrocarbon group, an alkyl group such as a methyl group, ethyl group, n-propyl group, isopropyl group, n-butyl group, isobutyl group, sec-butyl group, tert-butyl group, n-pentyl group, n-hexyl group, n-heptyl group, n-octyl group, 2-ethylhexyl group, n-nonyl group and n-decyl group can be exemplified. As the aromatic hydrocarbon group, a phenyl group and naphthyl group can be exemplified.

As the silylating agent (c'), a compound represented by the Formula (c1) below can be exemplified.

(In the Formula (c1), $R^{c1}$ is the same as $R^{c1}$ in the Formula (ac1), and X is a halogen atom.)

As specific examples of the halogen atom as X in the Formula (c1), a chlorine atom, fluorine atom, bromine atom and iodine atom can be exemplified.

As specific examples of the silylating agent (c'), trimethylsilyl chloride, trimethylsilyl fluoride, trimethylsilyl bromide, t-butyldimethylsilyl chloride, ethyldimethylsilyl chloride, and isopropyldimethylsilyl chloride can be exemplified.

The basic compound (d') may be an organic base or an inorganic base. As the organic base, for example, a nitrogen-containing basic compound can be exemplified, and as specific examples, amines such as methylamine, ethylamine, n-propylamine, isopropylamine, n-butylamine, dimethylamine, diethylamine, di-n-propylamine, diisopropylamine, di-n-butylamine, trimethylamine, triethylamine, methyldiethylamine, N-ethyldiisopropylamine, tri-n-propylamine, triisopropylamine, monoethanolamine, diethanolamine and triethanolamine; cyclic basic compounds such as pyrrole, piperidine, 1,8-diazabicyclo[5,4,0]-7-undecene, and 1,5-diazabicyclo[4,3,0]-5-nonane; quaternary ammonium salts such as tetramethylammonium hydroxide (TMAH), tetraethylammonium hydroxide, tetrapropylammonium hydroxide (TPAH), tetrabutylammonium hydroxide, methyltripropylammonium hydroxide, methyltributylammonium hydroxide, benzyltriethylammonium hydroxide and trimethyl(2-hydroxyethyl)ammonium hydroxide; etc. can be exemplified. As the inorganic base, for example, metal hydroxides, metal hydrogen carbonates and metal bicarbonates can be exemplified. As specific examples of the inorganic base, metal hydroxides such as lithium hydroxide, potassium hydroxide, sodium hydroxide, rubidium hydroxide, cesium hydroxide, magnesium hydroxide, calcium hydroxide, strontium hydroxide and barium hydroxide; metal hydrogen carbonates such as lithium carbonate, potassium carbonate, sodium carbonate, rubidium carbonate, cesium carbonate, magnesium carbonate, calcium carbonate, strontium carbonate and barium carbonate; metal bicarbonates such as lithium hydrogencarbonate, potassium bicarbonate, sodium bicarbonate, rubidium hydrogencarbonate and cesium hydrogencarbonate; etc. can be exemplified.

The production method of the N-organosulfonyloxy compound causes such an N-hydroxy compound (a') and sulfonic acid fluoride compound (b') to react under the presence of the silylating agent (c') and basic compound (d'). In this way, upon reacting the N-hydroxy compound (a') and sulfonic acid fluoride compound (b') under the presence of the basic compound (d'), it is possible to produce the N-organosulfonyloxy compound efficiently, by having the silylating agent (c') present. For example, it is possible to obtain at least 65% N-organosulfonyloxy compound relative to the raw materials of the N-hydroxy compound (a') and sulfonic acid fluoride compound (b').

A N-organosulfonyloxy compound having a structure in which a group in which a hydrogen atom of the hydroxy group bonded to the nitrogen atom of the N-hydroxy compound (a') is eliminated, and $R^{b1}$—$SO_2$— derived from the sulfonic acid fluoride compound (b') are bonded is obtained by the production method of the N-organosulfonyloxy compound.

In the production method of the N-organosulfonyloxy compound, upon reacting the N-hydroxy compound (a') and sulfonic acid fluoride compound (b') under the presence of the basic compound (d'), so long as the silylating agent (c') is present in the system, it may simultaneously mix the N-hydroxy compound (a'), sulfonic acid fluoride compound (b'), silylating agent (c') and basic compound (d'), or may add the sulfonic acid fluoride compound (b') and basic compound (d'), after partial reaction between the N-hydroxy compound (a') and silylating agent (c'), or after completing the reaction between the N-hydroxy compound (a') and silylating agent (c').

When reacting such an N-organosulfonyloxy compound (a') and sulfonic acid fluoride compound (b') under the presence of the silylating agent (c') and basic compound (d'), the N-organosulfonyloxy compound (a') is silylated by the silylating agent (c'), and the hydroxy group on the nitrogen atom is converted to the silyloxy group represented by the above Formula (ac1) (Step 1: silylation step). Then, the silylated product of the N-organosulfonyloxy compound (a') generated in the silylation step condenses with the sulfonic acid fluoride compound (b') affected by the basic compound (d') (Step 2: condensation step). The N-organosulfonyloxy compound is thereby obtained.

As an example of the production method of N-organosulfonyloxy compound, below shows a reaction formula in the case of using the compound represented by the above Formula (a22-2) as the N-organosulfonyloxy compound (a'), a compound of the above Formula (b1-1) in which $Q^1$ and $Q^2$ are fluorine atoms as the sulfonic acid fluoride compound (b'), trimethylsilyl chloride as the silylating agent (c'), and triethylamine as the basic compound (d'). It should be noted that what is shown below is not the reaction mechanism which has been analytically confirmed, but rather the reaction mechanism assumed from the raw materials and their behavior during reaction.

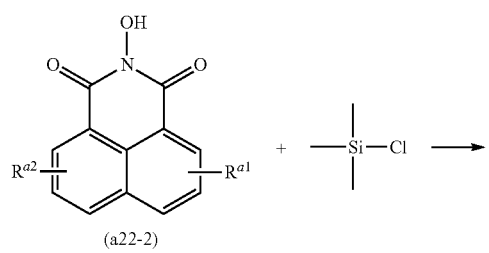

Step-1

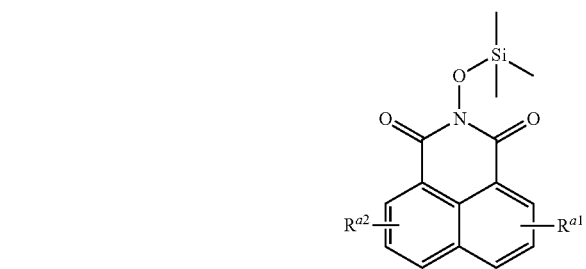

Step-2

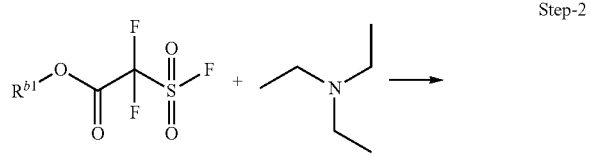

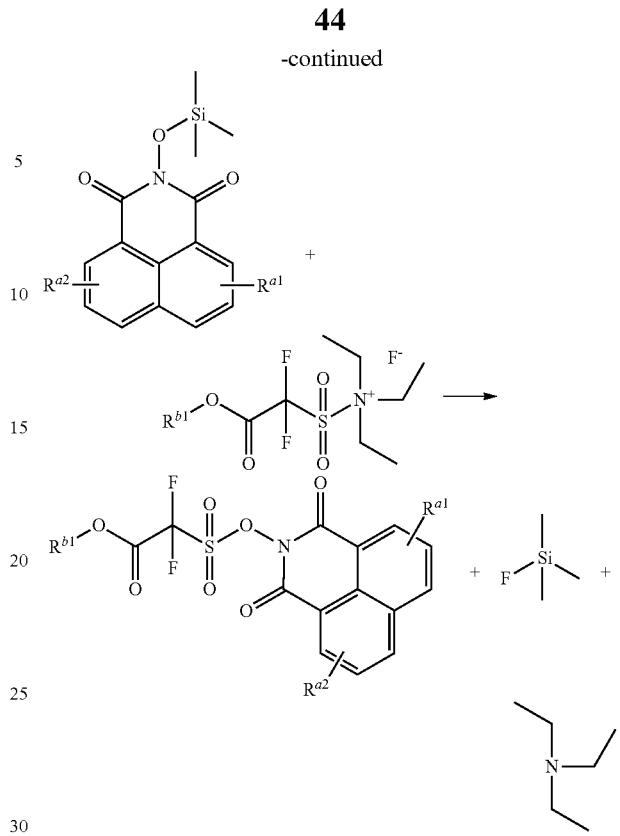

As organic solvents which can be used in reaction, for example, esters such as ethyl acetate, butyl acetate and cellosolve acetate; ketones such as acetone, methylethyl ketone, isobutyl ketone and methylisobutyl ketone; esters such as ethyl acetate, butyl acetate and diethyl malonate; amides such as N-methylpyrrolidone and N,N-dimethylformamide; ethers such as diethyl ether, ethylcyclopentyl ether, tetrahydrofuran and dioxane; aromatic hydrocarbons such as toluene and xylene; aliphatic hydrocarbons such as chloroform, dicyclomethane, methylene chloride and ethylene chloride; nitrile-based solvents such as acetonitrile and propionitrile; dimethyl sulfoxide; dimethyl sulfoamide; etc. can be exemplified. The organic solvent used may adopt one type of solvent, or may adopt any combination of two or more types. The reaction temperatures which can be adopted, for example, are a range of 10° C. to 200° C., preferably a range of 0° C. to 150° C., and more preferably 5° C. to 120° C. The reaction times which can be adopted, for example, are 5 minutes to 20 hours, 10 minutes to 15 hours, and 30 minutes to 12 hours.

It is preferable to use excess of each of the sulfonic acid fluoride compound (b'), silylating agent (c'), and basic compound (d') relative to the N-organosulfonyloxy compound (a'). For example, it is preferable to use 1.1 moles to 2.5 moles of the sulfonic acid fluoride compound (b'), 1.1 moles to 2.5 moles of the silylating agent (c') and 1.1 moles to 2.5 moles of the basic compound (d') relative to 1.0 mole of the N-organosulfonyloxy compound (a').

This acid generator (A) may be used alone, or two or more types may be used in combination. Furthermore, the content of the acid generator (A) is adjusted to preferably 0.1% by mass or more and 10% by mass or less, more preferably 0.2% by mass or more and 6% by mass or less, and particularly preferably 0.5% by mass or more and 3% by mass or less, relative to the total mass of the solid component of the photosensitive composition. When the amount of the acid generator (A) used is adjusted to the range mentioned above, it is easy to prepare a photosensitive composition which is a uniform solution having satisfactory sensitivity and excellent storage stability.

<Resin (B)>

A resin (B) whose solubility in alkali increases under the action of acid is not particularly limited any resins whose solubility in alkali increases under the action of acid can be used. Among them, it is preferable to contain at least one resin selected from the group consisting of a novolak resin (B1), a polyhydroxystyrene resin (B2), and an acrylic resin (B3).

[Novolak Resin (B1)]

As the novolak resin (B1), a resin including the constituent unit represented by the following formula (b1) may be used.

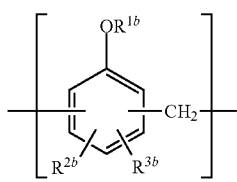

In the formula (b1), $R^{1b}$ represents an acid-dissociable dissolution-inhibiting group, and $R^{2b}$ and $R^{3b}$ each independently represent a hydrogen atom or an alkyl group having 1 or more and 6 or less carbon atoms.

The acid-dissociable dissolution-inhibiting group represented by the above $R^{1b}$ is preferably a group represented by the following formula (b2) or (b3), a linear, branched or cyclic alkyl group having 1 or more and 6 or less carbon atoms, a vinyloxyethyl group, a tetrahydropyranyl group, a tetrahydrofuranyl group, or a trialkylsilyl group.

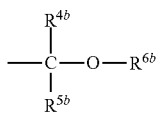

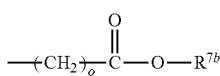

In the above formulae (b2) and (b3), $R^{4b}$ and $R^{5b}$ each independently represent a hydrogen atom, or a linear or branched alkyl group having 1 or more and 6 or less carbon atoms, $R^{6b}$ represents a linear, branched or cyclic alkyl group having 1 or more and 10 or less carbon atoms, $R^{7b}$ represents a linear, branched or cyclic alkyl group having 1 or more and 6 or less carbon atoms, and o represents 0 or 1.

Examples of the above linear or branched alkyl group include a methyl group, an ethyl group, a propyl group, an isopropyl group, an n-butyl group, an isobutyl group, a tert-butyl group, a pentyl group, an isopentyl group, a neopentyl group, and the like. Also, examples of the above cyclic alkyl group include a cyclopentyl group, a cyclohexyl group, and the like.

Specific examples of the acid-dissociable dissolution-inhibiting group represented by the above formula (b2) include a methoxyethyl group, ethoxyethyl group, n-propoxyethyl group, isopropoxyethyl group, n-butoxyethyl group, isobutoxyethyl group, tert-butoxyethyl group, cyclohexyloxyethyl group, methoxypropyl group, ethoxypropyl group, 1-methoxy-1-methylethyl group, 1-ethoxy-1-methylethyl group, and the like. Furthermore, specific examples of the acid-dissociable dissolution-inhibiting group represented by the above formula (b3) include a tert-butoxycarbonyl group, a tert-butoxycarbonylmethyl group, and the like. Examples of the above trialkylsilyl group include a trimethylsilyl group and tri-tert-butyldimethylsilyl group in which each alkyl group has 1 or more and 6 or less carbon atoms.

[Polyhydroxystyrene Resin (B2)]

As the polyhydroxystyrene resin (B2), a resin including a constituent unit represented by the following formula (b4) may be used.

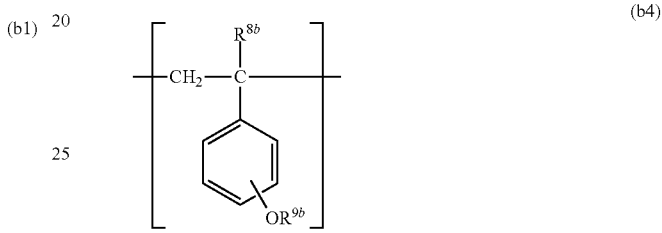

In the above formula (b4), $R^{8b}$ represents a hydrogen atom or an alkyl group having 1 or more and 6 or less carbon atoms, and $R^{9b}$ represents an acid-dissociable dissolution-inhibiting group.

The above alkyl group having 1 or more and 6 or less carbon atoms may include, for example, linear, branched or cyclic alkyl groups having 1 or more and 6 or less carbon atoms. Examples of the linear or branched alkyl group include a methyl group, ethyl group, propyl group, isopropyl group, n-butyl group, isobutyl group, tert-butyl group, pentyl group, isopentyl group, neopentyl group, and the like. Examples of the cyclic alkyl group include a cyclopentyl group and cyclohexyl group.

The acid-dissociable dissolution-inhibiting group represented by the above $R^{9b}$ may be similar to those exemplified in terms of the above formulae (b2) and (b3).

Furthermore, the polyhydroxystyrene resin (B2) may include another polymerizable compound as a constituent unit in order to moderately control physical or chemical properties. The polymerizable compound is exemplified by conventional radical polymerizable compounds and anion polymerizable compounds. Examples of the polymerizable compound include monocarboxylic acids such as acrylic acid, methacrylic acid and crotonic acid; dicarboxylic acids such as maleic acid, fumaric acid and itaconic acid; methacrylic acid derivatives having a carboxyl group and an ester bond such as 2-methacryloyloxyethyl succinic acid, 2-methacryloyloxyethyl maleic acid, 2-methacryloyloxyethyl phthalic acid and 2-methacryloyloxyethyl hexahydrophthalic acid; (meth)acrylic acid alkyl esters such as methyl (meth)acrylate, ethyl (meth)acrylate and butyl (meth)acrylate; (meth)acrylic acid hydroxyalkyl esters such as 2-hydroxyethyl (meth)acrylate and 2-hydroxypropyl (meth)acrylate; (meth)acrylic acid aryl esters such as phenyl (meth)acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; and amide bond-containing polymerizable compounds such as acrylamide and methacrylamide.

[Acrylic Resin (B3)]

An acrylic resin (B3) is not particularly limited as long as it is an acrylic resin the solubility of which in alkali increases under the action of acid, and has conventionally blended in various photosensitive compositions. It should be noted that, in the disclosure and claims of the present application, a resin containing constituent units derived from (meta)acrylate having an acid-dissociable group represented by Formula (b5) to Formula (b7) described later is defined as acrylic resin (B3).

Preferably, the acrylic resin (B3) contains a constituent unit (b-3) derived from, for example, an acrylic ester including an $-SO_2$-containing cyclic group or a lactone-containing cyclic group. In such a case, when a patterned resist film is formed, a patterned resist film having a preferable cross-sectional shape can be easily formed.

($-SO_2$-Containing Cyclic Group)

Herein, the "$-SO_2$-containing cyclic group" refers to a cyclic group having a cyclic group containing a ring including $-SO_2-$ in the ring skeleton thereof, specifically a cyclic group in which the sulfur atom (S) in $-SO_2-$ forms a part of the ring skeleton of the cyclic group. Considering a ring including $-SO_2-$ in the ring skeleton thereof as the first ring, a group having that ring alone is called a monocyclic group, and a group further having another ring structure is called a polycyclic group regardless of its structure. The $-SO_2$-containing cyclic group may be monocyclic or polycyclic.

In particular, the $-SO_2$-containing cyclic group is preferably a cyclic group containing $-O-SO_2-$ in the ring skeleton thereof, i.e., a cyclic group containing a sultone ring in which $-O-S-$ in $-O-SO_2-$ forms a part of the ring skeleton.

The number of carbon atoms in an $-SO_2$-containing cyclic group is preferably 3 or more and 30 or less, more preferably 4 or more and 20 or less, even more preferably 4 or more and 15 or less, and in particular preferably 4 or more and 12 or less. The above number of carbon atoms is the number of carbon atoms constituting a ring skeleton, and shall not include the number of carbon atoms in a substituent.

The $-SO_2$-containing cyclic group may be an $-SO_2$-containing aliphatic cyclic group or an $-SO_2$-containing aromatic cyclic group. It is preferably an $-SO_2$-containing aliphatic cyclic group.

$-SO_2-$ containing aliphatic cyclic groups include a group in which at least one hydrogen atom is removed from an aliphatic hydrocarbon ring where a part of the carbon atoms constituting the ring skeleton thereof is(are) substituted with $-SO_2-$ or $-O-SO_2-$. More specifically, they include a group in which at least one hydrogen atom is removed from an aliphatic hydrocarbon ring where $-CH_2-$ constituting the ring skeleton thereof is substituted with $-SO_2-$ and a group in which at least one hydrogen atom is removed from an aliphatic hydrocarbon ring where $-CH_2-CH_2-$ constituting the ring thereof is substituted with $-O-SO_2-$.

The number of carbon atoms in the above alicyclic hydrocarbon ring is preferably 3 or more and 20 or less, more preferably 3 or more and 12 or less. The above alicyclic hydrocarbon ring may be polycyclic, or may be monocyclic. As the monocyclic alicyclic hydrocarbon group, preferred is a group in which two hydrogen atoms are removed from monocycloalkane having 3 or more and 6 or less carbon atoms. Examples of the above monocycloalkane can include cyclopentane, cyclohexane and the like. As the polycyclic alicyclic hydrocarbon ring, preferred is a group in which two hydrogen atoms are removed from polycycloalkane having 7 or more and 12 or less carbon atoms, and specific examples of the above polycycloalkane include adamantane, norbornane, isobornane, tricyclodecane, tetracyclododecane and the like.

The $-SO_2$-containing cyclic group may have a substituent. Examples of the above substituent include, for example, an alkyl group, an alkoxy group, a halogen atom, a halogenated alkyl group, a hydroxyl group, an oxygen atom (=O), $-COOR"$, $-OC(=O)R"$, a hydroxyalkyl group, a cyano group and the like.

For an alkyl group as the above substituent, preferred is an alkyl group having 1 or more and 6 or less carbon atoms. The above alkyl group is preferably linear or branched. Specific examples include a methyl group, an ethyl group, an n-propyl group, an isopropyl group, an n-butyl group, an isobutyl group, a tert-butyl group, an n-pentyl group, an isopentyl group, a neopentyl group, an n-hexyl group and the like. Among these, a methyl group or an ethyl group is preferred, and a methyl group is particularly preferred.

For an alkoxy group as the above substituent, preferred is an alkoxy group having 1 or more and 6 or less carbon atoms. The above alkoxy group is preferably linear or branched. Specific examples include a group in which an alkyl groups recited as an alkyl group for the above substituent is attached to the oxygen atom ($-O-$).

Halogen atoms as the above substituent include a fluorine atom, a chlorine atom, a bromine atom, an iodine atom and the like, and a fluorine atom is preferred.

Halogenated alkyl groups for the above substituent include a group in which a part or all of the hydrogen atoms in the above alkyl group is(are) substituted with the above halogen atom(s).

Halogenated alkyl groups as the above substituent include a group in which a part or all of the hydrogen atoms in the alkyl groups recited as an alkyl group for the above substituent is(are) substituted with the above halogen atom(s). As the above halogenated alkyl group, a fluorinated alkyl group is preferred, and a perfluoroalkyl group is particularly preferred.

R"s in the aforementioned $-COOR"$ and $-OC(=O)R"$ are either a hydrogen atom or a linear, branched or cyclic alkyl group having 1 or more and 15 or less carbon atoms.

In a case where R" is a linear or branched alkyl group, the number of carbon atoms in the above chain alkyl group is preferably 1 or more and 10 or less, more preferably 1 or more and 5 or less, and in particular preferably 1 or 2.

In a case where R" is a cyclic alkyl group, the number of carbon atoms in the above cyclic alkyl group is preferably 3 or more and 15 or less, more preferably 4 or more and 12 or less, and in particular preferably 5 or more and 10 or less. Specific examples can include a group in which one or more hydrogen atoms are removed from monocycloalkane; and polycycloalkane such as bicycloalkane, tricycloalkane, tetracycloalkane and the like optionally substituted with a fluorine atom or a fluorinated alkyl group. More specific examples include a group in which one or more hydrogen atoms are removed from monocycloalkane such as cyclopentane and cyclohexane; and polycycloalkane such as adamantane, norbornane, isobornane, tricyclodecane and tetracyclododecane.

For a hydroxyalkyl group as the above substituent, preferred is a hydroxyalkyl group having 1 or more and 6 or less carbon atoms. Specific examples include a group in which at least one of the hydrogen atoms in the alkyl groups recited as an alkyl group for the above substituent is substituted with a hydroxyl group.

More specific examples of the —SO$_2$-containing cyclic group include the groups represented by the following formulae (3-1) to (3-4).

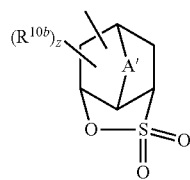

(3-1)

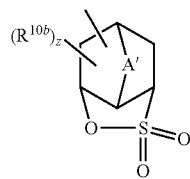

(3-2)

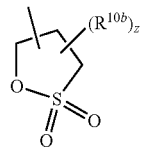

(3-3)

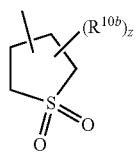

(3-4)

(In the formulae, A' represents an alkylene group having 1 or more and 5 or less carbon atoms optionally including an oxygen atom or a sulfur atom, an oxygen atom or a sulfur atom; z represents an integer of 0 or more and 2 or less; RIcID represents an alkyl group, an alkoxy group, a halogenated alkyl group, a hydroxyl group, —COOR", —OC(=O)R", a hydroxyalkyl group, or a cyano group; and R" represents a hydrogen atom or an alkyl group.)

In the above formulae (3-1) to (3-4), A' represents an alkylene group having 1 or more and 5 or less carbon atoms optionally including an oxygen atom (—O—) or a sulfur atom (—S—), an oxygen atom or a sulfur atom. As an alkylene group having 1 or more and 5 or less carbon atoms in A', a linear or branched alkylene group is preferred, and examples thereof include a methylene group, an ethylene group, an n-propylene group, an isopropylene group and the like.

In a case where the above alkylene group includes an oxygen atom or a sulfur atom, specific examples thereof include a group in which —O— or —S— is present at a terminal or between carbon atoms of the above alkylene group, for example, —O—CH$_2$—, —CH$_2$—O—CH$_2$—, —S—CH$_2$—, —CH$_2$—S—CH$_2$—, and the like. As A', an alkylene group having 1 or more and 5 or less carbon atoms or —O— is preferred, and an alkylene group having 1 or more and 5 or less carbon atoms is more preferred, and a methylene group is most preferred.

z may be any of 0, 1, and 2, and is most preferably 0. In a case where z is 2, a plurality of R$^{10b}$ may be the same, or may differ from each other.

An alkyl group, an alkoxy group, a halogenated alkyl group, —COOR", —OC(=O)R" and a hydroxyalkyl group in R$^{10b}$ include those similar to the groups described above for the alkyl group, the alkoxy group, the halogenated alkyl group, —COOR", —OC(=O)R" and the hydroxyalkyl group, respectively, which are recited as those optionally contained in the —SO$_2$-containing cyclic group.

Below, specific cyclic groups represented by the above formulae (3-1) to (3-4) will be illustrated. Note here that "Ac" in the formulae represents an acetyl group.

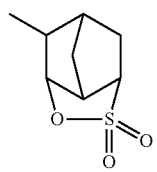

(3-1-1)

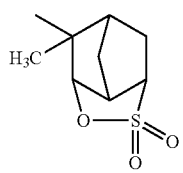

(3-1-2)

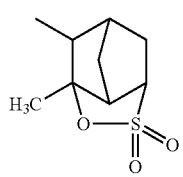

(3-1-3)

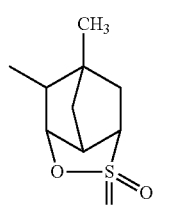

(3-1-4)

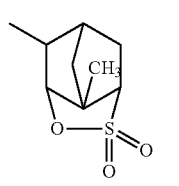

(3-1-5)

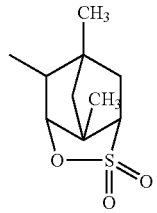

(3-1-6)

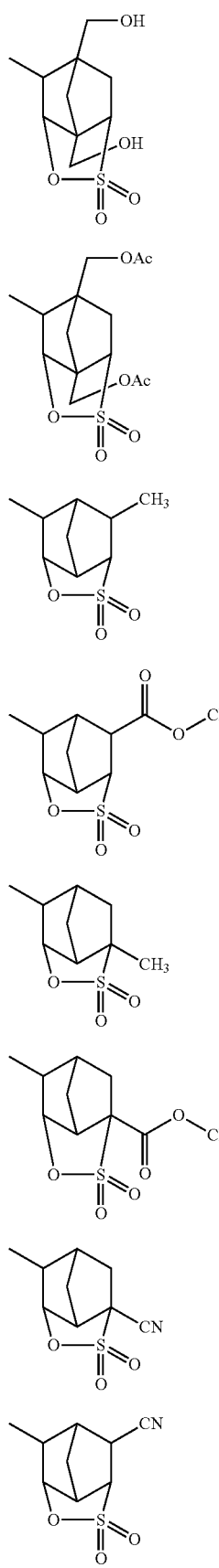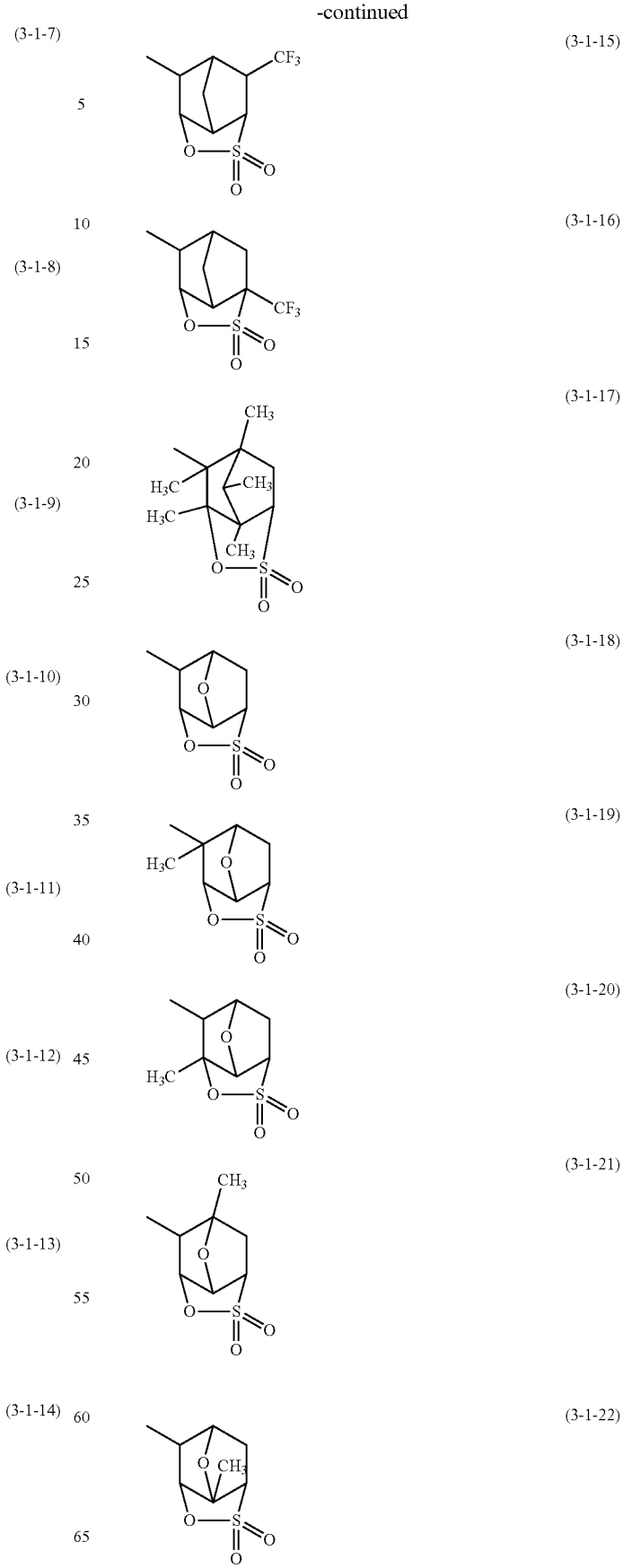

(3-1-23) 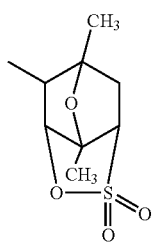

(3-1-24) 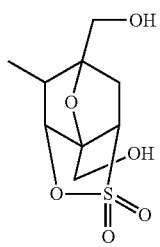

(3-1-25) 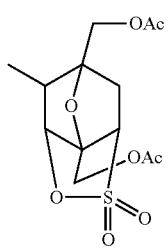

(3-1-26) 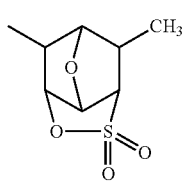

(3-1-27) 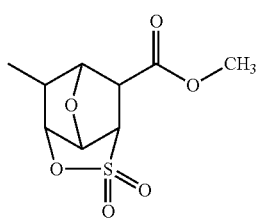

(3-1-28) 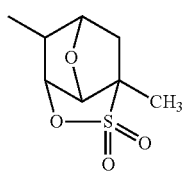

(3-1-29) 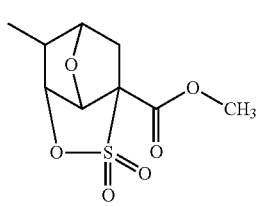

(3-1-30) 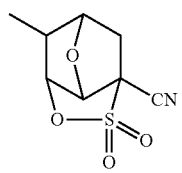

(3-1-31) 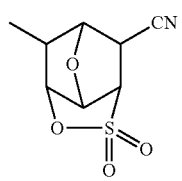

(3-1-32) 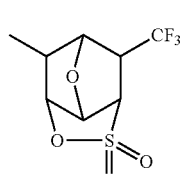

(3-1-33) 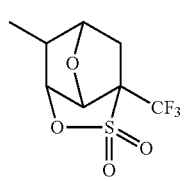

(3-2-1) 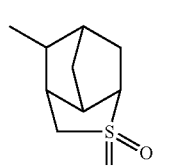

(3-2-2) 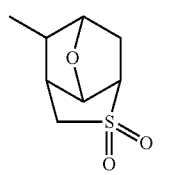

(3-3-1) 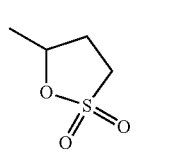

(3-4-1) 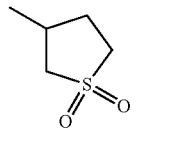

As the —SO$_2$-containing cyclic group, among those shown above, a group represented by the above formula (3-1) is preferred, and at least one selected from the group consisting of the groups represented by any of the aforementioned formulae (3-1-1), (3-1-18), (3-3-1) and (3-4-1) is more preferred, and a group represented by the aforementioned formula (3-1-1) is most preferred.

(Lactone-Containing Cyclic Group)

The "lactone-containing cyclic group" refers to a cyclic group containing a ring (lactone ring) including —O—C(=O)— in the ring skeleton thereof. Considering the lactone ring as the first ring, a group having that lactone ring alone is called a monocyclic group, and a group further having another ring structure is called a polycyclic group regardless of its structure. The lactone-containing cyclic group may be a monocyclic group, or may be a polycyclic group.

There is no particular limitation on the lactone cyclic group in the constituent unit (b-3), and any cyclic group can be used. Specifically, examples of the lactone-containing monocyclic groups include a group in which one hydrogen atom is removed from 4 to 6 membered ring lactone, for example, a group in which one hydrogen atom is removed from β-propiono lactone, a group in which one hydrogen atom is removed from γ-butyrolactone, a group in which one hydrogen atom is removed from δ-valerolactone and the like. Further, lactone-containing polycyclic groups include a group in which one hydrogen atom is removed from bicycloalkane, tricycloalkane and tetracycloalkane having a lactone ring.

As to the constituent unit (b-3), as long as the constituent unit (b-3) has an —SO$_2$-containing cyclic group or a lactone-containing cyclic group, the structures of other parts are not particularly limited. A preferred constituent unit (b-3) is at least one constituent unit selected from the group consisting of a constituent unit (b-3-S) derived from an acrylic acid ester including an —SO2-containing cyclic group in which a hydrogen atom attached to the carbon atom in the a position may be substituted with a substituent; and a constituent unit (b-3-L) derived from an acrylic acid ester including a lactone-containing cyclic group in which the hydrogen atom attached to the carbon atom in the a position may be substituted with a substituent.

[Constituent Unit (b-3-S)]

More specifically, examples of the constituent unit (b-3-S) include one represented by the following formula (b-S1).

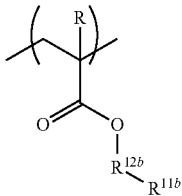

(b-S1)

(In the formula, R represents a hydrogen atom, an alkyl group having 1 or more 5 or less carbon atoms or a halogenated alkyl group having 1 or more 5 or less carbon atoms; and $R^{11b}$ represents an —SO$_2$-containing cyclic group; and $R^{12b}$ represents a single-bond or divalent linking group.)

In the formula (b-S1), R is similarly defined as above. $R^{11b}$ is similarly defined as in the —SO$_2$-containing cyclic group described above. $R^{12b}$ may be either a single-bond linking group or a divalent linking group.

There is no particular limitation on the divalent linking group in $R^{12b}$, and suitable groups include an optionally substituted divalent hydrocarbon group, a divalent linking group including a heteroatom, and the like.

Optionally Substituted Divalent Hydrocarbon Group

The hydrocarbon group as a divalent linking group may be an aliphatic hydrocarbon group, or may be an aromatic hydrocarbon group. The aliphatic hydrocarbon group means a hydrocarbon group without aromaticity. The above aliphatic hydrocarbon group may be saturated or may be unsaturated. Usually, a saturated hydrocarbon group is preferred. More specifically, examples of the above aliphatic hydrocarbon group include a linear or branched aliphatic hydrocarbon group, an aliphatic hydrocarbon group including a ring in the structure thereof and the like.

The number of carbon atoms in the linear or branched aliphatic hydrocarbon group is preferably 1 or more and 10 or less, more preferably 1 or more and 8 or less, and even more preferably 1 or more and 5 or less.

As the linear aliphatic hydrocarbon group, a linear alkylene group is preferred. Specific examples include a methylene group [—CH$_2$—], an ethylene group [—(CH$_2$)$_2$—], a trimethylene group [—(CH$_2$)$_3$—], a tetramethylene group [—(CH$_2$)$_4$—], a pentamethylene group [—(CH$_2$)$_5$—] and the like.

As the branched aliphatic hydrocarbon group, a branched alkylene group is preferred. Specific examples include alkyl alkylene groups such as alkyl methylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; alkyl ethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$— and —C(CH$_2$CH$_3$)$_2$—CH$_2$—; alkyl trimethylene groups such as —CH(CH$_3$)CH$_2$CH$_2$— and —CH$_2$CH(CH$_3$)CH$_2$—; alkyl tetramethylene groups such as —CH(CH$_3$)CH$_2$CH$_2$CH$_2$— and —CH$_2$CH(CH$_3$)CH$_2$CH$_2$—; and the like. As an alkyl group in the alkyl alkylene group, a linear alkyl group having 1 or more and 5 or less carbon atoms is preferred.

The above linear or branched aliphatic hydrocarbon group may or may not have a substituent (a group or atom other than a hydrogen atom) which substitutes a hydrogen atom. Examples of the substituent include a fluorine atom, a fluorinated alkyl group having 1 or more and 5 or less carbon atoms substituted with a fluorine atom, an oxo group (=O) and the like.

Examples of the above aliphatic hydrocarbon group including a ring in the structure thereof include a cyclic aliphatic hydrocarbon group optionally including a hetero atom in the ring structure (a group in which two hydrogen atoms are removed from an aliphatic hydrocarbon ring); a group in which the above cyclic aliphatic hydrocarbon group is attached to an end of a linear or branched aliphatic hydrocarbon group; a group in which the above cyclic aliphatic hydrocarbon group is present in a linear or branched aliphatic hydrocarbon group along the chain; and the like. Examples of the above linear or branched aliphatic hydrocarbon group include those similar to the above.

The number of carbon atoms in the cyclic aliphatic hydrocarbon group is preferably 3 or more and 20 or less, and more preferably 3 or more and 12 or less.

The cyclic aliphatic hydrocarbon group may be polycyclic, or may be monocyclic. As the monocyclic aliphatic hydrocarbon group, a group in which two hydrogen atoms are removed from monocycloalkane is preferred. The number of carbon atoms in the above monocycloalkane is preferably 3 or more and 6 or less. Specific examples include cyclopentane, cyclohexane and the like. As the polycyclic aliphatic hydrocarbon group, a group in which two hydrogen atoms are removed from polycycloalkane is preferred. The number of carbon atoms in the above polycycloalkane is preferably 7 or more and 12 or less. Specific examples include adamantane, norbornane, isobornane, tricyclodecane, tetracyclododecane and the like.

The cyclic aliphatic hydrocarbon group may or may not have a substituent which substitutes a hydrogen atom (a group or atom other than a hydrogen atom). Examples of the above substituent include an alkyl group, an alkoxy group, a halogen atom, a halogenated alkyl group, a hydroxyl group, an oxo group (═O) and the like.

For an alkyl group as the above substituent, an alkyl group having 1 or more and 5 or less carbon atoms is preferred, and a methyl group, an ethyl group, a propyl group, an n-butyl group and a tert-butyl group are more preferred.

For an alkoxy group as the above substituent, an alkoxy group having 1 or more and 5 or less carbon atoms is preferred, and a methoxy group, an ethoxy group, an n-propoxy group, an iso-propoxy group, an n-butoxy group and a tert-butoxy group are more preferred, and a methoxy group and an ethoxy group are particularly preferred.

Halogen atoms as the above substituent include a fluorine atom, a chlorine atom, a bromine atom, an iodine atom and the like, and a fluorine atom is preferred.

Halogenated alkyl groups as the above substituent include a group in which a part or all of hydrogen atoms in the aforementioned alkyl group is(are) substituted with the above halogen atom(s).

In the cyclic aliphatic hydrocarbon group, a part of carbon atoms constituting the ring structure thereof may be substituted with —O—, or —S—. As the substituent including the above hetero atom, preferred are —O—, —C(═O)—O, —S—, —S(═O)$_2$— and —S(═O)$_2$—O.

The aromatic hydrocarbon group as the divalent hydrocarbon group is a divalent hydrocarbon group having at least one aromatic ring, and may have a substituent. There is no particular limitation on the aromatic ring as long as it is a cyclic conjugated system having a 4n+2 π electrons, and it may be monocyclic or may be polycyclic. The number of carbon atoms in the aromatic ring is preferably 5 or more and 30 or less, more preferably 5 or more and 20 or less, further more preferably 6 or more and 15 or less, and particularly preferably 6 or more and 12 or less. However, the number of carbon atoms in a substituent shall not be included in the above number of carbon atoms.

Specifically, aromatic rings include aromatic hydrocarbon rings such as benzene, naphthalene, anthracene and phenanthrene; aromatic heterocycles in which a part of the carbon atoms constituting the above aromatic hydrocarbon ring is(are) substituted with hetero atom(s). Hetero atoms in the aromatic heterocycle include an oxygen atom, a sulfur atom, a nitrogen atom and the like. Specifically, aromatic heterocycles include a pyridine ring, a thiophene ring, and the like.

Specific examples of the aromatic hydrocarbon group as a divalent hydrocarbon group include a group in which two hydrogen atoms are removed from the above aromatic hydrocarbon ring or the above aromatic heterocycle (an arylene group or a heteroarylene group); a group in which two hydrogen atoms are removed from an aromatic compound including two or more aromatic rings (for example, biphenyl, fluorene and the like); a group in which one hydrogen atom from a group where one hydrogen atom is removed from the above aromatic hydrocarbon ring or the above aromatic heterocycle (an aryl group or a heteroaryl group) is substituted with an alkylene group (for example, a group in which one hydrogen atom is further removed from an aryl group in an arylalkyl group such as a benzyl group, a phenethyl group, a 1-naphthylmethyl group, a 2-naphthylmethyl group, a 1-naphthylethyl group and a 2-naphthylethyl group); and the like.

The number of carbon atoms in the above alkylene group bonded to an aryl group or a heteroaryl group is preferably 1 or more and 4 or less, more preferably 1 or more and 2 or less, and particularly preferably 1.

In the above aromatic hydrocarbon group, a hydrogen atom of the above aromatic hydrocarbon group may be substituted with a substituent. For example, a hydrogen atom attached to an aromatic ring in the above aromatic hydrocarbon group may be substituted with a substituent. Examples of the substituent include an alkyl group, an alkoxy group, a halogen atom, a halogenated alkyl group, a hydroxyl group, an oxo group (═O) and the like.

For an alkyl group as the above substituent, an alkyl group having 1 or more and 5 or less carbon atoms is preferred, and a methyl group, an ethyl group, an n-propyl group, an n-butyl group and a tert-butyl group are more preferred.

For an alkoxy group as the above substituent, an alkoxy group having 1 or more and 5 or less carbon atoms is preferred, and a methoxy group, an ethoxy group, an n-propoxy group, an iso-propoxy group, an n-butoxy group and a tert-butoxy group are preferred, and a methoxy group and an ethoxy group are more preferred.

Halogen atoms as the above substituent include a fluorine atom, a chlorine atom, a bromine atom, an iodine atom and the like, and a fluorine atom is preferred.

Halogenated alkyl groups as the above substituent include a group in which a part or all of hydrogen atoms in the aforementioned alkyl group is(are) substituted with the above halogen atom(s).

Divalent Linking Group Including Hetero Atom

A hetero atom in the divalent linking group including a hetero atom is an atom other than a carbon atom and a hydrogen atom, and examples thereof include an oxygen atom, a nitrogen atom, a sulfur atom, a halogen atom and the like.

Specific examples of the divalent linking group including a hetero atom include non-hydrocarbon based linking groups such as —O—, —C(═O)—, —C(═O)—O—, —O—C(═O)—O—, —S—, —S(═O)$_2$—, —S(═O)$_2$—O—, —NH—, —NH—C(═O)—, —NH—C(═NH)—, ═N—, and combinations of at least one of these non-hydrocarbon based linking groups and a divalent hydrocarbon group and the like. Examples of the above divalent hydrocarbon group include those similar to the aforementioned divalent hydrocarbon groups optionally having a substituent, and linear or branched aliphatic hydrocarbon groups are preferred.

Among those described above, H in —NH— in —C(═O)—NH—, —NH— and —NH—C(═NH)— may be substituted with a substituent such as an alkyl group or an acyl group, respectively. The number of carbon atoms in the above substituent is preferably 1 or more and 10 or less, more preferably 1 or more and 8 or less, and in particular preferably 1 or more and 5 or less.

As a divalent linking group in $R^{12b}$, a linear or branched alkylene group, a cyclic aliphatic hydrocarbon group, or a divalent linking group including a hetero atom is preferred.

In a case where the divalent linking group in $R^{12b}$ is a linear or branched alkylene group, the number of carbon atoms in the above alkylene group is preferably 1 or more and 10 or less, more preferably 1 or more and 6 or less, in particular preferably 1 or more and 4 or less, and most preferably 1 or more and 3 or less. Specific examples include groups similar to the linear alkylene groups or branched alkylene groups recited as a linear and branched aliphatic hydrocarbon group in the description of the "divalent hydrocarbon group optionally having a substituent" as the aforementioned divalent linking group.

In a case where the divalent linking group in $R^{12b}$ is a cyclic aliphatic hydrocarbon group, examples of the above cyclic aliphatic hydrocarbon group include groups similar to those recited as the "aliphatic hydrocarbon group including a ring in the structure" in the description of the "divalent hydrocarbon group optionally having a substituent" as the aforementioned divalent linking group.

As the above cyclic aliphatic hydrocarbon group, particularly preferred is a group in which two or more hydrogen atoms are removed from cyclopentane, cyclohexane, norbornane, isobornane, adamantane, tricyclodecane or tetracyclododecane.

In a case where the divalent linking group in $R^{12b}$ is a divalent linking group including a hetero atom, groups preferred as the above linking groups include —O—, —C(=O)—O—, —C(=O)—, —O—C(=O)—O—, —C(=O)—NH—, —NH— (H may be substituted with a substituent such as an alkyl group or an acyl group), —S—, —S(=O)$_2$—, —S(=O)$_2$—O— and a group represented by the general formula —$Y^1$—O—$Y^2$—, —[$Y^1$—C(=O)—O]$_{m'}$—$Y^2$— or —$Y^1$—O—C(=O)—$Y^2$— [wherein $Y^1$ and $Y^2$ are divalent hydrocarbon groups each independently, optionally having a substituent, and O represents an oxygen atom, and m' is an integer of 0 or more and 3 or less].

In a case where the divalent linking group in $R^{12b}$ is —NH—, the hydrogen atom in —NH— may be substituted with a substituent such as an alkyl group or an acyl group. The number of carbon atoms in the above substituent (an alkyl group, an acyl group and the like) is preferably 1 or more and 10 or less, more preferably 1 or more and 8 or less, and in particular preferably 1 or more and 5 or less.

$Y^1$ and $Y^2$ in the formula $Y^1$—O—$Y^2$—, —[$Y^1$—C(=O)—O]$_{m'}$—$Y_2$— or —$Y_1$—O—C(=O)—$Y_2$— are divalent hydrocarbon groups each independently, optionally having a substituent. Examples of the above divalent hydrocarbon group include groups similar to the "divalent hydrocarbon group optionally having a substituent" recited in the description of the above divalent linking group.

As $Y^1$, a linear aliphatic hydrocarbon group is preferred, and a linear alkylene group is more preferred, and a linear alkylene group having 1 or more and 5 or less carbon atoms is more preferred, and a methylene group and an ethylene group are particularly preferred.

As $Y^2$, a linear or branched aliphatic hydrocarbon group is preferred, and a methylene group, an ethylene group and an alkylmethylene group are more preferred. The alkyl group in the above alkylmethylene group is preferably a linear alkyl group having 1 or more and 5 or less carbon atoms, more preferably a linear alkyl group having 1 or more and 3 or less carbon atoms, and particularly preferably a methyl group.

In a group represented by the formula —[$Y_1$—C(=O)—O]$_{m'}$, —$Y_2$—, m' is an integer of 0 or more and 3 or less, preferably an integer of 0 or more and 2 or less, more preferably 0 or 1, and particularly preferably 1. In other words, as a group represented by the formula —[$Y^1$—C(=O)—O]$_{m'}$—$Y^2$—, a group represented by the formula —$Y^1$—C(=O)—O—$Y^2$— is particularly preferred. Among these, a group represented by the formula —(CH$_2$)$_{a'}$—C(=O)—O—(CH$_2$)$_{b'}$— is preferred. In the above formula, a' is an integer of 1 or more and 10 or less, preferably an integer of 1 or more and 8 or less, more preferably an integer of 1 or more and 5 or less, even more preferably 1 or 2, and most preferably 1. b' is an integer of 1 or more and 10 or less, preferably an integer of 1 or more and 8 or less, more preferably an integer of 1 or more and 5 or less, even more preferably 1 or 2, and most preferably 1.

With regard to the divalent linking group in $R^{12b}$, an organic group including a combination of at least one non-hydrocarbon group and a divalent hydrocarbon group is preferred as the divalent linking group including a hetero atom. Among these, a linear chain group having an oxygen atom as a hetero atom, for example, a group including an ether bond or an ester bond is preferred, and a group represented by the aforementioned formula —$Y^1$—P—$Y^2$—, —[$Y^1$—C(=O)—O]$_{m'}$—$Y^2$— or —$Y^1$—O—C(=O)—$Y^2$— is more preferred, and a group represented by the aforementioned formula —[$Y^1$—C(=O)—O]$_{m'}$—$Y^2$— or —$Y^1$—O—C(=O)—$Y^2$— is particularly preferred.

As the divalent linking group in $R^{12b}$, a group including an alkylene group or an ester bond (—C(=O)—O—) is preferred.

The above alkylene group is preferably a linear or branched alkylene group. Suitable examples of the above linear aliphatic hydrocarbon group include a methylene group [—CH$_2$—], an ethylene group [—(CH$_2$)$_2$—], a trimethylene group [—(CH$_2$)$_3$—], a tetramethylene group [—(CH$_2$)$_4$—], a pentamethylene group [—(CH$_2$)$_5$—] and the like. Suitable examples of the above branched alkylene group include alkyl alkylene groups such as alkyl methylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; alkyl ethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$— and —C(CH$_2$CH$_3$)$_2$—CH$_2$—; alkyl trimethylene groups such as —CH(CH$_3$)CH$_2$CH$_2$— and —CH$_2$CH(CH$_3$)CH$_2$—; alkyl tetramethylene groups such as —CH(CH$_3$)CH$_2$CH$_2$CH$_2$— and —CH$_2$CH(CH$_3$)CH$_2$CH$_2$—.

As the divalent linking group including an ester bond, particularly preferred is a group represented by the formula: —$R^{13b}$—C(=O)—O— [wherein $R^{13b}$ represents a divalent linking group.]. In other words, the constituent unit (b-3-S) is preferably a constituent unit represented by the following formula (b-S1-1).

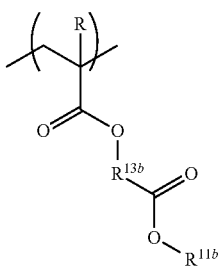

(b-S1-1)

(In the formula, R and $R^{11b}$ are each similar to the above, and $R^{13b}$ represents a divalent linking group.)

There is no particular limitation for $R^{13b}$, examples thereof include groups similar to the aforementioned divalent linking group in $R^{12b}$. As the divalent linking group in $R^{13b}$, a linear or branched alkylene group, an aliphatic hydrocarbon group including a ring in the structure, or a divalent linking group including a hetero atom is preferred, and a linear or branched alkylene group or a divalent linking group including an oxygen atom as a hetero atom is preferred.

As the linear alkylene group, a methylene group or an ethylene group is preferred, and a methylene group is particularly preferred. As the branched alkylene group, an alkylmethylene group or an alkylethylene group is preferred, and —CH(CH$_3$)—, —C(CH$_3$)$_2$— or —C(CH$_3$)$_2$CH$_2$— is particularly preferred.

As the divalent linking group including an oxygen atom, a divalent linking group including an ether bond or an ester bond is preferred, and the aforementioned —Y$^1$—O—Y$^2$—, [Y$^1$—C(=O)—O]$_{m'}$—Y$^2$— or —Y$^1$—O—C(=O)—Y$^2$— is more preferred. Y$^1$ and Y$^2$ are each independently divalent hydrocarbon groups optionally having a substituent, and m' is an integer of 0 or more and 3 or less. Among these, —Y$^1$—O—C(=O)—Y$^2$— is preferred, and a group represented by —(CH$_2$)$_c$—O—C(=O)—(CH$_2$)$_d$— is particularly preferred. c is an integer of 1 or more and 5 or less, and 1 or 2 is preferred. d is an integer of 1 or more and 5 or less, and 1 or 2 is preferred.

As the constituent unit (b-3-S), in particular, one represented by the following formula (b-S1-11) or (b-S1-12) is preferred, and one represented by the formula (b-S1-12) is more preferred.

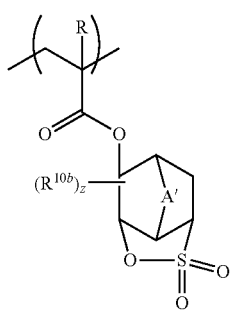
(b-S1-11)

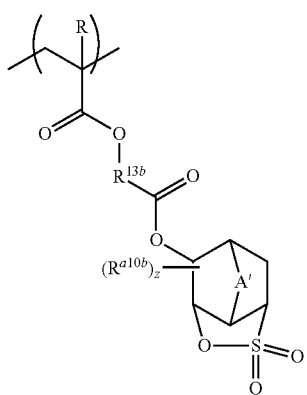
(b-S1-12)

(In the formulae, R, A', R$^{10b}$, z and R$^{13b}$ are each the same as the above.)

In the formula (b-S1-11), A' is preferably a methylene group, an oxygen atom (—O—) or a sulfur atom (—S—).

As R$^{13b}$, preferred is a linear or branched alkylene group or a divalent linking group including an oxygen atom. Examples of the linear or branched alkylene group and the divalent linking group including an oxygen atom in R$^{13b}$ include those similar to the aforementioned linear or branched alkylene group and the aforementioned divalent linking group including an oxygen atom, respectively.

As the constituent unit represented by the formula (b-S1-12), particularly preferred is one represented by the following formula (b-S1-12a) or (b-S1-12b).

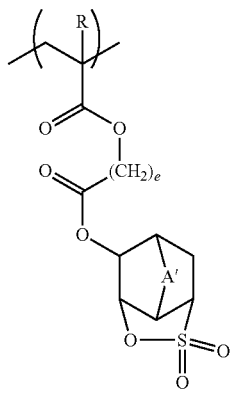
(b-S1-12a)

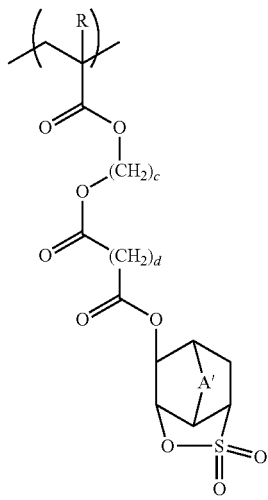
(b-S1-12b)

(In the formulae, R and A' are each the same as the above, and c to e are each independently an integer of 1 or more and 3 or less.)

[Constituent Unit (b-3-L)]

Examples of the constituent unit (b-3-L) include, for example, a constituent unit in which R$^{11b}$ in the aforementioned formula (b-S1) is substituted with a lactone-containing cyclic group. More specifically they include those represented by the following formulae (b-L1) to (b-L5).

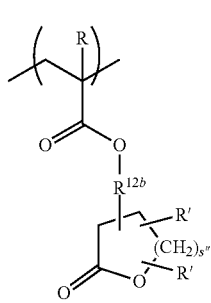
(b-L1)

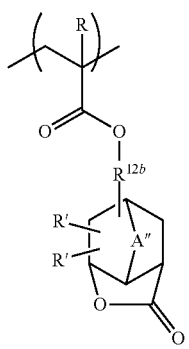
(b-L2)

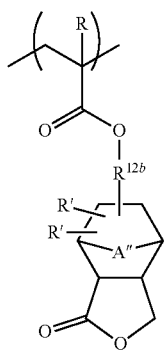
(b-L3)

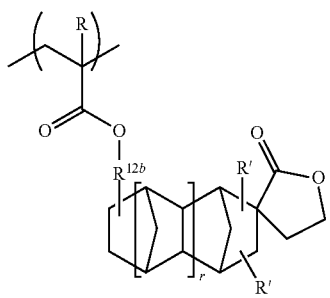
(b-L4)

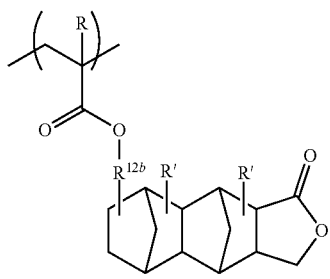
(b-L5)

(In the formulae, R represents a hydrogen atom, an alkyl group having 1 or more and 5 or less carbon atoms or a halogenated alkyl group having 1 or more and 5 or less carbon atoms; R' represents each independently a hydrogen atom, an alkyl group, an alkoxy group, a halogenated alkyl group, a hydroxyl group, —COOR", —OC(=O)R", a hydroxyalkyl group or a cyano group, and R" represents a hydrogen atom or an alkyl group; $R^{12b}$ represents a single bond or divalent linking group, and s" is an integer of 0 or more and 2 or less; A" represents an alkylene group having 1 or more and 5 or less carbon atoms optionally including an oxygen atom or a sulfur atom, an oxygen atom or a sulfur atom; and r is 0 or 1.)

R in the formulae (b-L1) to (b-L5) is the same as the above. Examples of the alkyl group, the alkoxy group, the halogenated alkyl group, —COOR", —OC(=O)R" and the hydroxyalkyl group in R' include groups similar to those described for the alkyl group, the alkoxy group, the halogenated alkyl group, —COOR", —OC(=O)R" and the hydroxyalkyl group recited as a substituent which the —SO$_2$-containing cyclic group may have, respectively.

R' is preferably a hydrogen atom in view of easy industrial availability and the like. The alkyl group in R" may be any of a linear, branched or cyclic chain. In a case where R" is a linear or branched alkyl group, the number of carbon atoms is preferably 1 or more and 10 or less, and more preferably 1 or more and 5 or less. In a case where R" is a cyclic alkyl group, the number of carbon atoms is preferably 3 or more and 15 or less, more preferably 4 or more and 12 or less, and most preferably 5 or more and 10 or less. Specific examples include a group in which one or more hydrogen atoms are removed from monocycloalkane and polycycloalkane such as bicycloalkane, tricycloalkane, tetracycloalkane and the like optionally substituted with a fluorine atom or a fluorinated alkyl group. Specific examples include a group in which one or more hydrogen atoms are removed from monocycloalkane such as cyclopentane and cyclohexane; and polycycloalkane such as adamantane, norbornane, isobornane, tricyclodecane and tetracyclododecane; and the like. Examples of A" include groups similar to A' in the aforementioned formula (3-1). A" is preferably an alkylene group having 1 to 5 carbon atoms, an oxygen atom (—O—) or a sulfur atom (—S—), more preferably an alkylene group having 1 or more and 5 or less carbon atoms or —O—. As the alkylene group having 1 or more and 5 or less carbon atoms, a methylene group or a dimethylmethylene group is more preferred, and a methylene group is most preferred.

$R^{12b}$ is similar to $R^{12b}$ in the aforementioned formula (b-S1). In the formula (b-L1), s" is preferably 1 or 2. Below, specific examples of the constituent units represented by the aforementioned formulae (b-L1) to (b-L3) will be illustrated. In each of the following formulae, Ra represents a hydrogen atom, a methyl group or a trifluoromethyl group.

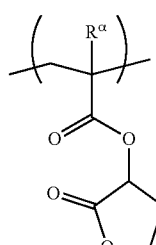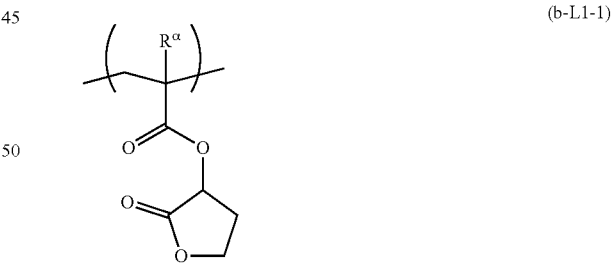
(b-L1-1)

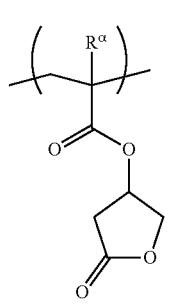
(b-L1-2)

(b-L1-3)
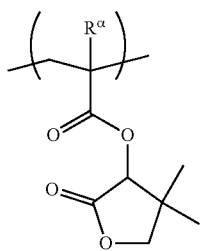
(b-L1-4)
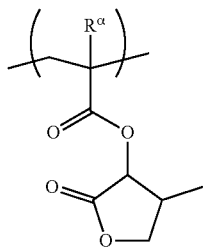
(b-L1-5)
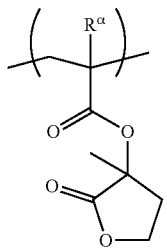
(b-L1-6)
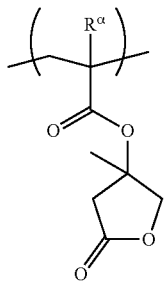
(b-L1-7)
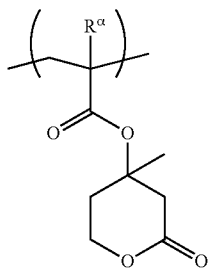
(b-L1-8)
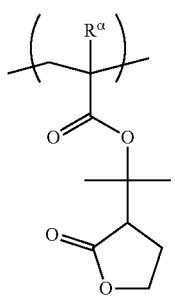
(b-L1-9)
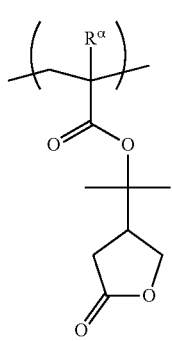
(b-L1-10)
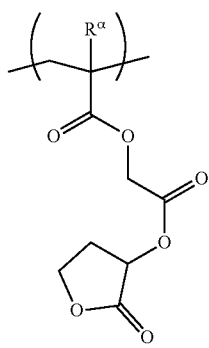
(b-L1-11)
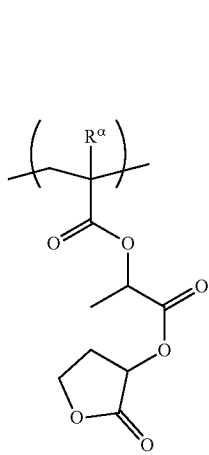
(b-L1-12)
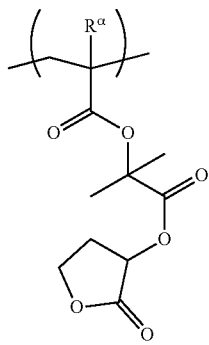

-continued
(b-L1-13)
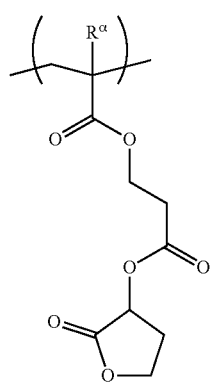
(b-L2-1)
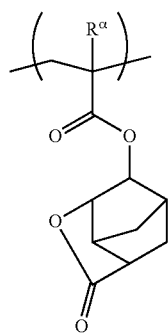
(b-L2-2)
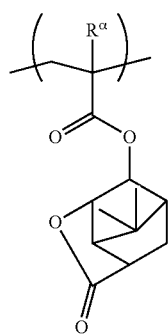
(b-L2-3)
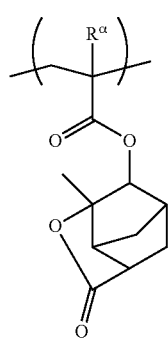
(b-L2-4)
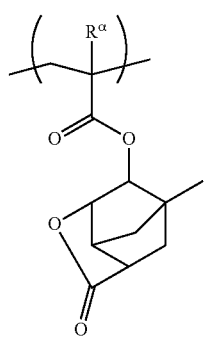
(b-L2-5)
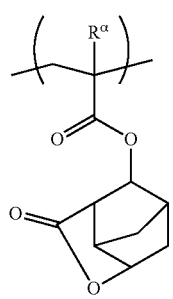
(b-L2-6)
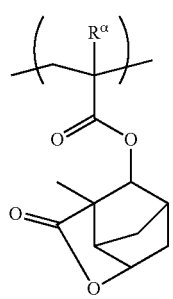
(b-L2-7)
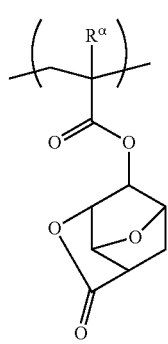
(b-L2-8)
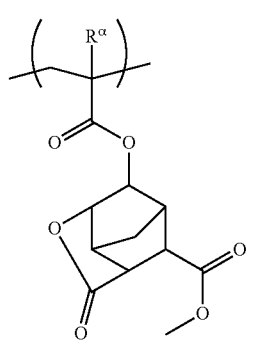

(b-L2-9)
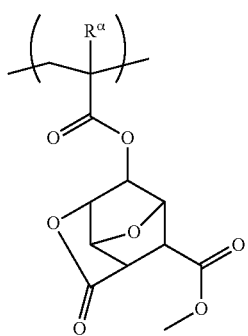
(b-L2-10)
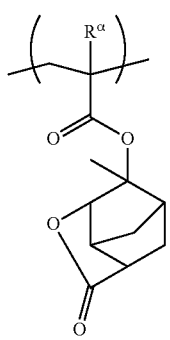
(b-L2-11)
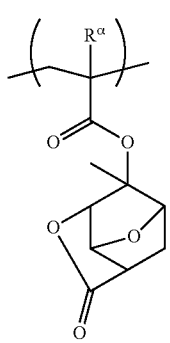
(b-L2-12)
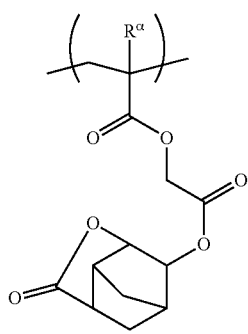
(b-L2-13)
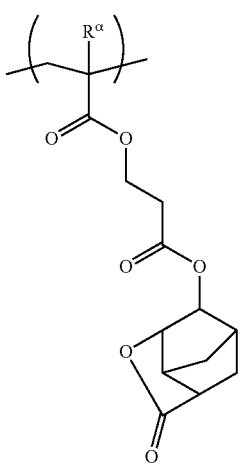
(b-L2-14)
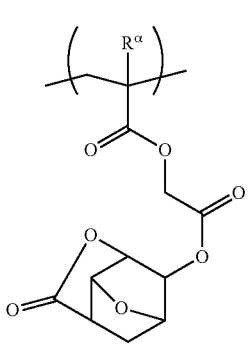
(b-L2-15)
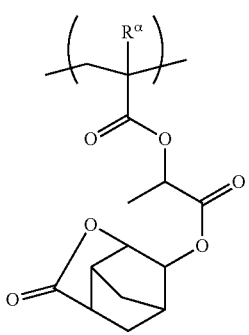
(b-L2-16)
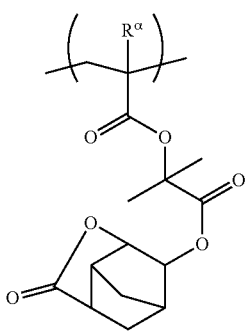

(b-L2-17)

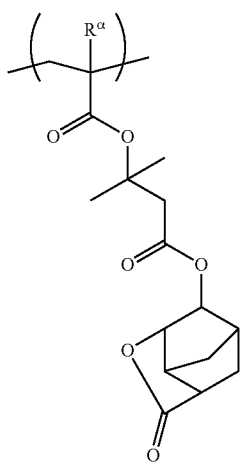

(b-L3-1)

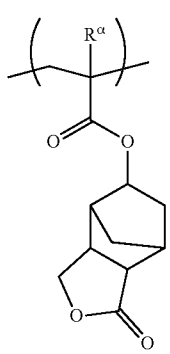

(b-L3-2)

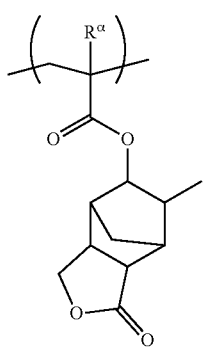

(b-L3-3)

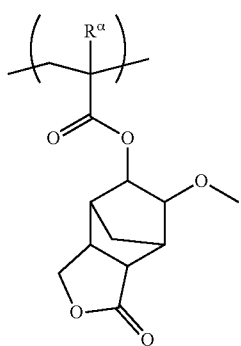

(b-L3-4)

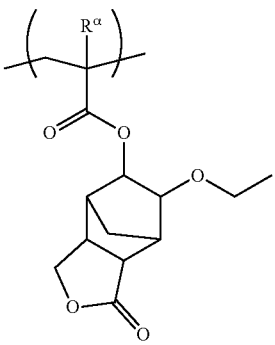

(b-L3-5)

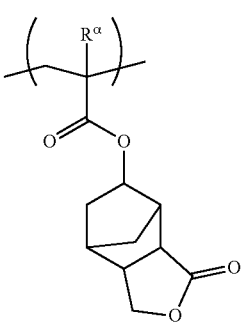

As the constituent unit (b-3α-L), at least one selected from the group consisting of the constituent units represented by the aforementioned formulae (b-L1) to (b-L5) is preferred, and at least one selected from the group consisting of the constituent units represented by the formulae (b-L1) to (b-L3) is more preferred, and at least one selected from the group consisting of the constituent units represented by the aforementioned formula (b-L1) or (b-L3) is particularly preferred. Among these, at least one selected from the group consisting of the constituent units represented by the aforementioned formulae (b-L1-1), (b-L1-2), (b-L2-1), (b-L2-7), (b-L2-12), (b-L2-14), (b-L3-1) and (b-L3-5) is preferred.

Further, as the constituent unit (b-3-L), the constituent units represented by following formulae (b-L6) to (b-L7) are also preferred.

(b-L6)

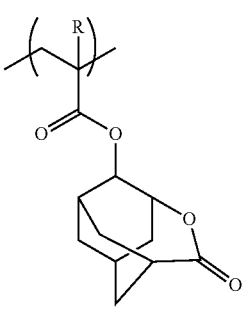

(b-L7)

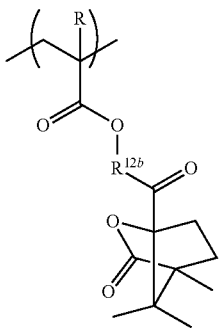

R and $R^{12b}$ in the formulae (b-L6) and (b-L7) are the same as the above.

Further, the acrylic resin (B3) includes constituent units represented by the following formulae (b5) to (b7), having an acid dissociable group, as constituent units that enhance the solubility of the acrylic resin (B3) in alkali under the action of acid.

(b5)

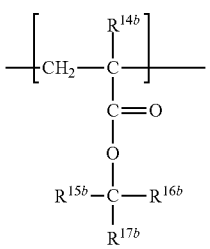

(b6)

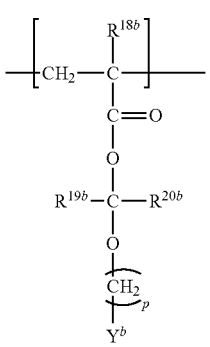

(b7)

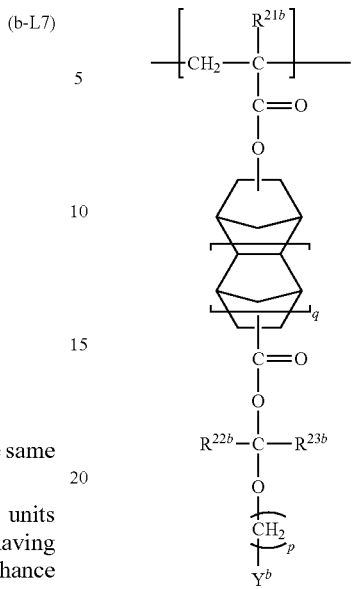

In the above formulae (b5) to (b7), $R^{14b}$ and $R^{18b}$ to $R^{23b}$ each independently represent a hydrogen atom, a linear or branched alkyl group having 1 or more and 6 or less carbon atoms, a fluorine atom, or a linear or branched fluorinated alkyl group having 1 or more and 6 or less carbon atoms; $R^{15b}$ to $R^{17b}$ each independently represent a linear or branched alkyl group having 1 or more and 6 or less carbon atoms, a linear or branched fluorinated alkyl group having 1 or more and 6 or less carbon atoms, or an aliphatic cyclic group having 5 or more and 20 or less carbon atoms, and each independently represent a linear or branched alkyl group having 1 or more and 6 or less carbon atoms, or a linear or branched fluorinated alkyl group having 1 or more and 6 or less carbon atoms; and $R^{16b}$ and $R^{17b}$ may be bonded to each other to form a hydrocarbon ring having 5 or more and 20 or less carbon atoms together with the carbon atom to which both the groups are bonded; Yb represents an optionally substituted aliphatic group or alkyl group; p is an integer of 0 or more and 4 or less; and q is 0 or 1.

Note here that examples of the linear or branched alkyl group include a methyl group, ethyl group, propyl group, isopropyl group, n-butyl group, isobutyl group, tert-butyl group, pentyl group, isopentyl group, neopentyl group, and the like. Furthermore, the fluorinated alkyl group refers to the abovementioned alkyl groups of which the hydrogen atoms are partially or entirely substituted with fluorine atoms. Specific examples of aliphatic cyclic groups include groups obtained by removing one or more hydrogen atoms from monocycloalkanes or polycycloalkanes such as bicycloalkanes, tricycloalkanes, and tetracycloalkanes. Specifically, groups obtained by removing one hydrogen atom from a monocycloalkane such as cyclopentane, cyclohexane, cycloheptane, or cyclooctane, or a polycycloalkane such as adamantane, norbornane, isobornane, tricyclodecane, or tetracyclododecane may be mentioned. In particular, groups obtained by removing one hydrogen atom from cyclohexane or adamantane (which may further be substituted) are preferred.

When $R^{16b}$ and $R^{17b}$ do not combine with each other to form a hydrocarbon ring, the above $R^{15b}$, $R^{16b}$, and Rim represent preferably a linear or branched alkyl group having 1 or more and 4 or less carbon atoms, and more preferably a linear or branched alkyl group having 2 or more and 4 or less carbon atoms, for example, from the viewpoints of a high contrast and preferable resolution and depth of focus. The above $R^{19b}$, $R^{20b}$, $R^{22b}$ and $R^{23b}$ preferably represent a hydrogen atom or a methyl group.

The above $R^{16b}$ and $R^{17b}$ may form an aliphatic cyclic group having 5 or more and 20 or less carbon atoms together with a carbon atom to which the both are attached. Specific examples of such an alicyclic group are the groups of monocycloalkanes and polycycloalkanes such as bicycloalkanes, tricycloalkanes and tetracycloalkanes from which one or more hydrogen atoms are removed. Specific examples thereof are the groups of monocycloalkanes such as cyclopentane, cyclohexane, cycloheptane and cyclooctane and polycycloalkanes such as adamantane, norbornane, isobornane, tricyclodecane and tetracyclododecane from which one or more hydrogen atoms are removed. Particularly preferable are the groups of cyclohexane and adamantane from which one or more hydrogen atoms are removed (that may further have a substituent).

Further, in a case where an aliphatic cyclic group to be formed with the above $R^{16b}$ and $R^{17b}$ has a substituent on the ring skeleton thereof, examples of the substituent include a polar group such as a hydroxyl group, a carboxyl group, a cyano group and an oxygen atom (=O), and a linear or branched alkyl group having 1 or more and 4 or less carbon atoms. As the polar group, an oxygen atom (=O) is particularly preferred.

The above $Y^b$ is an alicyclic group or an alkyl group; and examples thereof are the groups of monocycloalkanes and polycycloalkanes such as bicycloalkanes, tricycloalkanes and tetracycloalkanes from which one or more hydrogen atoms are removed. Specific examples thereof are the groups of monocycloalkanes such as cyclopentane, cyclohexane, cycloheptane and cyclooctane, and polycycloalkanes such as adamantane, norbornane, isobornane, tricyclodecane and tetracyclododecane from which one or more hydrogen atoms are removed. Particularly preferable is the group of adamantane from which one or more hydrogen atoms are removed (that may further have a substituent).

When the alicyclic group of the above $Y^b$ has a substituent on the ring skeleton, the substituent is exemplified by polar groups such as a hydroxyl group, carboxyl group, cyano group and oxygen atom (=O), and linear or branched alkyl groups having 1 or more and 4 or less carbon atoms. The polar group is preferably an oxygen atom (=O) in particular.

When $Y^b$ is an alkyl group, it is preferably a linear or branched alkyl group having 1 or more and 20 or less carbon atoms, and more preferably 6 or more and 15 or less carbon atoms. The alkyl group is an alkoxyalkyl group particularly preferable. Examples of such an alkoxyalkyl group include a 1-methoxyethyl group, 1-ethoxyethyl group, 1-n-propoxyethyl group, 1-isopropoxyethyl group, 1-n-butoxyethyl group, 1-isobutoxyethyl group, 1-tert-butoxyethyl group, 1-methoxypropyl group, 1-ethoxypropyl group, 1-methoxy-1-methylethyl group, 1-ethoxy-1-methylethyl group, and the like.

Preferable specific examples of the constituent unit represented by the above formula (b5) include those represented by the following formulae (b5-1) to (b5-33).

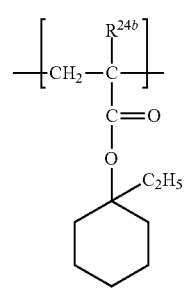

(b5-1)

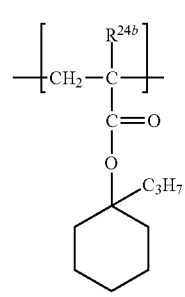

(b5-2)

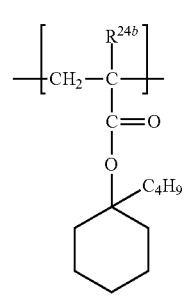

(b5-3)

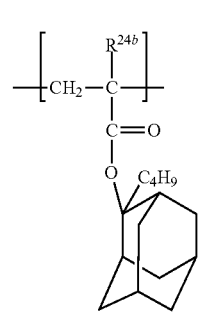

(b5-4)

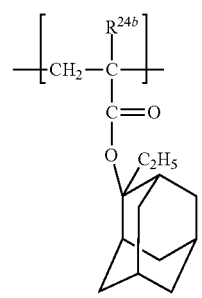

(b5-5)

(b5-6) 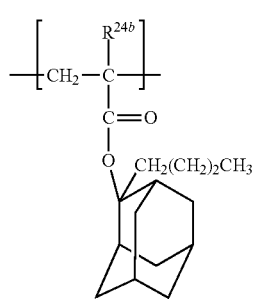
(b5-7) 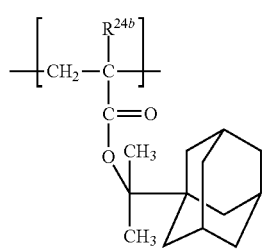
(b5-8) 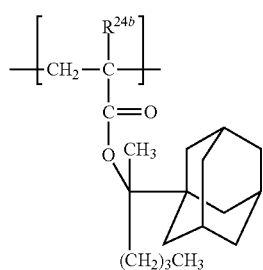
(b5-9) 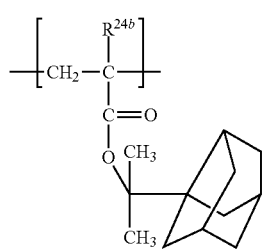
(b5-10) 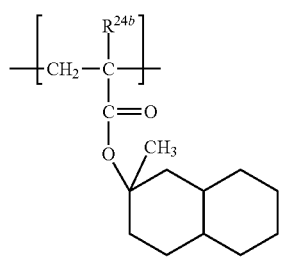
(b5-11) 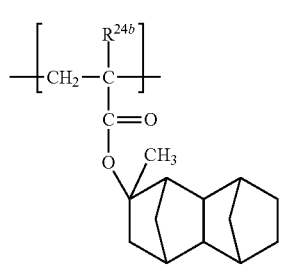
(b5-12) 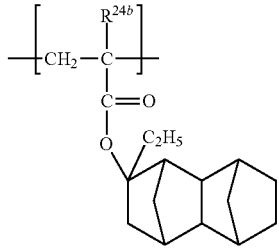
(b5-13) 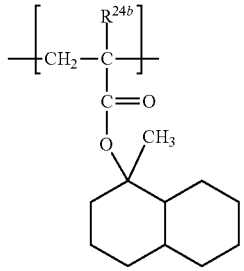
(b5-14) 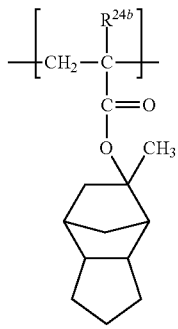
(b5-15) 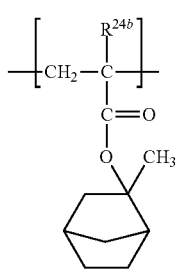
(b5-16) 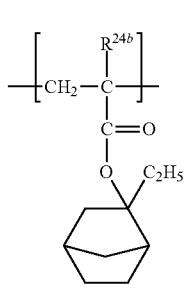

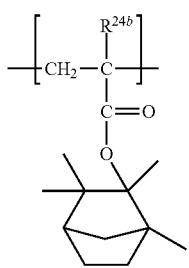 (b5-17)
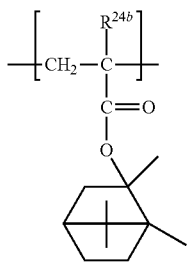 (b5-18)
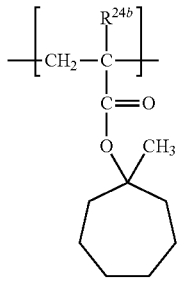 (b5-19)
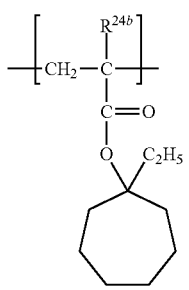 (b5-20)
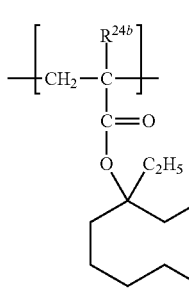 (b5-21)
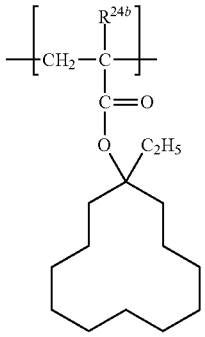 (b5-22)
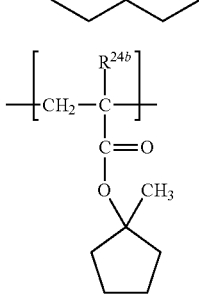 (b5-23)
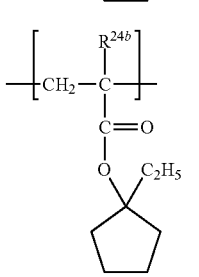 (b5-24)
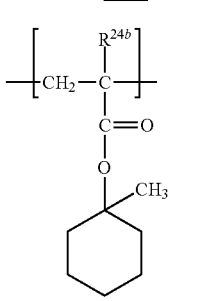 (b5-25)
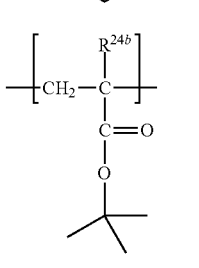 (b5-26)
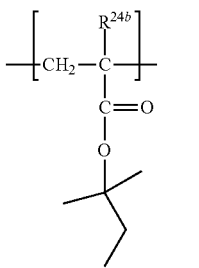 (b5-27)

(b5-28) 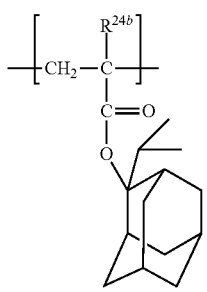
(b5-29) 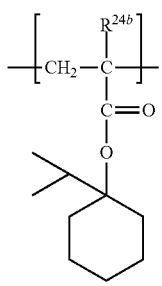
(b5-30) 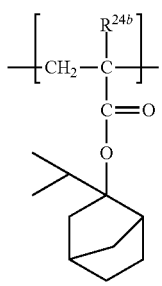
(b5-31) 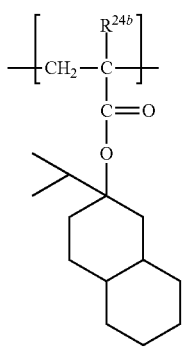
(b5-32) 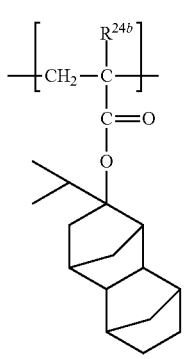
(b5-33) 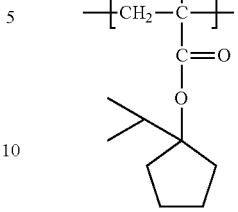
In the above formulae (b5-1) to (b5-33), $R^{24b}$ represents a hydrogen atom or a methyl group.
Preferable specific examples of the constituent unit represented by the above formula (b6) include those represented by the following formulae (b6-1) to (b6-26).
(b6-1) 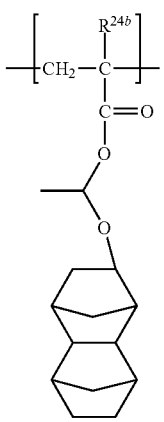
(b6-2) 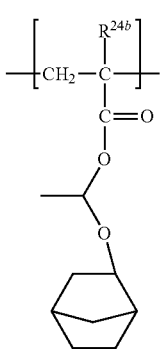
(b6-3) 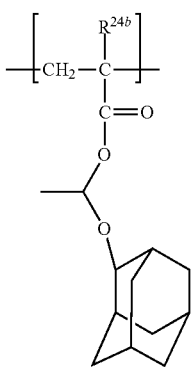

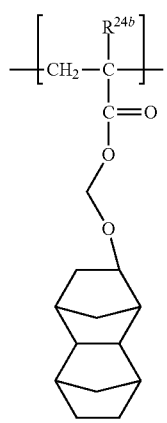 (b6-4)
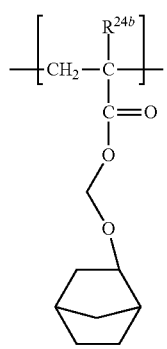 (b6-5)
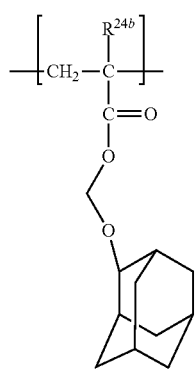 (b6-6)
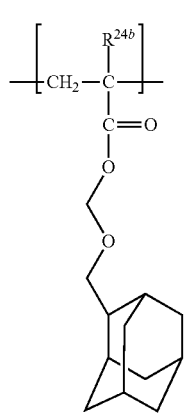 (b6-7)
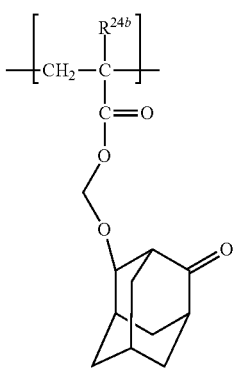 (b6-8)
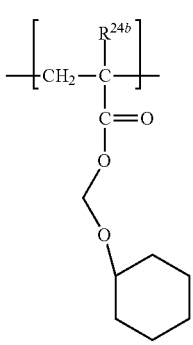 (b6-9)
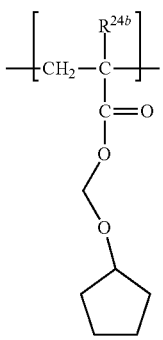 (b6-10)
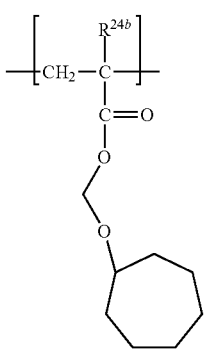 (b6-11)

(b6-12)
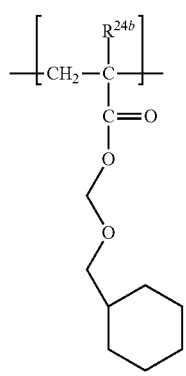
(b6-13)
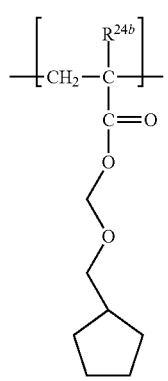
(b6-14)
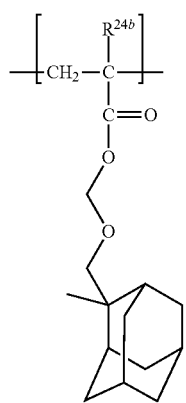
(b6-15)
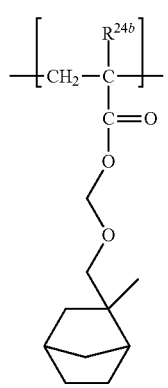
(b6-16)
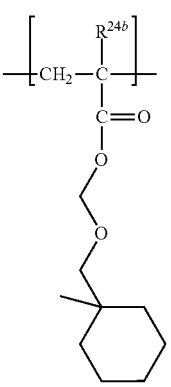
(b6-17)
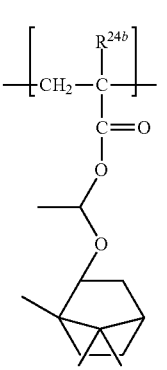
(b6-18)
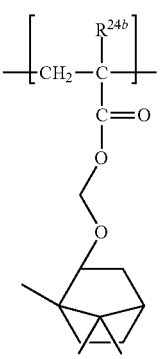
(b6-19)
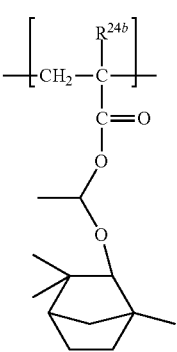

(b6-20)
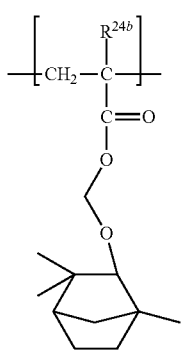
(b6-21)
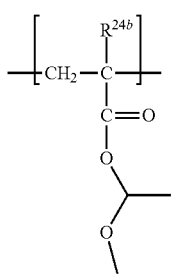
(b6-22)
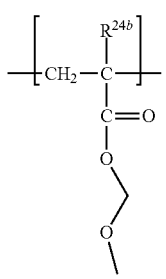
(b6-23)
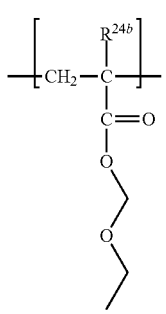
(b6-24)
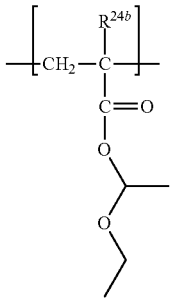
(b6-25)
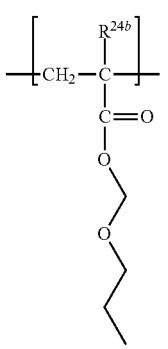
(b6-26)
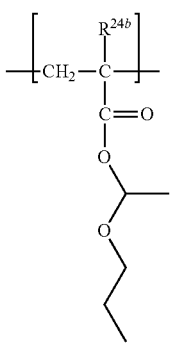
In the above formulae (b6-1) to (b6-26), $R^{24b}$ represents a hydrogen atom or a methyl group.
Preferable specific examples of the constituent unit represented by the above formula (b7) include those represented by the following formulae (b7-1) to (b7-15).
(b7-1)
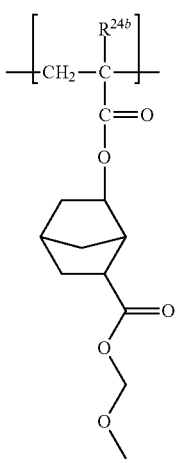

(b7-2)
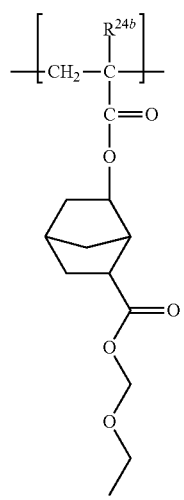
(b7-3)
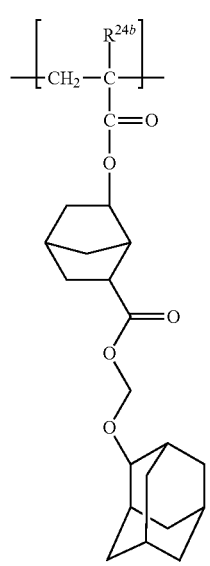
(b7-4)
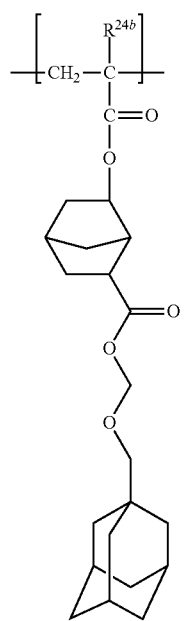
(b7-5)
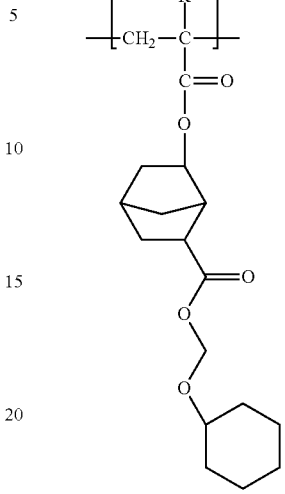
(b7-6)
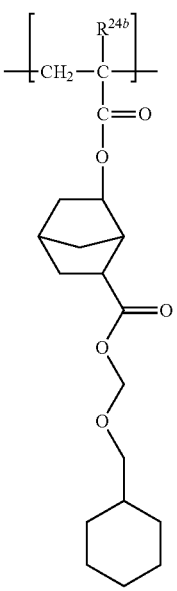

(b7-7)
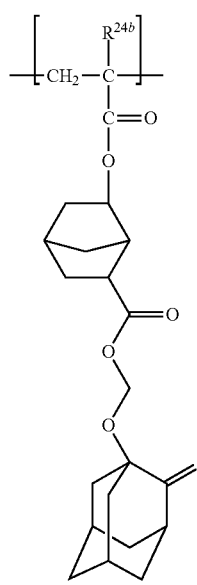
(b7-8)
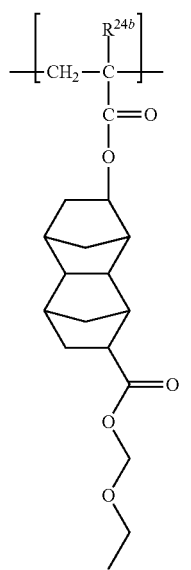
(b7-9)
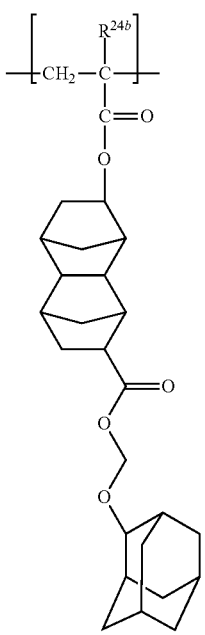
(b7-10)
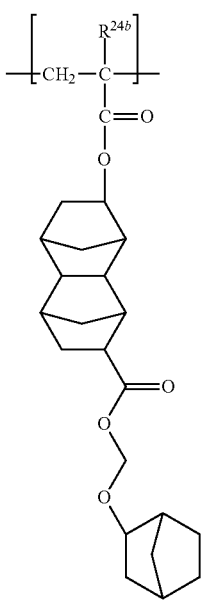

(b7-11)
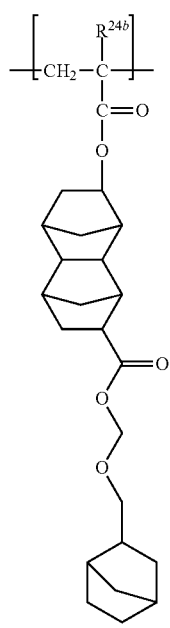
(b7-12)
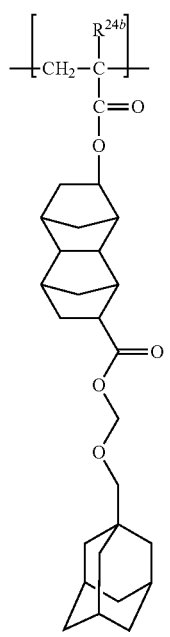
(b7-13)
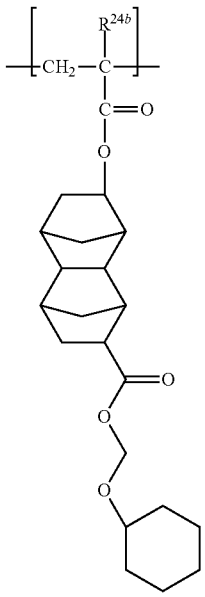
(b7-14)
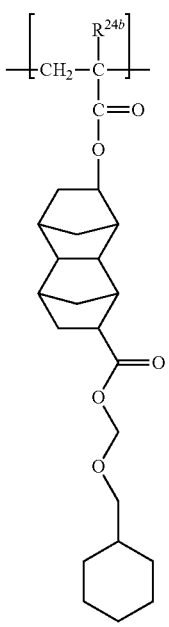

-continued (b7-15)

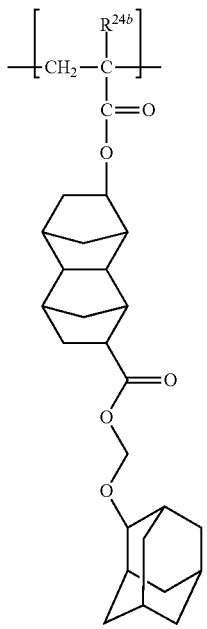

In the above formulae (b7-1) to (b7-15), $R^{24b}$ represents a hydrogen atom or a methyl group.

Among the constituent units represented by the formulae (b5) to (b7) described above, those represented by the formula (b6) are preferred in that they can be easily synthesized and relatively easily sensitized. Further, among the constituent units represented by the formula (b6), those in which $Y^b$ is an alkyl group are preferred, and those in which one or both of $R^{19b}$ and $R^{20b}$ are alkyl groups are preferred.

Further, the acrylic resin (B3) is preferably a resin including a copolymer including a constituent unit derived from a polymerizable compound having an ether bond together with a constituent unit represented by the above formulae (b5) to (b7).

Illustrative examples of the polymerizable compound having an ether bond include radical polymerizable compounds such as (meth)acrylic acid derivatives having an ether bond and an ester bond, and specific examples thereof include 2-methoxyethyl (meth)acrylate, 2-ethoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolyethylene glycol (meth)acrylate, methoxypolypropylene glycol (meth)acrylate, tetrahydrofurfuryl (meth)acrylate, and the like. Also, the above polymerizable compound having an ether bond is preferably, 2-methoxyethyl (meth)acrylate, 2-ethoxyethyl(meth)acrylate, or methoxytriethylene glycol (meth)acrylate. These polymerizable compounds may be used alone, or in combinations of two or more thereof.

Furthermore, the acrylic resin (B3) may include another polymerizable compound as a constituent unit in order to moderately control physical or chemical properties. The polymerizable compound is exemplified by conventional radical polymerizable compounds and anion polymerizable compounds.

Examples of the polymerizable compound include monocarboxylic acids such as acrylic acid, methacrylic acid and crotonic acid; dicarboxylic acids such as maleic acid, fumaric acid and itaconic acid; methacrylic acid derivatives having a carboxyl group and an ester bond such as 2-methacryloyloxyethyl succinic acid, 2-methacryloyloxyethyl maleic acid, 2-methacryloyloxyethyl phthalic acid, and 2-methacryloyloxyethyl hexahydrophthalic acid; (meth)acrylic acid alkyl esters such as methyl(meth)acrylate, ethyl (meth)acrylate, butyl(meth)acrylate and cyclohexyl(meth)acrylate; (meth)acrylic acid hydroxyalkyl esters such as 2-hydroxyethyl (meth)acrylate and 2-hydroxypropyl (meth)acrylate; (meth)acrylic acid aryl esters such as phenyl (meth)acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; amide bond-containing polymerizable compounds such as acrylamide and methacrylamide; and the like.

As described above, the acrylic resin (B3) may include a constituent unit derived from a polymerizable compound having a carboxy group such as the above monocarboxylic acids and dicarboxylic acids. However, it is preferable that the acrylic resin (B3) does not substantially include a constituent unit derived from a polymerizable compound having a carboxyl group, since a patterned resist film including a nonresist portion having a more preferable rectangular sectional shape can easily be formed. Specifically, the proportion of a constituent unit derived from a polymerizable compound having a carboxyl group in the acrylic resin (B3) is preferably 20% by mass or less, more preferably 15% by mass or less, and particularly preferably 10% by mass or less. In acrylic resin (B3), acrylic resin including a relatively large amount of constituent unit derived from a polymerizable compound having a carboxy group is preferably used in combination with an acrylic resin that includes only a small amount of constituent unit derived from a polymerizable compound having a carboxy group or does not include this constituent unit.

Furthermore, examples of the polymerizable compound include (meth)acrylic acid esters having a non-acid-dissociable aliphatic polycyclic group, and vinyl group-containing aromatic compounds and the like. As the non-acid-dissociable aliphatic polycyclic group, particularly, a tricyclodecanyl group, an adamantyl group, a tetracyclododecanyl group, an isobornyl group, a norbornyl group, and the like are preferred in view of easy industrial availability and the like. These aliphatic polycyclic groups may have a linear or branched alkyl group having 1 or more and 5 or less carbon atoms as a substituent.

Specific examples of the (meth)acrylic acid esters having a non-acid-dissociable aliphatic polycyclic group include those having structures represented by the following formulae (b8-1) to (b8-5).

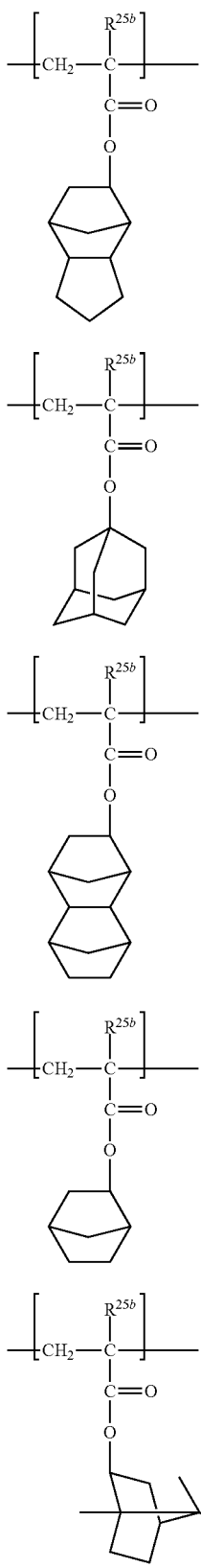

In the formulae (b8-1) to (b8-5), $R^{25b}$ represents a hydrogen atom or a methyl group.

When the acrylic resin (B3) includes the constituent unit (b-3) including a —SO$_2$-containing cyclic group or a lactone-containing cyclic group, the content of the constituent unit (b-3) in the acrylic resin (B3) is preferably 5% by mass or more, more preferably 10% by mass or more, and particularly preferably 10% by mass or more and 50% by mass or less, and most preferably 10% by mass or more and 30% by mass or less. In a case where the photosensitive composition includes the constituent unit (b-3) having the above-mentioned range of amount, both good developing property and a good pattern shape can be easily achieved simultaneously.

Further, in the acrylic resin (B3), a constituent unit represented by the aforementioned formulae (b5) to (b7) is preferably included in an amount of 5% by mass or more, more preferably 10% by mass or more, and particularly preferably 10% by mass or more and 50% by mass or less.

The acrylic resin (B3) preferably includes the above constituent unit derived from a polymerizable compound having an ether bond. The content of the constituent unit derived from a polymerizable compound having an ether bond in the acrylic resin (B3) is preferably 0% by mass or more and 50% by mass or less, more preferably 5% by mass or more and 40% by mass or less, and further more preferably 5% by mass or more and 30% by mass or less.

The acrylic resin (B3) preferably includes the above constituent unit derived from (meth)acrylic acid esters having a non-acid-dissociable aliphatic polycyclic group. The content of the constituent unit derived from (meth)acrylic acid esters having a non-acid-dissociable aliphatic polycyclic group in the acrylic resin (B3) is preferably 0% by mass or more and 60% by mass or less, more preferably 5% by mass or more and 50% by mass or less, and further more preferably 5% by mass or more and 30% by mass or less.

In the point of being superior in the balance of resolution, developability and plating solution resistance of the formed resist film as the above explained acrylic resin (B3), resins containing constituent units derived from hydroxystyrene, and/or constituent units derived from styrene, and constituent units represented by the aforementioned Formulas (b5) to (b7) are also preferable. In this case, in the acrylic resin (B3), the total for the content of the constituent units derived from hydroxystyrene and/or constituent units derived from styrene and the content of constituent units represented by the aforementioned Formulas (b5) to (b7) is preferably at least 80% by mass relative to the mass of acrylic resin (B3), more preferably at least 90% by mass, and most preferably 100% by mass. From the point of balance between the developability, dimensional precision and plating solution resistance of the resist film formed using a photosensitive composition, in the acrylic resin (B3) including the constituent units derived from hydroxystyrene, and/or constituent units derived from styrene, and constituent units represented by the Formulas (b5) to (b7), the content of the constituent units derived from hydroxystyrene, and/or constituent units derived from styrene is preferably 40% by mass to 90% by mass, more preferably 50% by mass to 90% by mass, and even more preferably 60% by mass to 90% by mass, relative to the mass of acrylic acid (B3). In the viewpoint of a developability improvement of the photosensitive composition, in the acrylic resin (B3) including the constituent units derived from hydroxystyrene, and/or constituent units derived from styrene, and constituent units represented by the Formulas (b5) to (b7), the content of the constituent units derived from hydroxystyrene is preferably 40% by mass to 70% by mass, and more preferably 50% by mass to 70% by mass relative to the mass of acrylic resin (B3). In addition, from the viewpoint of developability of the photosensitive composition and resolution, in the acrylic resin (B3) including the constituent units derived from hydroxystyrene, and/or constituent units derived from styrene, and constituent units represented by the Formulas (b5) to (b7), the content of constituent units represented by the Formulas (b5) to (b7) is preferably 10% by mass to 50% by mass, more preferably 10% by mass to 40% by mass, and even more preferably 10% by mass to 30% by mass, relative to the mass of acrylic resin (B3).

As long as the photosensitive composition contains a predetermined amount of the acrylic resin (B3), an acrylic resin other than the acrylic resin (B3) described above can also be used as the resin (B). There is no particular limitation for such an acrylic resin other than the acrylic resin (B3) as long as it includes a constituent unit represented by the aforementioned formulae (b5) to (b7).

The weight-average molecular weight of the resin (B) described above in terms of polystyrene is preferably 10000 or more and 600000 or less, more preferably 20000 or more and 400000 or less, and even more preferably 30000 or more and 300000 or less. A weight-average molecular weight within these ranges allows a photosensitive layer made of a photosensitive composition to maintain sufficient strength without reducing detachability from a substrate, and can further prevent a swelled profile and crack generation when plating.

It is also preferred that the resin (B) has a dispersivity of 1.05 or more. Dispersivity herein indicates a value of a weight average molecular weight divided by a number average molecular weight. A dispersivity in the range described above can avoid problems with respect to stress resistance on intended plating or possible swelling of metal layers resulting from the plating process.

The content of the resin (B) is preferably 5% by mass or more and 60% by mass or less with respect to the total mass of the photosensitive composition. Furthermore, the content of the resin (B) is preferably 5% by mass or more and 98% by mass or less, and more preferably 10% by mass or more and 95% by mass or less with respect to the total solid mass of the photosensitive composition.

<Compound (C1), and Precursor Compound (C2) Thereof>

The photosensitive composition contains the compound (C1) and the precursor compound (C2) thereof. The compound (C1) exhibits at least 3000 as the molar absorption coefficient ε at the wavelength of 365 nm. From the point of tending to obtain a desired effect from the use of the compound (C1), the molar absorption coefficient ε at the wavelength of 365 nm of the compound (C1) is preferably at least 4000, and more preferably at least 5000. The upper limit for the molar absorption coefficient ε at the wavelength of 365 nm is not particularly limited; however, for example, it may be no more than 20,000, or may be no more than 15,000. Measurement by a UV-Vis spectrophotometer is performed using a solution obtained by dissolving a compound of the measurement target in γ-butyrolactone so as to be 0.05% by mass concentration, and the molar absorption coefficient ε an be calculated from these measurement results.

In addition, the compound (C1) has a metal coordination group. The metal coordination group may be various groups known to coordinate with a metal. As suitable examples of the metal coordination group, a sulfur-containing group such as a mercapto group (—SH), thiocarboxy group (—CO—SH), dithiocarboxy group (—CS—SH) and thiocarbonyl group (—CS—); amino group, cyano group, carboxy group, phosphonic acid group and metal coordinating silyl group can be exemplified. Among these metal coordination groups, a mercapto group is preferable from the point of the compound (C1) tending to preferably coordinate to the metal, and tending to obtain the desired results. In the case of the photosensitive composition containing the acid generator (A), a mercapto group is preferable as the metal coordination group, also in the point of hardly deactivating the acid generated by the acid generator (A), and tending to easily form a patterned resist film having a preferable cross-sectional shape.

The precursor compound (C2) is a compound which can produce the compound (C1) during formation of a patterned resist film using the photosensitive composition. The precursor compound (C2) is not particularly limited so long as being a compound which satisfies the above-mentioned conditions. The precursor compound (C2) is typically a compound for which the coordinating property to metal is lost or declines, by a metal coordination group possessed by the above-mentioned compound (C1) being protected by a protecting group. In the case of the photosensitive composition being coated on a metal surface, it is preferable for the precursor compound (C2) to rapidly generate the compound (C1) by action of the metal present at the metal surface, heating during film formation, etc.

In the case of coating the photosensitive composition on a metal surface, the compound (C1) included in the photosensitive composition, or generated by the precursor compound (C2) in the photosensitive composition coordinates to the metal surface. Although the detailed reason is unclear, the compound (C1) coordinated to the metal surface in the coating film consisting of the photosensitive composition causes the variation in dimension of the patterned resist film caused by film thickness difference in the resist film to decline.

As a preferred example of the compound (C1), the compounds represented by the Formula (C1-1) below can be exemplified.

$$\text{Ar—Y}^3\text{—Y}^2\text{—Y}^1\text{—SH} \qquad (C1\text{-}1)$$

(In the Formula (C1-1), $Y^1$ is a single bond or an alkylene group having 1 or more and 5 or less carbon atoms, $Y^2$ is —CO—O— or —O—CO—, $Y^3$ is a single bond or an alkylene group having 1 or more and 5 or less carbon atoms, and Ar is an aromatic group which may have a substituent.)

As the alkylene group as $Y^1$ or $Y^3$ in the Formula (C1-1), a methylene group, ethane-1,2-diyl group, ethane-1,1-diyl group, propane-1,3-diyl group, propane-1,2-diyl group, propane-1,1-dyl group, propane-2,2-diyl group, n-butane-1,4-diyl group, and n-pentane-1,5-diyl group can be exemplified. Among these groups, a methylene group, ethane-1,2-diyl group, ethane-1,1-diyl group, propane-1,3-diyl group and propane-1,2-diyl group are preferable, a methylene group, ethane-1,2-diyl group, propane-1,3-diyl group and propane-1,2-diyl group are more preferable, and a methylene group and ethane-1,2-diyl group are even more preferable.

Ar in the Formula (C1) is an aromatic group. This aromatic group may be an aromatic hydrocarbon group, or may be an aromatic heterocyclic group. For the sensitivity of the photosensitive composition, the aromatic hydrocarbon group is preferable. As suitable examples of the aromatic hydrocarbon group as Ar, a phenyl group, naphthalene-1-yl group, naphthalene-2-yl group, 4-phenylphenyl group, 3-phenylphenyl group and 2-phenylphenyl group can be exemplified.

The substituents which may be possessed by the aromatic group as Ar are not particularly limited so long as the compound (C1) satisfies the aforementioned predetermined requirements. As examples of suitable substituents, an alkyl group having 1 or more and 5 or less carbon atoms, an alkoxy group having 1 or more and 5 or less carbon atoms, an aliphatic acyl group having 2 or more and 5 or less carbon atoms, an aliphatic acyloxy group having 2 or more and 5 or less carbon atoms, a halogenated alkyl group having 1 or more and 5 or less carbon atoms, a halogenated alkoxy group having 1 or more and 5 or less carbon atoms, an alkylthio group having 1 or more and 5 or less carbon atoms, an aliphatic acylthio group having 2 or more and 5 or less carbon atoms, halogen atom, cyano group, nitro group, amino group, methylamino group, ethylamino group, dimethylamino group and diethylamino group can be exemplified.

The number of substituents possessed by the aromatic group as Ar is not particularly limited within a range not inhibiting the object of the present invention. The number of substituents in the aromatic group having substituents typically is preferably 1 or more and 8 or less, and more preferably 1 or more and 5 or less.

In the point of tending to obtain the photosensitive composition exerting the desired effect, a substituted phenyl group is preferable as Ar, a phenyl group substituted by at least one group selected from an alkoxy group having 1 or more and 5 or less carbon atoms and a nitro group is more preferable, and a phenyl group substituted by an alkoxy group having 1 or more and 5 or less carbon atoms and a nitro group is even more preferable.

As preferred specific examples of Ar, a 2-methoxyphenyl group, 3-methoxyphenyl group, 4-methoxyphenyl group, 2,3-dimethoxyphenyl group, 2,4-dimethoxyphenyl group, 2,5-dimethoxyphenyl group, 2,6-dimethoxyphenyl group, 3,4-dimethoxyphenyl group, 3,5-dimethoxyphenyl group, 2-nitro-3-methoxyphenyl group, 2-nitro-4-methoxyphenyl group, 2-nitro-5-methoxyphenyl group, 2-nitro-6-methoxyphenyl group, 2-methoxy-3-nitrophenyl group, 3-nitro-4-methoxyphenyl group, 3-nitro-5-methoxyphenyl group, 3-nitro-6-methoxyphenyl group, 2-methoxy-4-nitrophenyl group, 3-methoxy-4-nitrophenyl group, 2-nitro-3,4-dimethoxyphenyl group, 2-nitro-3,5-dimethoxyphenyl group, 2-nitro-3,6-dimethoxyphenyl group, 2-nitro-4,5-dimethoxyphenyl group, 2-nitro-4,6-dimethoxyphenyl group, 2-nitro-5,6-dimethoxyphenyl group, 2,4-dimethoxy-3-nitrophenyl group, 2,5-dimethoxy-3-nitrophenyl group, 2,6-dimethoxy-3-nitrophenyl group, 3-nitro-4,5-dimethoxyphenyl group, 3-nitro-4,6-dimethoxyphenyl group, 3-nitro-5,6-dimethoxyphenyl group, 2,3-dimethoxy-4-nitrophenyl group, 2,5-dimethoxy-4-nitrophenyl group and 2,6-dimethoxy-4-nitrophenyl group can be exemplified. Among these, a 2-nitro-3,4-dimethoxyphenyl group, 2-nitro-3,5-dimethoxyphenyl group, 2-nitro-3,6-dimethoxyphenyl group, 2-nitro-4,5-dimethoxyphenyl group, 2-nitro-4,6-dimethoxyphenyl group and 2-nitro-5,6-dimethoxyphenyl group are preferable, and a 2-nitro-4,5-dimethoxyphenyl group is more preferable.

As suitable specific examples of the compound represented by the Formula (C1-1), the following compounds can be exemplified.

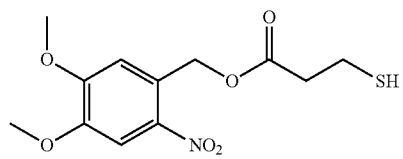

-continued

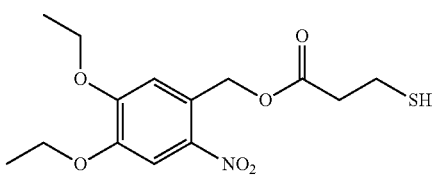

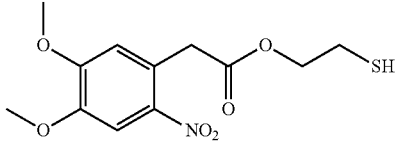

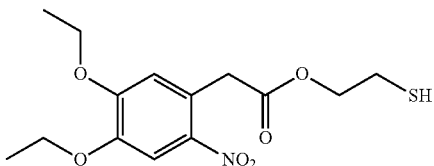

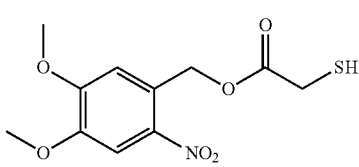

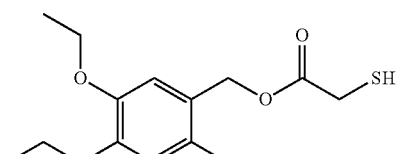

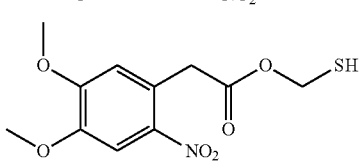

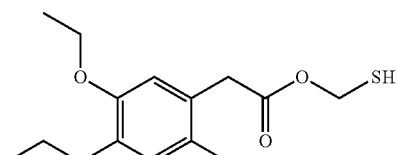

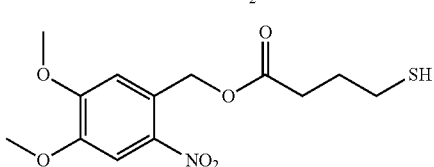

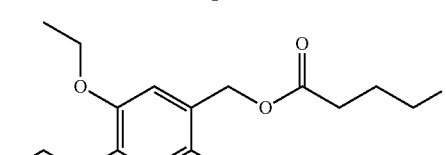

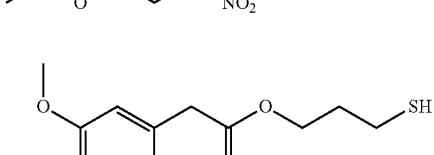

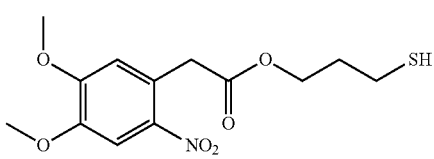

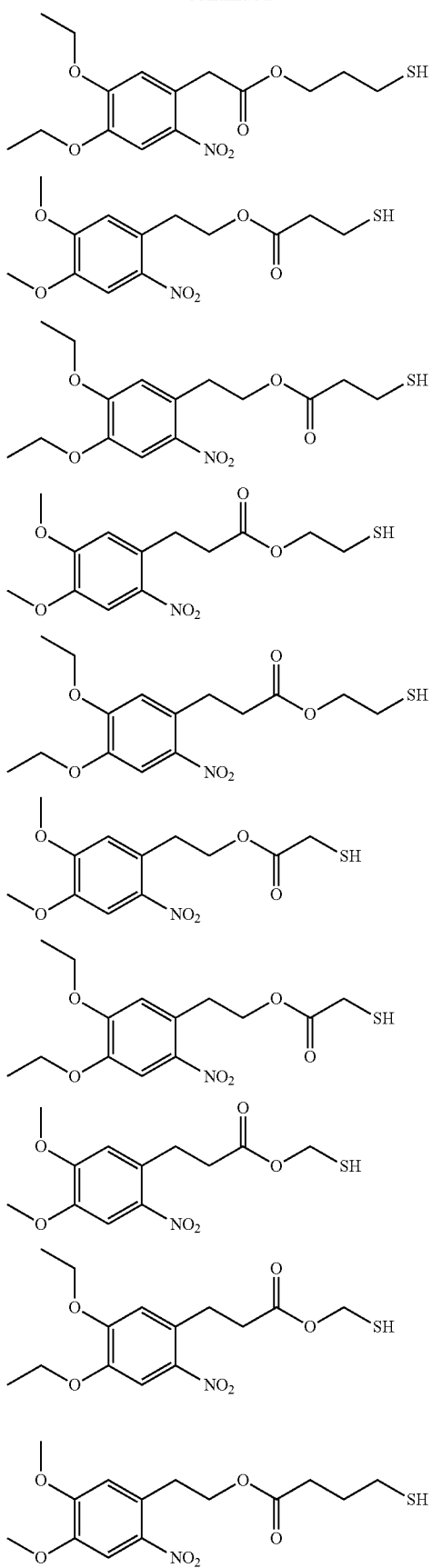

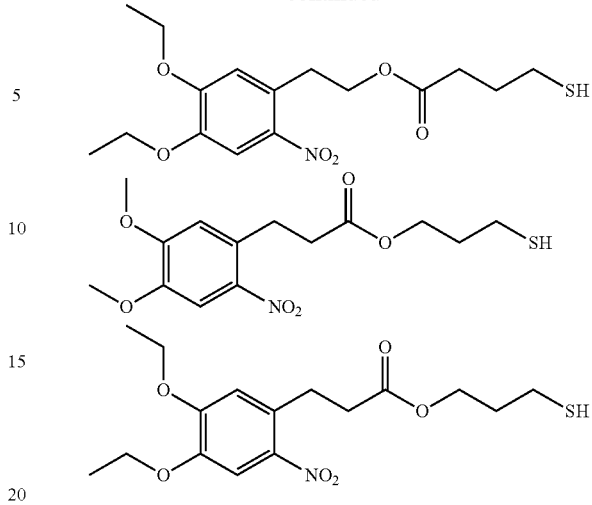

The production method of the compound represented by the Formula (C1-1) is not particularly limited. The compound represented by the Formula (C1-1) is preferably produced by a method including a reduction step of reducing the compound represented by the Formula (C2-1) described later to generate the compound represented by the Formula (C1-1). In other words, the compound represented by the Formula (C1-1) is produced by cleaving the disulfide bond possessed by the compound represented by the Formula (2-1) described below, by way of a reducing agent. As the reducing agent, for example, it is possible to use sodium borohydride, sulfites, glutathione, 2-mercaptoethanol, dithiothreitol, dithioerythritol, etc. The usage amount of the reducing agent is not particularly limited, and is appropriately adjusted to an amount of an extent where undesired side reactions do not occur, while preferably cleaving the disulfide bond. The reduction reaction using the above-mentioned reducing agent normally carries out under the presence of a solvent. The solvent is not particularly limited so long as being inert in the reduction reaction. As specific examples of the solvent, dichloromethane, toluene, xylene, hexane, cyclohexane, ethyl acetate, butyl acetate, acetone, methylethyl ketone, methylisobutyl ketone, cyclohexanone, etc. can be exemplified. The temperature at which carrying out the reduction reaction is not particularly limited so long as undesired side reactions do not occur excessively. The reaction temperature, for example, is −20° C. to 150° C., preferably 0° C. to 100° C., and more preferably 10° C. to 80° C.

As a preferred example of the compound (C-2), a compound represented by the Formula (C2-1) below, which is a disulfide compound which can be derived from the compound represented by the above Formula (C1-1) can be exemplified.

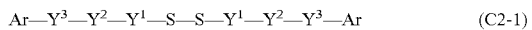

$$Ar-Y^3-Y^2-Y^1-S-S-Y^1-Y^2-Y^3-Ar \quad (C2\text{-}1)$$

(In the Formula (C2-1), $Y^1$ is a single bond or an alkylene group having 1 or more and 5 or less carbon atoms, $Y^2$ is —CO—O— or —O—CO—, $Y^3$ is a single bond or an alkylene group having 1 or more and 5 or less carbon atoms, and Ar is an aromatic group which may have a substituent.)

$Y^1$, $Y^2$, $Y^3$ and Ar in the Formula (C2-1) are similar to the Formula (1). Suitable specific examples of $Y^1$, $Y^2$, $Y^3$ and Ar in the Formula (C2-1) are similar to the suitable specific examples of these in the Formula (C1-1). The structure of the compound represented by the Formula (C2-1) may be symmetrical about the disulfide bond, may be asymmetrical, and is preferably symmetrical.

The production method of the compound represented by the Formula (C2-1) is not particularly limited. As a preferred production method, a production method can be exemplified which includes a condensation step of condensing the compound represented by the Formula (C2-1a) below and the compound represented by the Formula (C2-1b) below, or condenses the compound represented by the Formula (C2-1c) below and the compound represented by the Formula (C2-1d) below.

Ar—Y³—OH (C2-1a)

Y⁴—CO—Y¹—S—S—Y¹—CO—Y⁴ (C2-1b)

Ar—Y³—CO—Y⁴ (C2-1c)

HO—Y¹—S—S—Y¹—OH (C2-1d)

($Y^1$, $Y^2$, $Y^3$ and Ar in the Formula (C2-1a), Formula (C2-1b), Formula (C2-1c) and Formula (C2-1d) are similar to those in the Formula (C2-1), and $Y^4$ is a hydroxyl group or halogen atom.)

In the case of condensation between the compound represented by the Formula (C2-1a) and the compound represented by the Formula (C2-1b), and condensation between the compound represented by the Formula (C2-1c) and the compound represented by the Formula (C2-1d) being condensation reactions between a carboxy group and hydroxyl group, the method thereof is not particularly limited. As a suitable method, a method which allows the carboxy group and hydroxyl group to condense by action of a condensation agent such as a carbodiimide compound under the presence of a catalyst such as N,N-dimethyl-4-aminopyridine can be exemplified. In addition, in the case of condensation between the compound represented by the Formula (C2-1a) and the compound represented by the Formula (C2-1b), and condensation between the compound represented by the Formula (C2-1c) and the compound represented by the Formula (C2-1d) being condensation reactions between a halocarbonyl group and hydroxyl group, such condensation reactions easily progress by either mixing the compound represented by the Formula (C2-1a) and the compound represented by the Formula (C2-1b), or mixing the compound represented by the Formula (C2-1c) and the compound represented by the Formula (C2-1d).

The above-mentioned condensation reaction is performed under the presence of solvent generally. The type of solvent is not particularly limited so long as being an inert solvent which will not react with the Formula (C2-1a), Formula (C2-1b), Formula (C2-1c) and Formula (C2-1d). As specific examples of the solvent, dichloromethane, toluene, xylene, hexane, cyclohexane, ethyl acetate, butyl acetate, acetone, methylethyl ketone, methylisobutyl ketone, cyclohexanone, etc. can be exemplified. The temperature at which carrying out the condensation reaction is not particularly limited so long as undesired side reactions do not occur excessively. The reaction temperature, for example, is −40° C. to 150° C., preferably −30° C. to 100° C., and more preferably −20° C. to 50° C.

As preferred specific examples of the compound represented by the Formula (C2-1), disulfide compounds which can be derived by disulfiding the mercapto compound mentioned above as preferred specific examples of the compound represented by the Formula (C1-1) can be exemplified.

As preferred examples of the compound (C1) other than the compound represented by the Formula (C1-1) explained above, the below compounds can be exemplified. It should be noted that the molar absorption coefficient ε at a wavelength of 365 nm of compounds of a known structure can be estimated by calculating the electronically excited state by the time-dependent density functional theory (TDDFT method). More specifically, by performing the aforementioned calculation using Gaussian (registered trademark) as software, it is possible to easily select a compound which can be used as the compound (C1) by selecting a candidate compound for the compound (C1) by predicting the molar absorption coefficient ε at a wavelength of 365 nm by way of the aforementioned method, and then measuring the molar absorption coefficient ε of this candidate compound.

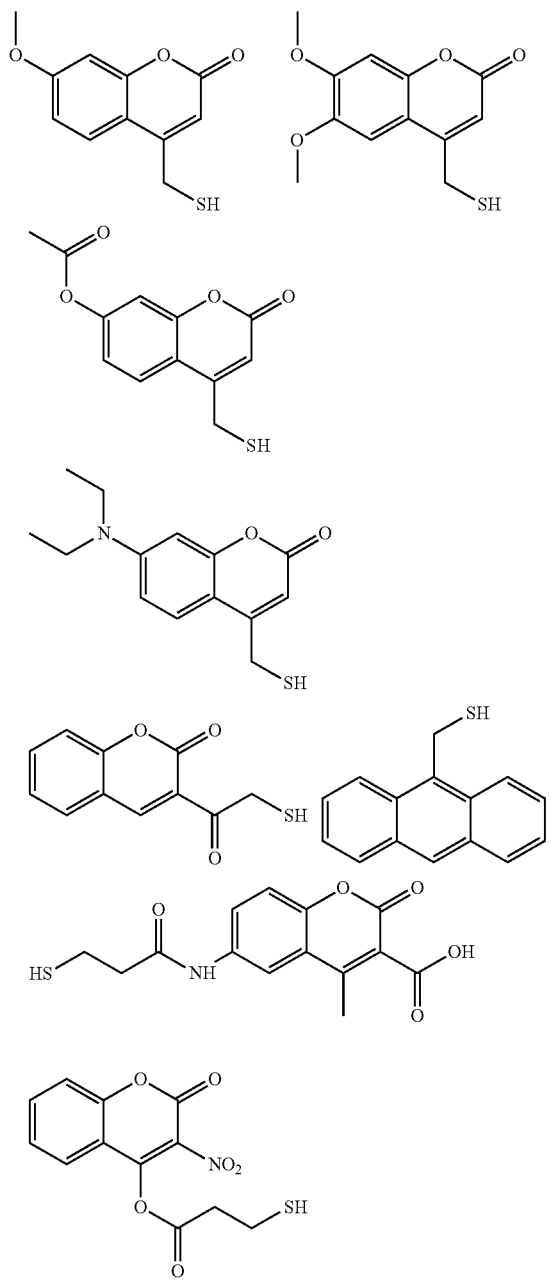

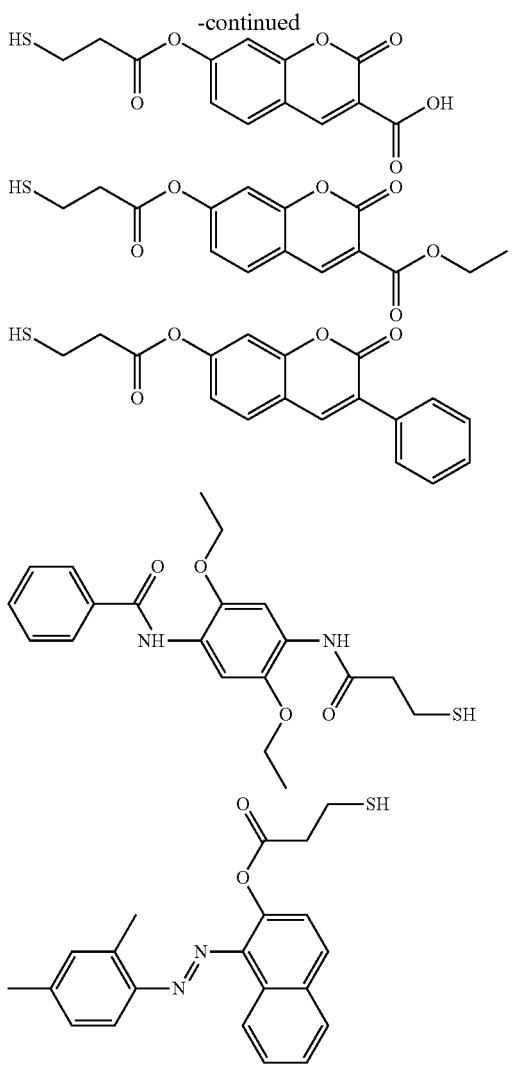

The usage amount of the compound (C1) and/or the precursor compound (C2) is not particularly limited in a range not inhibiting the object of the present invention. In the case of forming a patterned resist film on a metal surface, since the variation in patterned resist film caused by a film thickness difference in the resist film tends to be suppressed, the usage amount of the compound (C1) and/or precursor compound (C2) in the photosensitive composition is preferably 0.01 parts by mass to 5.0 parts by mass, more preferably 0.1 parts by mass to 3.0 parts by mass, and even more preferably 0.3 parts by mass to 0.6 parts by mass, relative to a total of 100 parts by mass of the mass of resin (B) and mass of alkali-soluble resin (D).

<Alkali-Soluble Resin (D)>

It is preferred that the photosensitive composition further contains an alkali-soluble resin (D) in order to improve crack resistance. The alkali-soluble resin as referred to herein may be determined as follows. A solution of the resin having a resin concentration of 20% by mass (solvent: propylene glycol monomethyl ether acetate) is used to form a resin film having a thickness of 1 μm on a substrate, and immersed in an aqueous 2.38% by mass TMAH (tetramethylammonium hydroxide) solution for 1 min. When the resin was dissolved in an amount of 0.01 μm or more, the resin is defined as being alkali soluble. As the alkali-soluble resin (D), at least one selected from the group consisting of novolak resin (D1), polyhydroxystyrene resin (D2), and acrylic resin (D3) are preferable.

[Novolak Resin (D1)]

A novolak resin is prepared by addition condensation of, for example, aromatic compounds having a phenolic hydroxyl group (hereinafter, merely referred to as "phenols") and aldehydes in the presence of an acid catalyst.

Examples of the above phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethyl phenol, 3,4,5-trimethyl phenol, p-phenylphenol, resorcinol, hydroquinone, hydroquinone monomethyl ether, pyrogallol, phloroglycinol, hydroxydiphenyl, bisphenol A, gallic acid, gallic acid ester, α-naphthol, β-naphthol, and the like. Examples of the above aldehydes include formaldehyde, furfural, benzaldehyde, nitrobenzaldehyde, acetaldehyde, and the like. The catalyst used in the addition condensation reaction is not particularly limited, and examples thereof include hydrochloric acid, nitric acid, sulfuric acid, formic acid, oxalic acid, acetic acid, etc., for acid catalyst.

The flexibility of the novolak resins can be enhanced more when o-cresol is used, a hydrogen atom of a hydroxyl group in the resins is substituted with other substituents, or bulky aldehydes are used.

The mass average molecular weight of novolak resin (D1) is not particularly limited as long as the purpose of the present invention is not impaired, but the weight average molecular weight is preferably 1,000 or more and 50,000 or less.

[Polyhydroxystyrene Resin (D2)]

The hydroxystyrene compound to constitute the polyhydroxystyrene resin (D2) is exemplified by p-hydroxystyrene, α-methylhydroxystyrene, α-ethylhydroxystyrene, and the like. Furthermore, the polyhydroxystyrene resin (D2) is preferably prepared to give a copolymer with a styrene resin. Examples of the styrene compound to constitute such a styrene resin include styrene, chlorostyrene, chloromethylstyrene, vinyltoluene, α-methylstyrene, and the like.

The mass average molecular weight of the polyhydroxystyrene resin (D2) is not particularly limited as long as the purpose of the present invention is not impaired, but the weight average molecular weight is preferably 1,000 or more and 50,000 or less.

[Acrylic Resin (D3)]

It is preferable that the acrylic resin (D3) includes a constituent unit derived from a polymerizable compound having an ether bond and a constituent unit derived from a polymerizable compound having a carboxyl group.

Examples of the above polymerizable compound having an ether bond include (meth)acrylic acid derivatives having an ether bond and an ester bond such as 2-methoxyethyl (meth)acrylate, methoxytriethylene glycol(meth)acrylate, 3-methoxybutyl (meth)acrylate, ethylcarbitol(meth)acrylate, phenoxypolyethylene glycol(meth)acrylate, methoxypolypropylene glycol(meth)acrylate, tetrahydrofurfuryl (meth)acrylate, and the like. The above polymerizable compound having an ether bond is preferably, 2-methoxyethyl acrylate, and methoxytriethylene glycol acrylate. These polymerizable compounds may be used alone, or in combinations of two or more.

Examples of the above polymerizable compound having a carboxy group include monocarboxylic acids such as acrylic acid, methacrylic acid and crotonic acid; dicarboxylic acids such as maleic acid, fumaric acid and itaconic acid; compounds having a carboxy group and an ester bond such as 2-methacryloyloxyethyl succinic acid, 2-methacryloyloxyethyl maleic acid, 2-methacryloyloxyethyl phthalic acid, 2-methacryloyloxyethyl hexahydrophthalic acid and the like. The above polymerizable compound having a carboxy group is preferably, acrylic acid and methacrylic acid. These polymerizable compounds may be used alone, or in combinations of two or more thereof.

The weight average molecular weight of the acrylic resin (D3) is not particularly limited as long as the purpose of the present invention is not impaired, but the mass average molecular weight is preferably 50,000 or more and 800,000 or less.

The content of the alkali-soluble resin (D) is such that when the total amount of the above resin (B) and the alkali-soluble resin (D) is taken as 100 parts by mass, the content is preferably 0 parts by mass or more and 80 parts by mass or less, and more preferably 0 parts by mass or more and 60 parts by mass or less. By setting the content of the alkali-soluble resin (D) to the range described above, there is a tendency for resistance to cracking to increase, and film loss at the time of development can be prevented.

<Sulfur-Containing Compound (E)>

In the case of the photosensitive composition being used in pattern formation on a metal substrate, the photosensitive preferably contains a sulfur-containing compound (E). The sulfur-containing compound (E) is a compound not corresponding to the aforementioned compound (C1), and contains sulfur atom which can coordinate to the metal. It should be noted that, for a compound which can produce two or more tautomers, in the case of at least one tautomer containing a sulfur atom which coordinates to a metal constituting the surface of the metal substrate, this compound corresponds to the sulfur-containing compound. In the case of forming a patterned resist film used as a template for plating on the surface consisting of metal such as Cu, defects in the cross-sectional shape such as footing (hemming) may occur. As mentioned above, in the case of using the above-mentioned photosensitive composition, the formation of a patterned resist film having preferable rectangularity of the cross-sectional shape is easy. On the other hand, with the purpose of suppressing defects in the cross-sectional shape more reliably, it is preferable for the photosensitive composition to contain the sulfur-containing compound (E). In the case of the photosensitive composition containing the sulfur-containing compound (E), the occurrence of defects in the cross-sectional shape such as footing tends to be more reliably suppressed, even in a case of forming a patterned resist film on a surface consisting of metal of a substrate.

The sulfur atom that can coordinate with metal is included in a sulfur-containing compound as, for example, a mercapto group (—SH), a thiocarboxy group (—CO—SH), a dithiocarboxy group (—CS—SH), a thiocarbonyl group (—CS—), and the like. From the viewpoint of easiness in coordinating with metal and being excellent in suppressing footing, the sulfur-containing compound preferably includes a mercapto group.

Preferable examples of the sulfur-containing compound having a mercapto group include compounds represented by the following formula (e1).

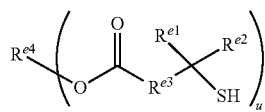

(e1)

(In the formula, $R^{e1}$ and $R^{e2}$ each independently represent a hydrogen atom or an alkyl group, $R^{e3}$ represents a single bond or an alkylene group, $R^{e4}$ represents a u-valence aliphatic group which may include an atom other than carbon, and u is an integer of 2 or more and 4 or less.)

$R^{e1}$ and $R^{e2}$ are an alkyl group, the alkyl group may be linear or branched, and is preferably linear. When $R^{e1}$ and $R^{e2}$ are an alkyl group, the number of carbon atoms of the alkyl group is not particularly limited within a range where the objects of the present invention are not impaired. The number of carbon atoms of the alkyl group is preferably 1 or more and 4 or less, particularly preferably 1 or 2, and the most preferably 1. As the combination of Re1 and Ret, preferably, one is a hydrogen atom and the other is an alkyl group, and particularly preferably one is a hydrogen atom and the other is a methyl group.

When $R^{e3}$ is an alkylene group, the alkylene group may be linear or branched, and is preferably linear. When $R^{e3}$ is an alkylene group, the number of carbon atoms of the alkylene group is not particularly limited within a range where the objects of the present invention are not impaired. The number of carbon atoms of the alkylene group is preferably 1 or more and 10 or less, more preferably 1 or more and 5 or less, particularly preferably 1 or 2, and the most preferably 1.

$R^{e4}$ is an aliphatic group having two or more and four or less valences and which may include an atom other than carbon atom. Examples of the atoms which may be included in $R^{e4}$ include a nitrogen atom, an oxygen atom, a sulfur atom, a fluorine atom, a chlorine atom, a bromine atom, an iodine atom, and the like. A structure of the aliphatic group as $R^{e4}$ may be linear or branched, or may be cyclic, and a structure combining these structures.

Among the compounds represented by the formula (e1), a compound represented by the following formula (e2) is more preferable.

(e2)

(In the formula (e2), Re4 and u are the same as those in the formula (e1).)

Among the compounds represented by the above formula (e2), the following compounds are preferable.

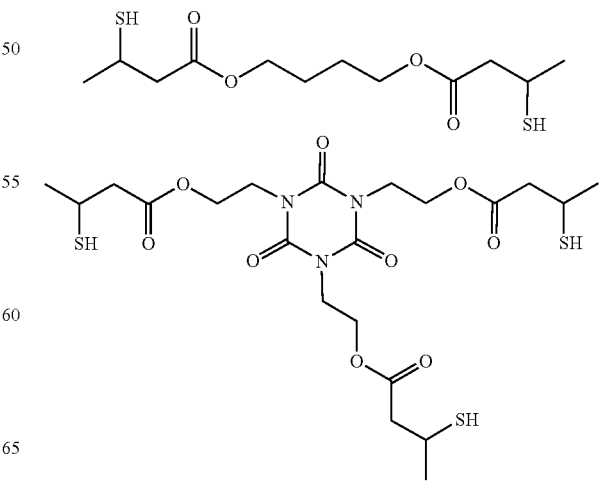

111
-continued

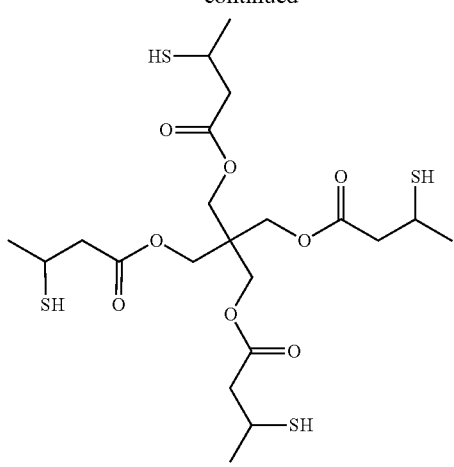

Compounds represented by the following formulae (e3-L1) to (e3-L7) are also preferable examples as the sulfur-containing compound having a mercapto group.

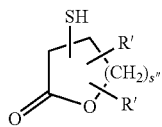 (e3-L1)

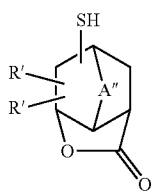 (e3-L2)

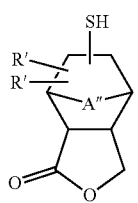 (e3-L3)

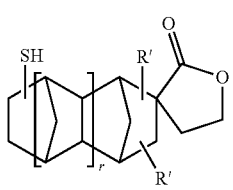 (e3-L4)

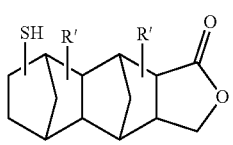 (e3-L5)

112
-continued

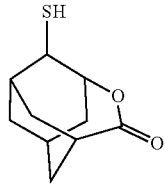 (e3-L6)

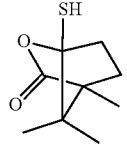 (e3-L7)

(In the formulae (e3-L1) to (e3-L7), R', s", A", and r are the same as in the formulae (b-L1) to (b-L7) described for the acrylic resin (B3).)

Suitable specific examples of the mercapto compound represented by the above formulae (e3-L1) to (e3-L7) include the following compounds.

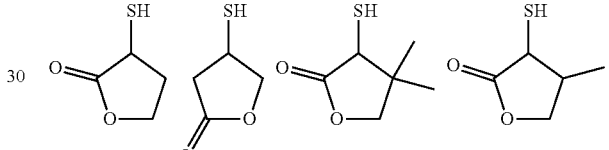

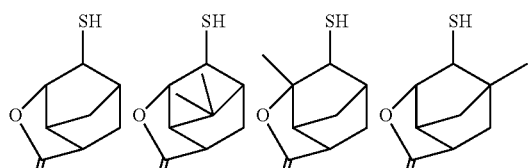

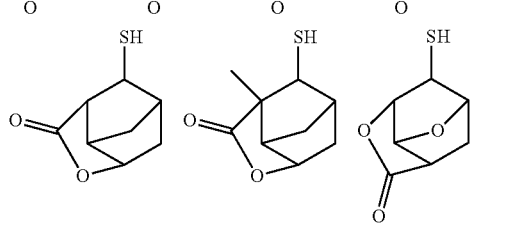

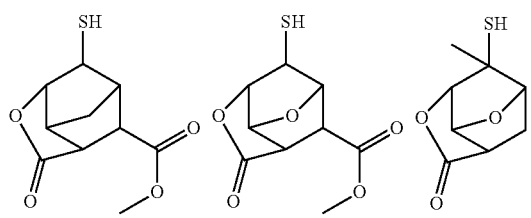

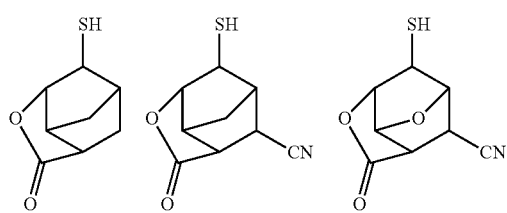

-continued

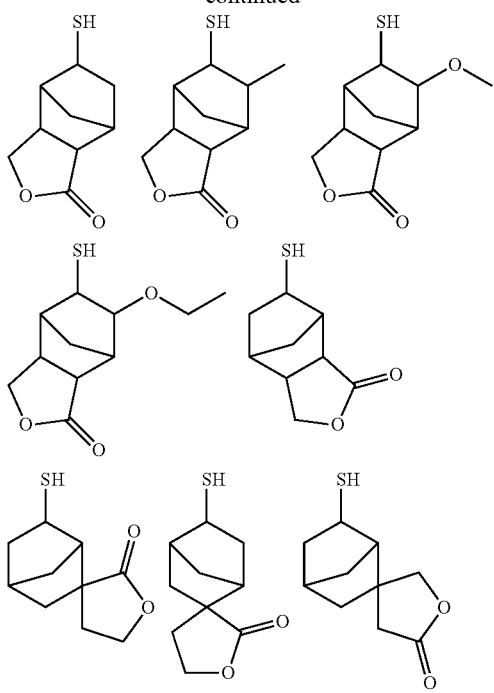

-continued

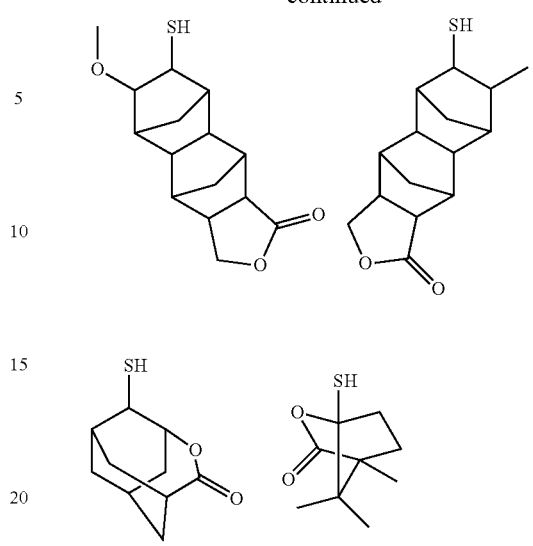

Compounds represented by the following formulae (e3-1) to (e3-4) are also preferable examples as the sulfur-containing compound having a mercapto group.

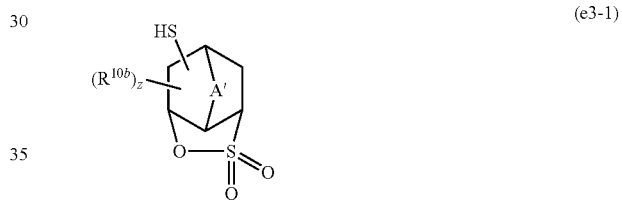 (e3-1)

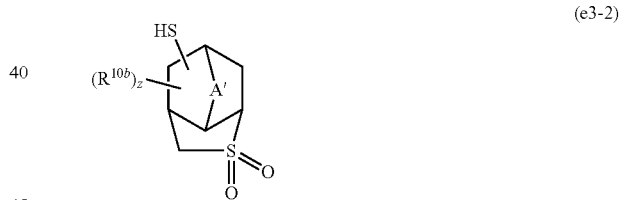 (e3-2)

 (e3-3)

 (e3-4)

(In the formulae (e3-1) to (e3-4), definitions of abbreviations are the same as mentioned for the formulae (3-1) to (3-4) described for acrylic resin (B3).)

Suitable specific examples of the mercapto compound represented by the above formulae (e3-1) to (e3-4) include the following compounds.

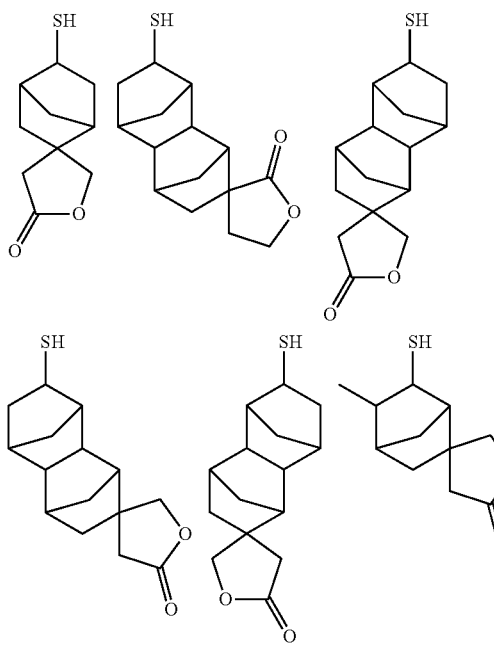

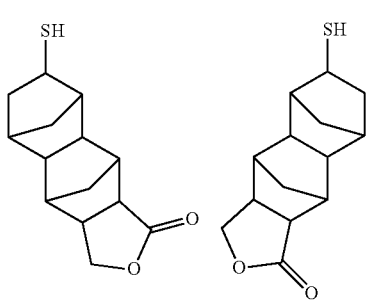

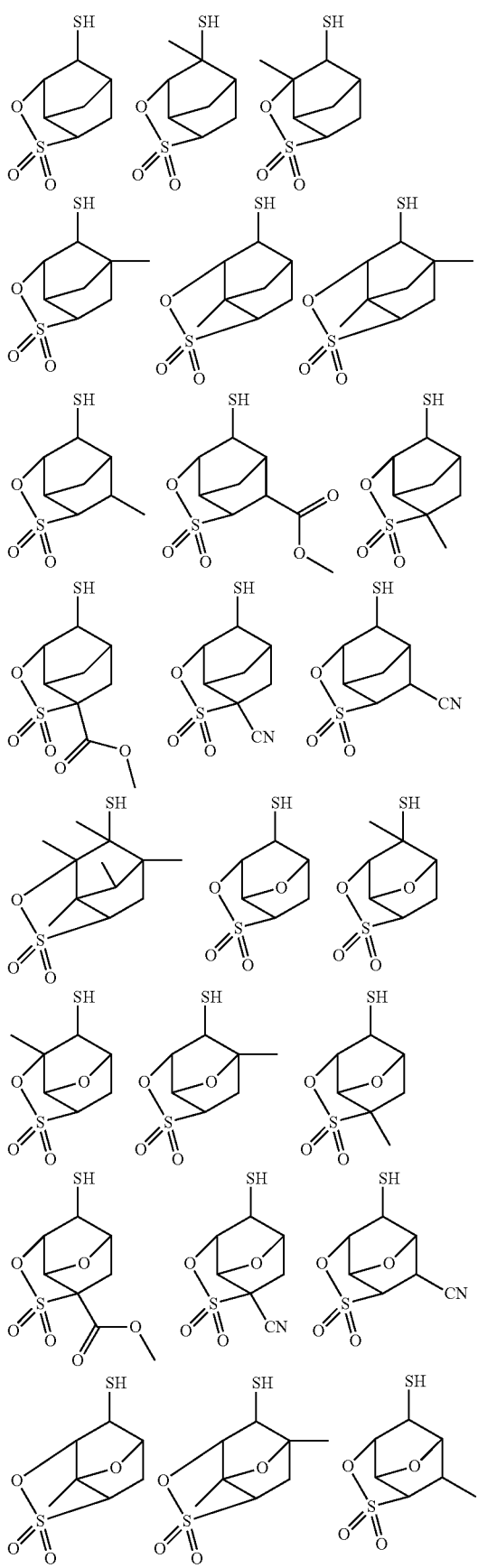

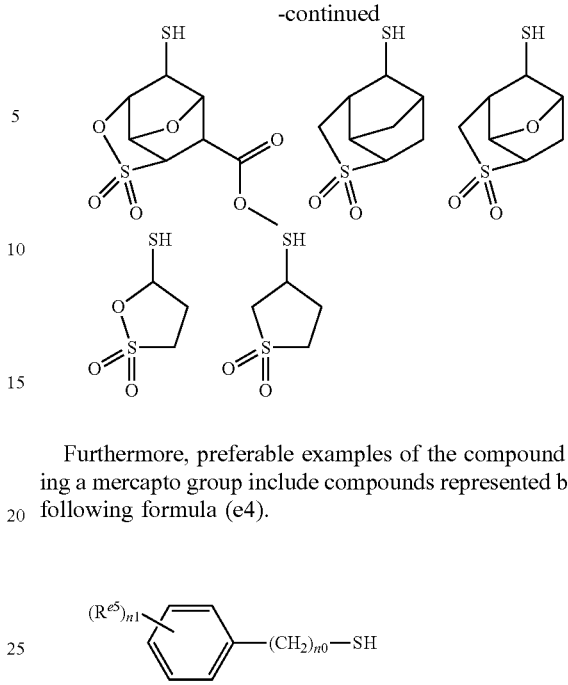

Furthermore, preferable examples of the compound having a mercapto group include compounds represented by the following formula (e4).

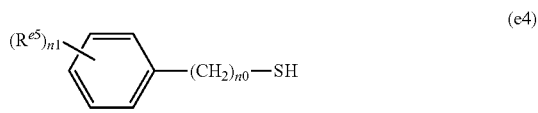

(e4)

(In the formula (e4), $R^{e5}$ is a group selected from the group consisting of a hydroxyl group, an alkyl group having 1 or more 4 or less carbon atoms, an alkoxy group having 1 or more 4 or less carbon atoms, an alkylthio group having 1 or more and 4 or less carbon atoms, a hydroxyalkyl group having 1 or more and 4 or less carbon atoms, a mercapto alkyl group having 1 or more and 4 or less carbon atoms, a halogenated alkyl group having 1 or more and 4 or less carbon atoms, and a halogen atom, n1 is an integer of 0 or more and 3 or less, n0 is an integer of 0 or more and 3 or less, when n1 is 2 or 3, $R^{e5}$ may be the same as or different from each other.)

Specific examples when $R^{e5}$ is an alkyl group which may have a hydroxyl group having 1 or more 4 or less carbon atoms include a methyl group, an ethyl group, an n-propyl group, an isopropyl group, an n-butyl group, an isobutyl group, a sec-butyl group, and a tert-butyl group. Among these alkyl groups, a methyl group, a hydroxymethyl group, and an ethyl group are preferable.

Specific examples when $R^{e5}$ is an alkoxy group having 1 or more 4 or less carbon atoms include a methoxy group, an ethoxy group, an n-propyloxy group, an isopropyloxy group, an n-butyloxy group, an isobutyloxy group, a sec-butyloxy group, and a tert-butyloxy group. Among these alkoxy groups, a methoxy group and an ethoxy group are preferable, and a methoxy group is more preferable.

Specific examples when Res is an alkylthio group having 1 or more 4 or less carbon atoms include a methylthio group, an ethylthio group, an n-propylthio group, an isopropylthio group, an n-butylthio group, an isobutylthio, a sec-butylthio group, and a tert-butylthio group. Among these alkylthio groups, a methylthio group, and an ethylthio group are preferable, and a methylthio group is more preferable.

Specific examples when Res is a hydroxyalkyl group having 1 or more 4 or less carbon atoms include a hydroxymethyl group, a 2-hydroxyethyl group, a 1-hydroxyethyl group, a 3-hydroxy-n-propyl group, and a 4-hydroxy-n-butyl group, and the like. Among these hydroxyalkyl groups, a hydroxymethyl group, a 2-hydroxyethyl group, and a 1-hydroxyethyl group are preferable, and a hydroxymethyl group is more preferable.

Specific examples when Res is a mercapto alkyl group having 1 or more 4 or less carbon atoms include a mercapto methyl group, a 2-mercapto ethyl group, a 1-mercapto ethyl group, a 3-mercapto-n-propyl group, a 4-mercapto-n-butyl group, and the like. Among these mercapto alkyl groups, a mercapto methyl group, a 2-mercapto ethyl group, and 1-mercapto ethyl group are preferable, and a mercapto methyl group is more preferable.

When Res is an alkyl halide group having 1 or more 4 or less carbon atoms, examples of the halogen atom included in the alkyl halide group include fluorine, chlorine, bromine, iodine, and the like. Specific examples when Res is an alkyl halide group having 1 or more 4 or less carbon atoms include a chloromethyl group, a bromomethyl group, an iodomethyl group, a fluoromethyl group, a dichloromethyl group, a dibromomethyl group, a difluoromethyl group, a trichloromethyl group, a tribromomethyl group, a trifluoromethyl group, a 2-chloroethyl group, a 2-bromoethyl group, a 2-fluoroethyl group, a 1,2-dichloroethyl group, a 2,2-difluoroethyl group, a 1-chloro-2-fluoroethyl group, 3-chloro-n-propyl group, a 3-bromon-propyl group, a 3-fluoro-n-propyl group, 4-chloro-n-butyl group, and the like. Among these alkyl halide groups, a chloromethyl group, a bromomethyl group, an iodomethyl group, a fluoromethyl group, a dichloromethyl group, a dibromomethyl group, a difluoromethyl group, a trichloromethyl group, a tribromomethyl group, and a trifluoromethyl group are preferable, and a chloromethyl group, a dichloromethyl group, a trichloromethyl group, and a trifluoromethyl group are more preferable.

Specific examples when Res is a halogen atom include fluorine, chlorine, bromine, or iodine.

In the formula (e4), n1 is an integer of 0 or more 3 or less, and 1 is more preferable. When n1 is 2 or 3, a plurality of Res may be the same as or different from each other.

In the compound represented by the formula (e4), a substituted position of Res on a benzene ring is not particularly limited. The substituted position of Res on a benzene ring is preferably a meta position or a para position with respect to the bond position of —(CH$_2$)$_{n0}$—SH.

The compound represented by the formula (e4) is preferably a compound having at least one group selected from the group consisting of an alkyl group, a hydroxyalkyl group, and a mercapto alkyl group as R$^{e5}$, and more preferably a compound having one group selected from the group consisting of an alkyl group, a hydroxyalkyl group, and a mercapto alkyl group as R$^{e5}$. When the compound represented by the formula (e4) has one group selected from the group consisting of an alkyl group, a hydroxyalkyl group, and a mercapto alkyl group as R$^{e5}$, the substituted position on the benzene ring of the alkyl group, the hydroxyalkyl group, or the mercapto alkyl group is preferably a meta position or a para position with respect to the bond position of —(CH$_2$)$_{n0}$—SH, and more preferably a para position.

In the formula (e4), n0 is an integer of 0 or more 3 or less. From the viewpoint that preparation or availability of a compound is easy, n0 is preferably 0 or 1, and more preferably 0.

Specific examples of the compound represented by the formula (e4) include p-mercaptophenol, p-thiocresol, m-thiocresol, 4-(methylthio)benzenethiol, 4-methoxybenzenethiol, 3-methoxybenzenethiol, 4-ethoxybenzenethiol, 4-isopropyloxy benzenethiol, 4-tert-butoxybenzenethiol, 3,4-dimethoxy benzenethiol, 3,4,5-trimethoxybenzenethiol, 4-ethylbenzenethiol, 4-isopropyl benzenethiol, 4-n-butylbenzenethiol, 4-tert-butylbenzenethiol, 3-ethylbenzenethiol, 3-isopropyl benzenethiol, 3-n-butylbenzenethiol, 3-tert-butylbenzenethiol, 3,5-dimethyl benzenethiol, 3,4-dimethyl benzenethiol, 3-tert-butyl-4-methylbenzenethiol, 3-tert-4-methylbenzenethiol, 3-tert-butyl-5-methylbenzenethiol, 4-tert-butyl-3-methylbenzenethiol, 4-mercaptobenzyl alcohol, 3-mercaptobenzyl alcohol, 4-(mercaptomethyl)phenol, 3-(mercaptomethyl)phenol, 1,4-di(mercaptomethyl)phenol, 1,3-di(mercaptomethyl)phenol, 4-fluorobenzenethiol, 3-fluorobenzenethiol, 4-chlorobenzenethiol, 3-chlorobenzenethiol, 4-bromobenzenethiol, 4-iodobenzenethiol, 3-bromobenzenethiol, 3,4-dichlorobenzenethiol, 3,5-dichlorobenzenethiol, 3,4-difluorobenzenethiol, 3,5-difluorobenzenethiol, 4-mercaptocatechol, 2,6-di-tert-butyl-4-mercaptophenol, 3,5-di-tert-butyl-4-methoxybenzenethiol, 4-bromo-3-methylbenzenethiol, 4-(trifluoromethyl)benzenethiol, 3-(trifluoromethyl)benzenethiol, 3,5-bis(trifluoromethyl)benzenethiol, 4-methylthiobenzenethiol, 4-ethylthiobenzenethiol, 4-n-butylthiobenzenethiol, and 4-tert-butylthiobenzenethiol, and the like.

Furthermore, examples of the sulfur-containing compound having a mercapto group include a compound including nitrogen-containing aromatic heterocycle substituted with a mercapto group, and a tautomer of a compound including nitrogen-containing aromatic heterocycle substituted with a mercapto group. Preferable specific examples of the nitrogen-containing aromatic heterocycle include imidazole, pyrazole, 1,2,3-triazol, 1,2,4-triazol, oxazole, thiazole, pyridine, pyrimidine, pyridazine, pyrazine, 1,2,3-triazine, 1,2,4-triazine, 1,3,5-triazine, indole, indazole, benzimidazole, benzoxazole, benzothiazole, 1H-benzotriazole, quinoline, isoquinoline, cinnoline, phthalazine, quinazoline, quinoxaline, and 1,8-naphthyridine.

Suitable specific examples of a nitrogen-containing heterocyclic compound suitable as a sulfur-containing compound, and suitable tautomer of the nitrogen-containing heterocyclic compound include the following compounds.

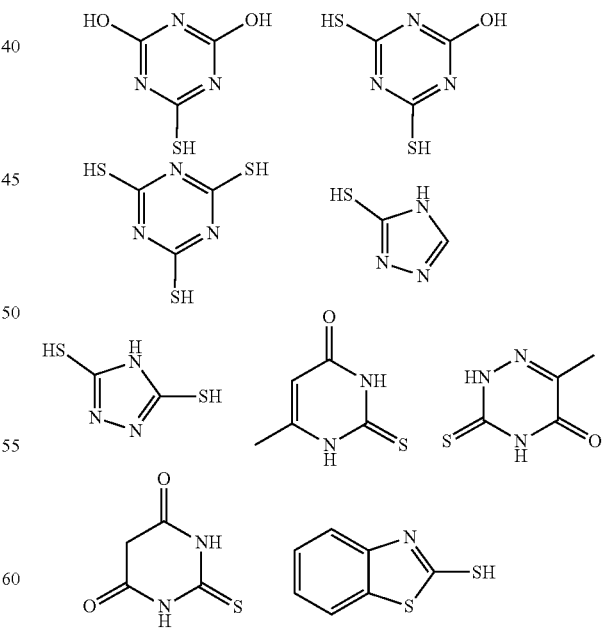

When the photosensitive composition includes a sulfur-containing compound (E), the use amount is preferably 0.01 parts by mass or more 5 parts by mass or less, more preferably 0.02 parts by mass or more 3 parts by mass or less, and particularly preferably 0.05 parts by mass or more 2 parts by mass or less with respect to 100 parts by mass that is the total mass of the above resin (B) and the alkali-soluble resin (D).

<Acid Diffusion Inhibitor (F)>

The photosensitive composition may contain an acid diffusion inhibitor (F). As the acid diffusion inhibitor (F), a nitrogen-containing compound (F1) is preferable, and furthermore, an organic carboxylic acid or oxoacid of phosphorus, or derivative thereof ($F_2$) can be contained in the photosensitive composition as necessary.

[Nitrogen-Containing Compound (F1)]

Examples of the nitrogen-containing compound (F1) include trimethylamine, diethylamine, triethylamine, di-n-propylamine, tri-n-propylamine, tri-n-pentylamine, tribenzylamine, diethanolamine, triethanolamine, n-hexylamine, n-heptyl amine, n-octyl amine, n-nonyl amine, ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, formamide, N-methylformamide, N,N-dimethylformamide, acetamide, N-methylacetamide, N,N-dimethylacetamide, propionamide, benzamide, pyrrolidone, N-methylpyrrolidone, methylurea, 1,1-dimethylurea, 1,3-dimethylurea, 1,1,3,3,-tetramethylurea, 1,3-diphenylurea, imidazole, benzimidazole, 4-methylimidazole, 8-oxyquinoline, acridine, purine, pyrrolidine, piperidine, 2,4,6-tri(2-pyridyl)-S-triazine, morpholine, 4-methylmorpholine, piperazine, 1,4-dimethylpiperazine, 1,4-diazabicyclo[2.2.2]octane and pyridine, and pyridines. These may be used alone, or in combinations of two or more thereof.

Furthermore, commercially available hindered amine compounds such as Adeka Stab LA-52, Adeka Stab LA-57, Adeka Stab LA-63P, Adeka Stab LA-68, Adeka Stab LA-72, Adeka Stab LA-77Y, Adeka Stab LA-77G, Adeka Stab LA-81, Adeka Stab LA-82, Adeka Stab LA-87 (all manufactured by ADEKA), and the like, and pyridine whose 2,6-position has been substituted with a substituent a hydrocarbon group such as 2,6-diphenyl pyridine and 2,6-di-tert-butyl pyridine can be used as the nitrogen-containing compound (F1).

The nitrogen-containing compound (F1) may be used in an amount typically in the range of 0 parts by mass or more and 5 parts by mass or less, and particularly preferably in the range of 0 parts by mass or more and 3 parts by mass or less, with respect to 100 parts by mass of total mass of the above resin (B) and the above alkali-soluble resin (D).

[Organic Carboxylic Acid or Oxo Acid of Phosphorus or Derivative Thereof ($F_2$)]

Among the organic carboxylic acid, or the oxo acid of phosphorus or the derivative thereof ($F_2$), specific preferred examples of the organic carboxylic acid include malonic acid, citric acid, malic acid, succinic acid, benzoic acid, salicylic acid and the like, and salicylic acid is particularly preferred.

Examples of the oxo acid of phosphorus or derivatives thereof include phosphoric acid and derivatives such as esters thereof such as phosphoric acid, phosphoric acid di-n-butyl ester, and phosphoric acid diphenyl ester; phosphonic acid and derivatives such as esters thereof such as phosphonic acid, phosphonic acid dimethyl ester, phosphonic acid di-n-butyl ester, phenylphosphonic acid, phosphonic acid diphenyl ester, and phosphonic acid dibenzyl ester; and phosphinic acid and derivatives such as esters thereof such as phosphinic acid and phenylphosphinic acid; and the like. Among these, phosphonic acid is particularly preferred. These may be used alone, or in combinations of two or more thereof.

The organic carboxylic acid or oxo acid of phosphorus or derivative thereof ($F_2$) may be used in an amount usually in the range of 0 parts by mass or more and 5 parts by mass or less, and particularly preferably in the range of 0 parts by mass and 3 parts by mass or less, with respect to 100 parts by mass of total mass of the above resin (B) and the above alkali-soluble resin (D).

Moreover, in order to form a salt to allow for stabilization, the organic carboxylic acid, or the oxo acid of phosphorous or the derivative thereof ($F_2$) is preferably used in an amount equivalent to that of the above nitrogen-containing compound (F1).

<Polyfunctional Vinyl Ether Monomer (G)>

The photosensitive composition may contain a polyfunctional vinyl ether monomer (G). In the case of a positive photosensitive resist composition containing the above-mentioned resin (B) and alkali-soluble resin (D), together with a polyfunctional vinyl ether (B), by a coating film consisting of the photosensitive composition being heated upon forming the resist film, a carboxy group and phenolic hydroxyl group possessed by the resin (B) and alkali-soluble resin (D), and the polyfunctional vinyl ether monomer (G) react, and the molecular chain of the resin (B) and alkali-soluble resin (D) are linked. By the molecular chains of the resin (B) and alkali-soluble resin (D) being linked, it is possible to suppress the occurrence of cracks upon forming the resist film using the photosensitive composition, and it is possible to form a patterned resist film for which the shape hardly changes, even if contacting with a plating solution under plating conditions.

The polyfunctional vinyl ether monomer (G) can be blended with the photosensitive composition as mentioned above. In addition, the polyfunctional vinyl ether monomer (G) may be used in a state crosslinking reaction with the resin (B) and/or alkali-soluble resin (D), prior to preparing the photosensitive composition. It should be noted that, in the case of the alkali-soluble resin (D) being crosslinked by the polyfunctional vinyl ether monomer (G), the carboxy group and phenolic hydroxyl group possessed by the alkali-soluble resin (D) are crosslinked by a crosslinking group of acetal type.

This acetal-type crosslinking group dissociates from the carboxy group or phenolic hydroxyl group by action of the acid, and causes a carboxy group or phenol hydroxyl group to be generated. In other words, the alkali-soluble resin (D) crosslinked by the polyfunctional vinyl ether monomer (G) corresponds to the resin (B) for which the solubility to alkali increases by the action of the acid. It should be noted that, for the resin (B) having a crosslinking group derived from the polyfunctional vinyl ether monomer (G), the mass of crosslinking group is included in the mass of the resin (B).

The polyfunctional vinyl ether monomer (G) is not particularly limited so long as being an organic compound containing two or more vinyloxy groups in one molecule. A divalent or polyvalent organic group which is the mother nucleus bonded by the vinyloxy group may be a hydrocarbon group, or may be an organic group including a heteroatom. As the heteroatom, O, S, N, P, halogen atoms, etc. can be exemplified.

A divalent or higher valency organic group as the mother nucleus bonded by the vinyloxy group in the polyfunctional vinyl ether monomer (G) is preferably a hydrocarbon group due to being chemically stable, and having good solubility in the photosensitive composition. This hydrocarbon group may be an aliphatic hydrocarbon group, may be an aromatic hydrocarbon group, may be a combination of aliphatic hydrocarbon group and aromatic hydrocarbon group, and is preferably an aliphatic hydrocarbon group.

In the case of the divalent or higher valency organic group as the mother nucleus bonded by the vinyloxy group in the polyfunctional vinyl ether monomer (G) being a hydrocarbon group, the number of carbon atoms of this hydrocarbon group is not particularly limited in a range not inhibiting the object of the present invention. The number of carbon atoms of this hydrocarbon group, for example, is preferably 1 or more and 40 or less, more preferably 2 or more and 20 or less, and even more preferably 2 or more and 10 or less.

The number of vinyloxy groups possessed by the polyfunctional vinyl ether monomer (G) is not particularly limited. The number of vinyloxy groups in one molecule is preferably 2 or more and 6 or less, more preferably 2 or more and 4 or less, and particularly preferably 2 or 3.

As specific examples of the polyfunctional vinyl ether monomer (G), linear aliphatic divinyl ethers such as ethylene glycol divinyl ether, diethylene glycol divinyl ether, triethylene glycol divinyl ether, polyethylene glycol divinyl ether, propylene glycol divinyl ether, dipropylene glycol divinyl ether, tripropyleneglycol divinyl ether, polypropylene glycol divinyl ether, 1,3-propanediol divinyl ether, 1,4-butanediol divinyl ether, 1,5-pentanediol divinyl ether, 1,6-hexanediol divinyl ether, 1,8-octanediol divinyl ether, 1,10-decanediol divinyl ether, neopentyl glycol divinyl ether, trimethylolpropane divinyl ether and pentaerythritol divinyl ether; cycloaliphatic divinyl ethers such as 1,4-cyclohexanediol divinyl ether, 1,4-cyclohexane dimethanol divinyl ether and 2-vinyloxy-5-(vinyloxymethyl)-7-oxabicyclo[2.2.1]heptane; aromatic divinyl ethers such as 1,4-divinyloxybenzene, 1,3-divinyloxybenzene, 1,2-divinyloxybenzene, 1,4-divinyloxynaphthalene, 1,3-divinyloxynaphthalene, 1,2-divinyloxynaphthalene, 1,5-divinyloxynaphthalene, 1,6-divinyloxynaphthalene, 1,7-divinyloxynaphthalene, 1,8-divinyloxynaphthalene, 2,3-divinyloxynaphthalene, 2,6-divinyloxynaphthalene, 2,7-divinyloxynaphthalene, 4,4'-divinyloxy biphenyl, 3,3'-divinyloxy biphenyl, 2,2'-divinyloxy biphenyl, 3,4'-divinyloxy biphenyl, 2,3'-divinyloxy biphenyl, 2,4'-divinyloxy biphenyl, bisphenol A divinyl ether, 1,4-benzene dimethanol divinyl ether, 1,3-benzene dimethanol divinyl ether, 1,2-benzene dimethanol divinyl ether, and naphthalene-1,4-bismethanol divinyl ether; and trivalent or higher polyvalent vinyl ethers such as trimethylolpropane trivinyl ether, pentaerythritol tetravinyl ether, sorbitol tetravinyl ether, sorbitol pentavinyl ether, dipentaerythritol pentavinyl ether and dipentaerythritol hexavinyl ether can be exemplified.

The usage amount of the polyfunctional vinyl ether monomer (G) in the photosensitive composition is not particularly limited in a range not inhibiting the object of the present invention. Since the formation is particularly easy of a patterned resist film which tends to particularly suppress the occurrence of cracks during resist film formation, and for which the shape hardly changes even if contacting with a plating solution under plating conditions, the usage amount of the polyfunctional vinyl ether monomer (G) in the photosensitive compound is preferably 0.5 parts by mass to 50 parts by mass, and more preferably 1 part by mass to 30 parts by mass, relative to a total of 100 parts by mass of the mass of the resin (B) and the mass of the alkali-soluble resin (D).

<Organic solvent (S)>

The photosensitive composition contains an organic solvent (S). There is no particular limitation on the types of the organic solvent (S) as long as the objects of the present invention are not impaired, and an organic solvent appropriately selected from those conventionally used for photosensitive compositions can be used.

Specific examples of the organic solvent (S) include ketones such as acetone, methyl ethyl ketone, cyclohexanone, methyl isoamyl ketone, and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, and a monomethyl ether, a monoethyl ether, a monopropyl ether, a monobutyl ether, and a monophenyl ether of dipropylene glycol monoacetate; cyclic ethers such as dioxane; esters such as ethyl formate, methyl lactate, ethyl lactate, methyl acetate, ethyl acetate, butyl acetate, methyl pyruvate, methyl acetoacetate, ethyl acetoacetate, ethyl pyruvate, ethylethoxy acetate, methyl methoxypropionate, ethyl ethoxypropionate, methyl 2-hydroxypropionate, ethyl 2-hydroxypropionate, ethyl 2-hydroxy-2-methylpropionate, methyl 2-hydroxy-3-methylbutanate, 3-methoxybutyl acetate, and 3-methyl-3-methoxybutyl acetate; aromatic hydrocarbons such as toluene and xylene; and the like. These may be used alone, or as a mixture of two or more thereof.

There is no particular limitation on the content of the organic solvent (S) as long as the objects of the present invention are not impaired. In a case where a photosensitive composition is used for a thick-film application such that a photosensitive layer obtained by the spin coating method and the like has a film thickness of 5 μm or more, the organic solvent (S) is preferably used in a range where the solid content concentration of the photosensitive composition is 30% by mass or more and 55% by mass or less.

<Other Components>

The photosensitive composition may further contain a polyvinyl resin for improving plasticity. Specific examples of the polyvinyl resin include polyvinyl chloride, polystyrene, polyhydroxystyrene, polyvinyl acetate, polyvinylbenzoic acid, polyvinyl methyl ether, polyvinyl ethyl ether, polyvinyl alcohol, polyvinyl pyrrolidone, polyvinyl phenol, and copolymers thereof, and the like. The polyvinyl resin is preferably polyvinyl methyl ether in view of lower glass transition temperatures.

It is also preferable that a photosensitive composition contains a Lewis acidic compound. When the photosensitive composition includes a Lewis acidic compound, a photosensitive composition with high sensitivity is easily obtained, so that a patterned resist film whose cross-sectional shape is rectangular is more easily formed using a positive-type photosensitive composition. Furthermore, when a pattern is formed using the photosensitive composition, when time required for each process at the time of pattern formation or time required between the processes is long, a pattern having a desired shape and dimension may not be easily formed, or developing property may be deteriorated. However, when a Lewis acidic compound is blended into the photosensitive composition, such adverse effects on the pattern shape or the developing property can be mitigated or a process margin can be widened.

The Lewis acidic compound herein represents "a compound that acts as an electron-pair receptor having an empty orbital capable of receiving at least one electron pair." The Lewis acidic compound is not particularly limited as long as it corresponds to the above definition, and is a compound which is recognized as the Lewis acidic compound by a person skilled in the art. As the Lewis acidic compound, a compound that does not correspond to a Bronsted acid (proton acid) is preferably used. Specific examples of the Lewis acidic compound include boron fluoride, ether complexes of boron fluoride (for example, BF3·Et2O, BF$_3$·Me$_2$O, BF$_3$·THF, etc., Et represents an ethyl group, Me represents a methyl group, and THF represents tetrahydrofuran), organic boron compounds (for example, tri-n-octyl borate, tri-n-butyl borate, triphenyl borate, triphenylboron, etc.), titanium chloride, aluminum chloride, aluminum bromide, gallium chloride, gallium bromide, indium chloride, thallium trifluoroacetate, tin chloride, zinc chloride, zinc bromide, zinc iodide, zinc trifluoromethanesulfonate, zinc acetate, zinc nitrate, zinc tetrafluoroborate, manganese chloride, manganese bromide, nickel chloride, nickel bromide, nickel cyanide, nickel acetylacetonate, cadmium chloride, cadmium bromide, stannous chloride, stannous bromide, stannous sulfate, stannous tartrate, and the like. Furthermore, other specific examples of the Lewis acidic compound include chloride, bromide, sulfate, nitrate, carboxylate, or trifluoromethanesulfonate, of the rare earth metal element, and cobalt chloride, ferrous chloride, yttrium chloride, and the like. Examples of the rare earth metal element herein include lanthanum, cerium, praseodymium, neodymium, samarium, europium, gadolinium, terbium, dysprosium, holmium, erbium, thulium, ytterbium, and lutetium.

From the viewpoint of easiness in availability and preferable effect by addition thereof, it is preferable that the Lewis acidic compound contains a Lewis acidic compound including elements belonging to Group 13. Herein, examples of the elements belonging to Group 13 include boron, aluminum, gallium, indium, and thallium. Among the above elements belonging to Group 13, boron is preferable from the viewpoint that the Lewis acidic compound is easily available and addition effect is particularly excellent. In other words, it is preferable that the Lewis acidic compound contains a Lewis acidic compound including boron.

Examples of the Lewis acidic compound containing boron include boron fluoride, ether complexes of boron fluoride, boron halides such as boron chloride and boron bromide, and various organic boron compounds. As the Lewis acidic compound including boron, an organic boron compound is preferable because the content ratio of halogen atoms in the Lewis acidic compound is small and the photosensitive composition is easily applicable to an application requiring a low halogen content.

Preferable examples of the organic boron compound include a boron compound represented by the following formula (h1):

$$B(R^{h1})_{t1}(OR^{h2})_{(3-t1)} \tag{h1}$$

(In the formula (h1), $R^{h1}$ and $R^{h2}$ each independently represent a hydrocarbon group having 1 or more and 20 or less carbon atoms; the hydrocarbon group may have one or more substituents; t1 is an integer of 0 or more and 3 or less; when a plurality of $R^{h1}$ exists, two of the plurality of $R^{h1}$ may be bonded to each other to form a ring; and when a plurality of $OR^{h2}$ is present, two of the plurality of $OR^{h2}$ may be bonded to each other to form a ring).

The photosensitive composition preferably includes one or more boron compounds represented by the above formula (h1) as the Lewis acidic compound mentioned above.

In the formula (h1), $R^{h1}$ and $R^{h2}$ are a hydrocarbon group, the number of carbon atoms of the hydrocarbon group is 1 or more and 20 or less. The hydrocarbon group having 1 or more and 20 or less carbon atoms may be an aliphatic hydrocarbon group, or an aromatic hydrocarbon group, a hydrocarbon group having a combination of an aliphatic group and an aromatic group. As the hydrocarbon group having 1 or more and 20 or less carbon atoms, a saturated aliphatic hydrocarbon group, or an aromatic hydrocarbon group is preferable. The number of carbon atoms of the hydrocarbon group as $R^{h1}$ and $R^{h2}$ is preferably 1 or more and 10 or less. When the hydrocarbon group is an aliphatic hydrocarbon group, the number of carbon atoms thereof is preferably 1 or more and 6 or less, and particularly preferably 1 or more and 4 or less. The hydrocarbon group as $R^{h1}$ and $R^{h2}$ may be a saturated hydrocarbon group, or an unsaturated hydrocarbon group, and a saturated hydrocarbon group is preferable. When the hydrocarbon group as $R^{h1}$ and $R^{h2}$ is an aliphatic hydrocarbon group, the aliphatic hydrocarbon group may be linear, branched or cyclic or combination thereof.

Suitable specific examples of aromatic hydrocarbon groups include a phenyl group, a naphthalene-1-yl group, a naphthalene-2-yl group, a 4-phenylphenyl, 3-phenylphenyl, and 2-phenylphenyl. Among them, a phenyl group is preferable.

The saturated aliphatic hydrocarbon group is preferably an alkyl group. Suitable examples of alkyl groups include a methyl group, an ethyl group, an n-propyl group, an isopropyl group, an n-butyl group, an isobutyl group, a sec-butyl group, a tert-butyl group, an n-pentyl group, an n-hexyl group, an n-heptyl group, an n-octyl group, a 2-ethyl hexyl group, an n-nonyl group, and an n-decyl group.

The hydrocarbon group as $R^{h1}$ and $R^{h2}$ may have one or more substituents. Examples of the substituent include a halogen atom, a hydroxyl group, an alkyl group, an aralkyl group, an alkoxy group, a cycloalkyloxy group, an aryloxy group, an aralkyloxy group, an alkylthio group, a cycloalkylthio group, an arylthio group, an aralkylthio group, an acyl group, an acyloxy group, an acylthio group, an alkoxycarbonyl group, a cycloalkyloxycarbonyl group, an aryloxycarbonyl group, an amino group, an N-monosubstituted amino group, an N,N-disubstituted amino group, a carbamoyl group (—CO—NH$_2$), an N-monosubstituted carbamoyl group, an N,N-disubstituted carbamoyl group, a nitro group and a cyano group. The number carbon atoms in the substituent is not particularly limited within a range where the objects of the present invention are not impaired, but the number is preferably 1 or more and 10 or less, and more preferably 1 or more and 6 or less.

Suitable specific examples of the organic boron compound represented by the above formula (h1) include the following compounds. Note here that in the following formulae, Pen represents a pentyl group, Hex represents a hexyl group, Hep represents a heptyl group, Oct represents an octyl group, Non represents a nonyl group, and Dec represents a decyl group.

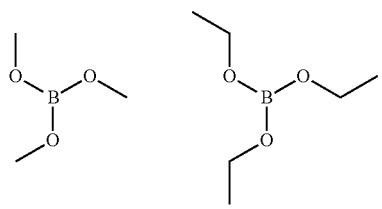

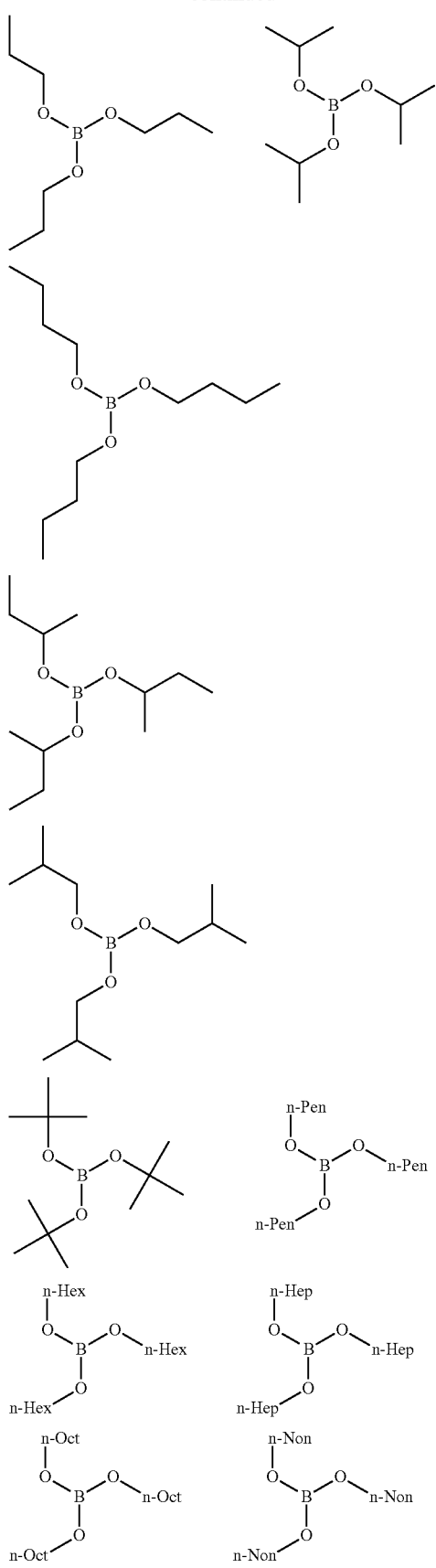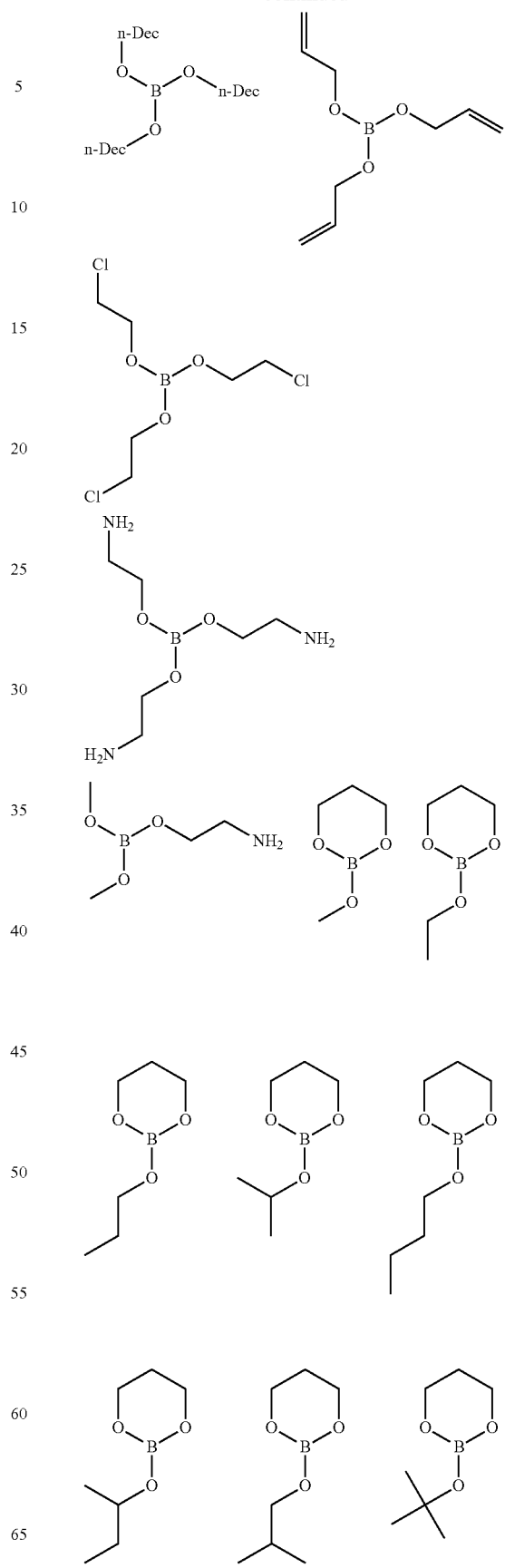

-continued
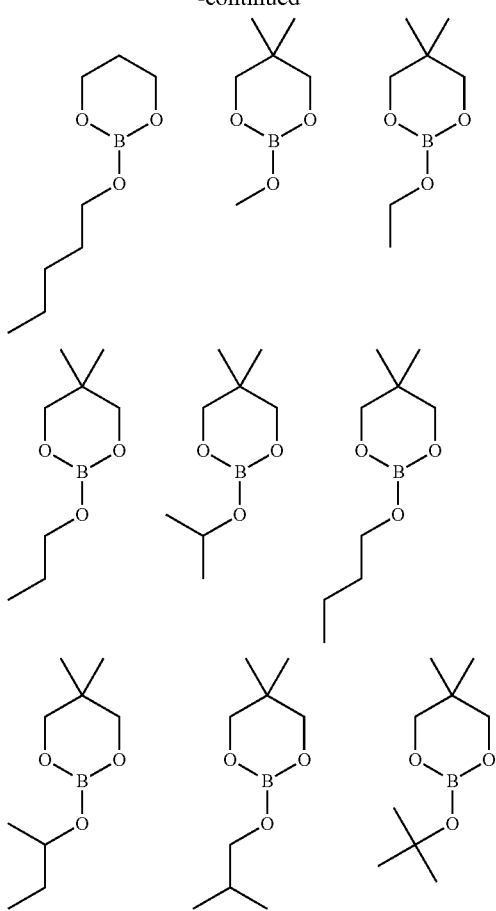
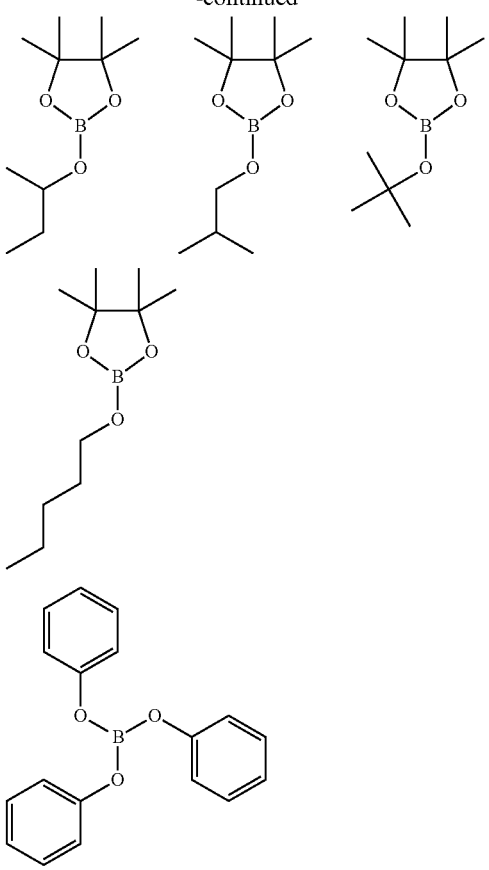
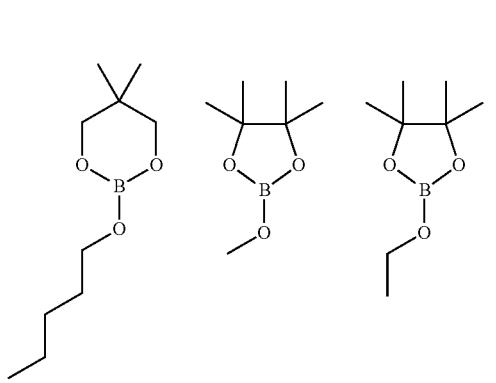
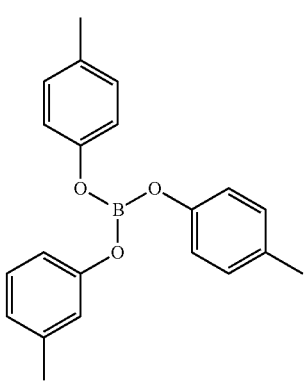
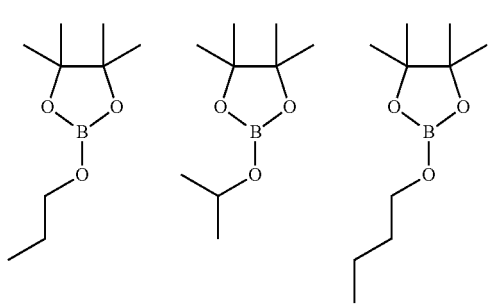
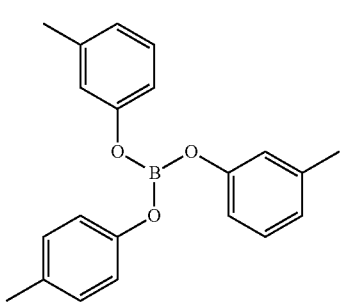

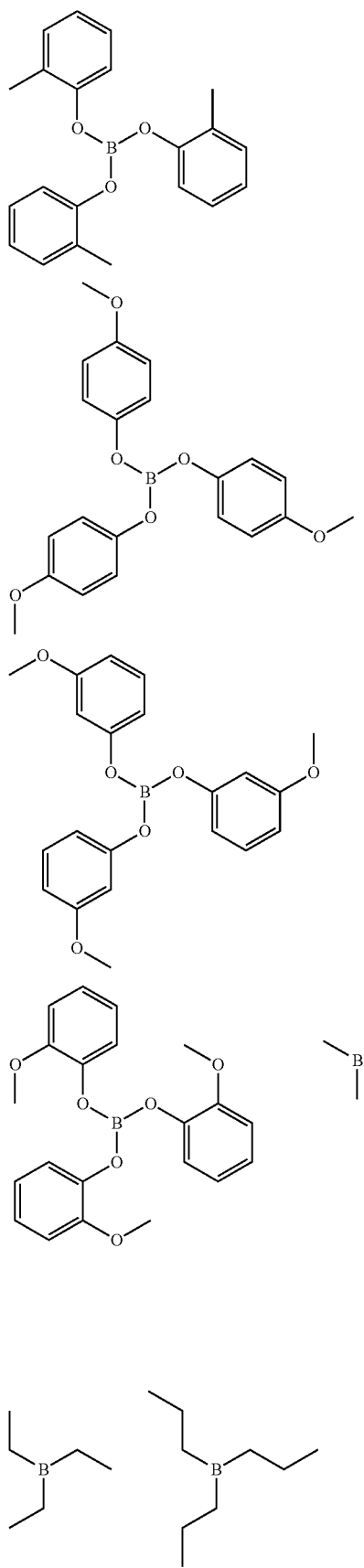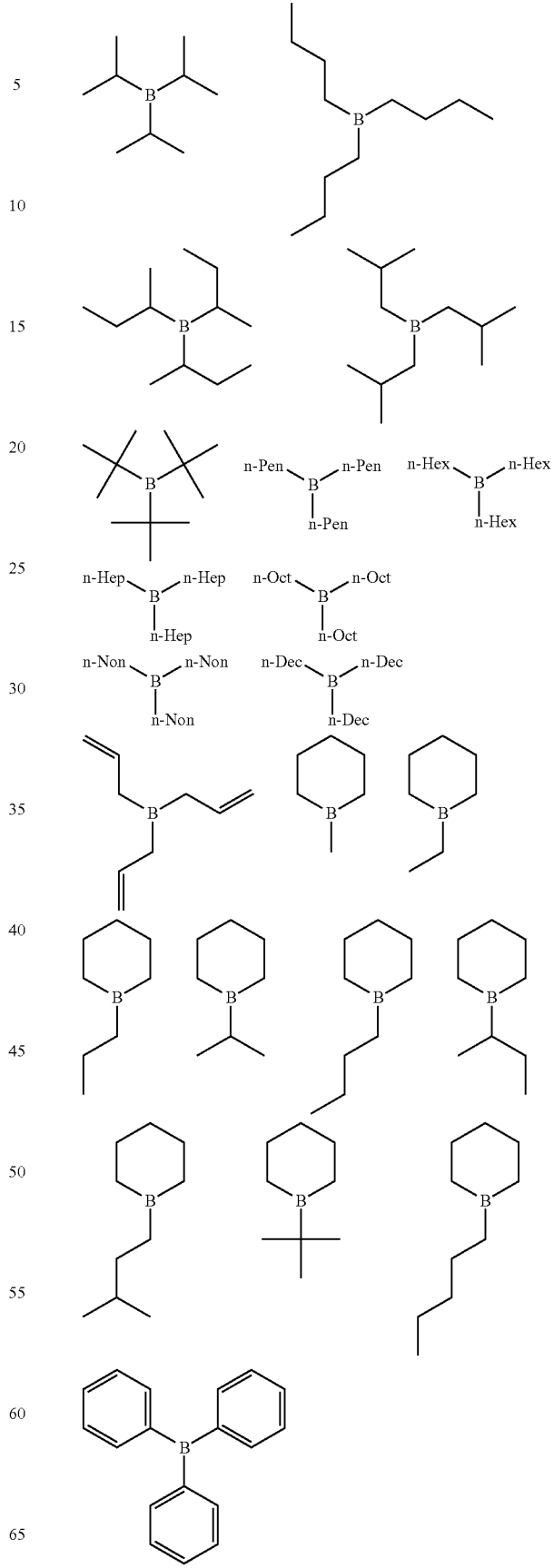

131
-continued
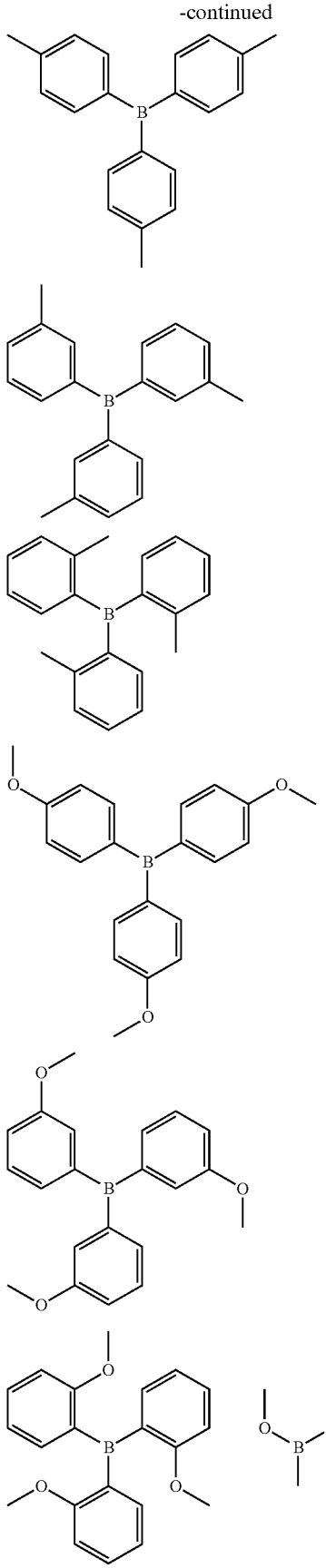
132
-continued
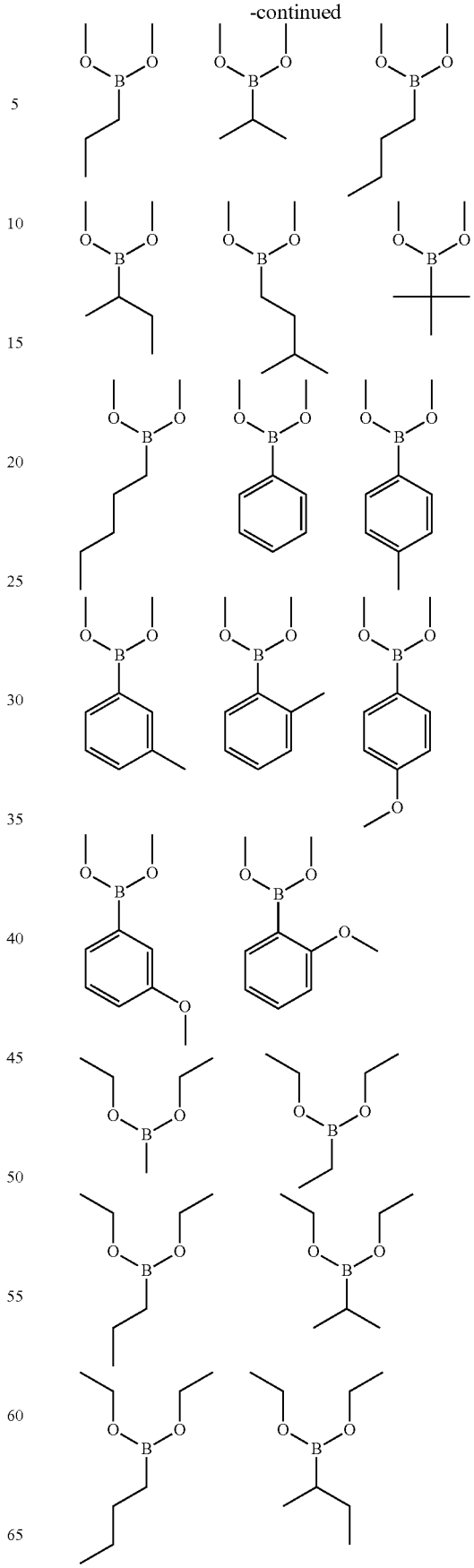

-continued
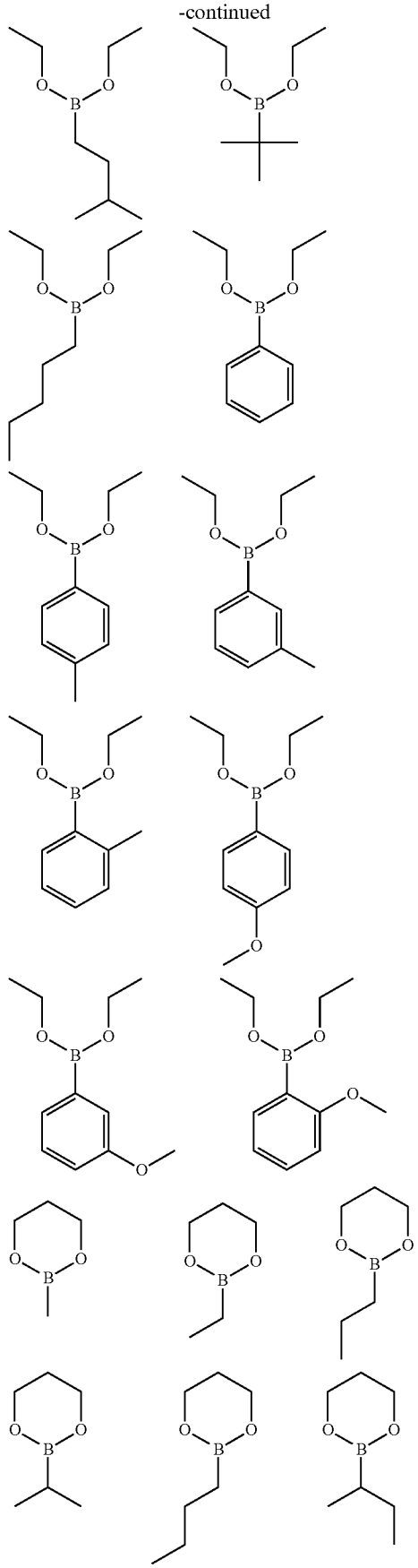
-continued
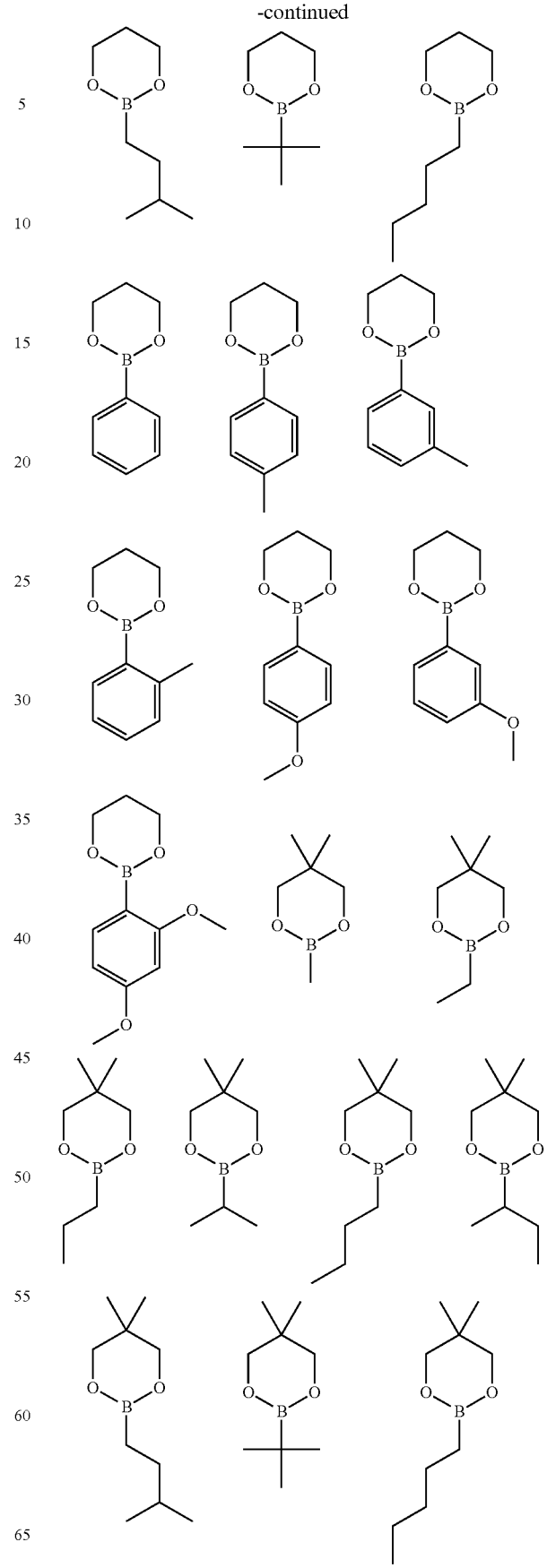

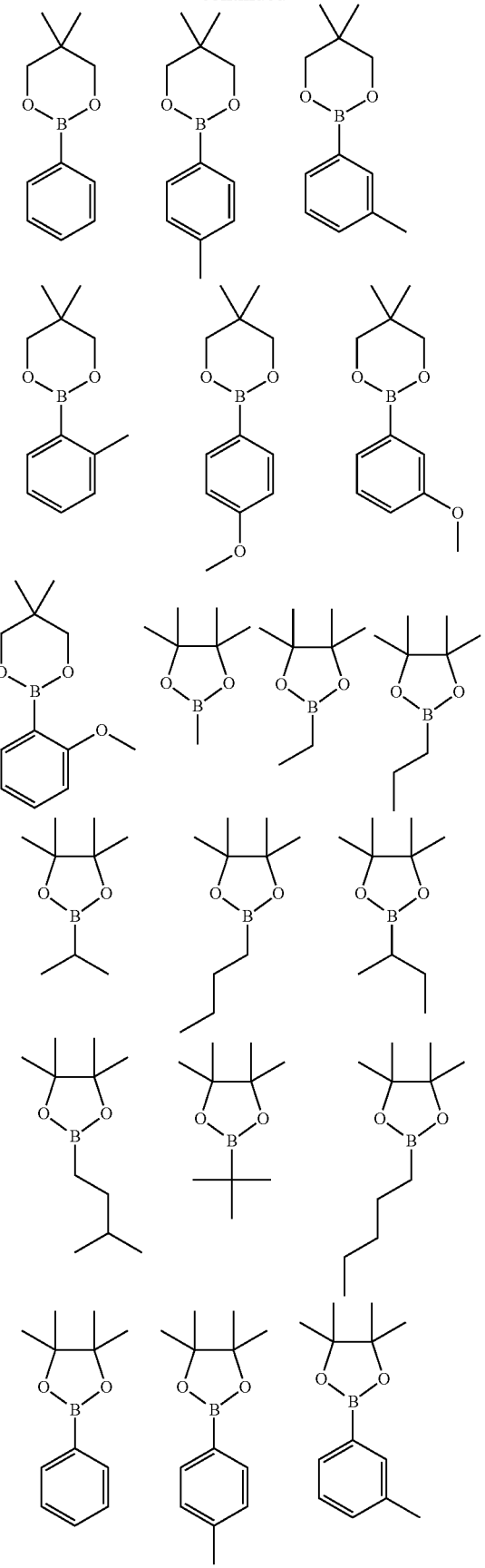

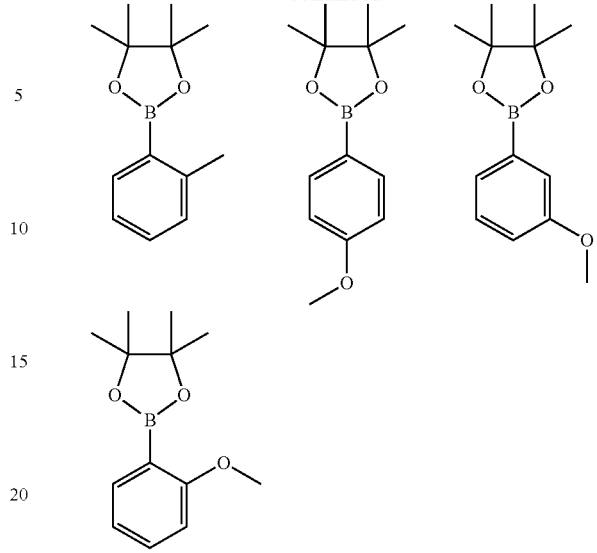

The Lewis acidic compound is used in the amount in a range of preferably 0.01 parts by mass or more and 5 parts by mass or less, more preferably 0.01 parts by mass or more and 3 parts by mass or less, further preferably 0.05 part by mass or more and 2 parts by mass or less, relative to 100 parts by mass of the total mass of the above resin (B) and the above alkali-soluble resin (D).

Further, when the photosensitive composition is used for forming pattern serving as a template for forming a plated article, the photosensitive composition may also contain an adhesive auxiliary agent in order to improve the adhesiveness between a template formed with the photosensitive composition and a metal substrate.

Also, the photosensitive composition may further contain a surfactant for improving coating characteristics, defoaming characteristics, leveling characteristics, and the like. As the surfactant, for example, a fluorine-based surfactant or a silicone-based surfactant is preferably used. Specific examples of the fluorine-based surfactant include commercially available fluorine-based surfactants such as BM-1000 and BM-1100 (both manufactured by B.M-Chemie Co., Ltd.), Megafac F142D, Megafac F172, Megafac F173 and Megafac F183 (all manufactured by Dainippon Ink And Chemicals, Incorporated), Flolade FC-135, Flolade FC-170C, Flolade FC-430 and Flolade FC-431 (all manufactured by Sumitomo 3M Ltd.), Surflon S-112, Surflon S-113, Surflon S-131, Surflon S-141 and Surflon S-145 (all manufactured by Asahi Glass Co., Ltd.), SH-28PA, SH-190, SH-193, SZ-6032 and SF-8428 (all manufactured by Toray Silicone Co., Ltd.) and the like, but not limited thereto. As the silicone-based surfactant, an unmodified silicone-based surfactant, a polyether modified silicone-based surfactant, a polyester modified silicone-based surfactant, an alkyl modified silicone-based surfactant, an aralkyl modified silicone-based surfactant, a reactive silicone-based surfactant, and the like, can be preferably used. As the silicone-based surfactant, commercially available silicone-based surfactant can be used. Specific examples of the commercially available silicone-based surfactant include Paintad M (manufactured by Dow Corning Toray Co., Ltd.), Topica K1000, Topica K2000, and Topica K5000 (all manufactured by Takachiho Industry Co., Ltd.), XL-121 (polyether modified silicone-based surfactant, manufactured by Clariant Co.), BYK-310 (polyester modified silicone-based surfactant, manufactured by BYK), and the like.

Additionally, in order to finely adjust the solubility in a developing solution, the photosensitive composition may further contain an acid, an acid anhydride, or a solvent having a high boiling point.

Specific examples of the acid and acid anhydride include monocarboxylic acids such as acetic acid, propionic acid, n-butyric acid, isobutyric acid, n-valeric acid, isovaleric acid, benzoic acid, and cinnamic acid; hydroxymonocarboxylic acids such as lactic acid, 2-hydroxybutyric acid, 3-hydroxybutyric acid, salicylic acid, m-hydroxybenzoic acid, p-hydroxybenzoic acid, 2-hydroxycinnamic acid, 3-hydroxycinnamic acid, 4-hydroxycinnamic acid, 5-hydroxyisophthalic acid, and syringic acid; polyvalent carboxylic acids such as oxalic acid, succinic acid, glutaric acid, adipic acid, maleic acid, itaconic acid, hexahydrophthalic acid, phthalic acid, isophthalic acid, terephthalic acid, 1,2-cyclohexanedicarboxylic acid, 1,2,4-cyclohexanetricarboxylic acid, butanetetracarboxylic acid, trimellitic acid, pyromellitic acid, cyclopentanetetracarboxylic acid, butanetetracarboxylic acid, and 1,2,5,8-naphthalenetetracarboxylic acid; acid anhydrides such as itaconic anhydride, succinic anhydride, citraconic anhydride, dodecenylsuccinic anhydride, tricarbanilic anhydride, maleic anhydride, hexahydrophthalic anhydride, methyltetrahydrophthalic anhydride, Himic anhydride, 1,2,3,4-butanetetracarboxylic anhydride, cyclopentanetetracarboxylic dianhydride, phthalic anhydride, pyromellitic anhydride, trimellitic anhydride, benzophenonetetracarboxylic anhydride, ethylene glycol bis anhydrous trimellitate, and glycerin tris anhydrous trimellitate; and the like.

Furthermore, specific examples of the solvent having a high boiling point include N-methylformamide, N,N-dimethylformamide, N-methylformanilide, N-methylacetamide, N,N-dimethlyacetamide, N-methylpyrrolidone, dimethyl sulfoxide, benzyl ethyl ether, dihexyl ether, acetonyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, and the like.

Moreover, the photosensitive composition may further contain a well-known sensitizer for improving the sensitivity.

<<Method of Preparing Chemically Amplified Positive-Type Photosensitive Composition>

A chemically amplified positive-type photosensitive composition is prepared by mixing and stirring the constituting component of the composition by the common method. Machines which can be used for mixing and stirring the above components include dissolvers, homogenizers, 3-roll mills and the like. After uniformly mixing the above components, the resulting mixture may be filtered through a mesh, a membrane filter and the like.

<<Photosensitive Dry Film>>

A photosensitive dry film includes a substrate film, and a photosensitive layer formed on the surface of the substrate film. The photosensitive layer is made of the aforementioned photosensitive compositions.

As the substrate film, a film having optical transparency is preferable. Specifically, a polyethylene terephthalate (PET) film, a polypropylene (PP) film, a polyethylene (PE) film, and the like. In view of excellent balance between the optical transparency and the breaking strength, a polyethylene terephthalate (PET) film is preferable.

The aforementioned photosensitive composition is applied on the substrate film to form a photosensitive layer, and thereby a photosensitive dry film is manufactured. When the photosensitive layer is formed on the substrate film, a photosensitive composition is applied and dried on the substrate film using an applicator, a bar coater, a wire bar coater, a roller coater, a curtain flow coater, and the like, so that a film thickness after drying is preferably 0.5 μm or more and 300 μm or less, more preferably 1 μm or more and 300 μm or less, and particularly preferably 3 μm or more and 100 μm or less.

The photosensitive dry film may have a protective film on the photosensitive layer. Examples of the protective film include a polyethylene terephthalate (PET) film, a polypropylene (PP) film, a polyethylene (PE) film, and the like.

<<Patterned Resist Film>>

Using the photosensitive composition explained above, the method of forming a patterned resist film on a metal surface of a substrate which at least partly has a surface consisting of metal is not particularly limited. Such a patterned resist film is suitably used as a template and the like for forming an insulating film, an etching mask, and a plated article. As a suitable method, a production method of a patterned resist film can be exemplified which includes:

a lamination step of laminating a photosensitive layer consisting of the photosensitive composition on the metal surface of the substrate which at least partly has a surface consisting of metal;

an exposure step of exposing the photosensitive layer by position selectively irradiating active rays or radioactive rays; and a development step of developing an exposed photosensitive layer. A method of forming a substrate with a template for forming a plated article is the same method as the method of manufacturing a patterned resist film except that the method includes laminating a photosensitive layer on a metal surface of the substrate having a metal surface, and a template for forming a plated article is produced by developing in the developing step.

The substrate on which the photosensitive layer is laminated is not particularly limited, and conventionally known substrates can be used. Examples thereof include a substrate for an electronic component, and the substrate on which a predetermined wiring pattern is formed. As the substrate, a silicon substrate, glass substrate, or the like, can be used. When a substrate with a template for forming a plated article is manufactured, for the substrate, a substrate having a metal surface is used. As metal species constituting a metal surface, copper, gold and aluminum are preferred, and copper is more preferred.

The photosensitive layer is laminated on the substrate, for example, as follows. In other words, a liquid photosensitive composition is coated onto a substrate, and the coating is heated to remove the solvent and thus to form a photosensitive layer having a desired thickness. The thickness of the photosensitive layer is not particularly limited as long as it is possible to form a patterned resist film which has a desired thickness. The thickness of the photosensitive layer is not particularly limited, and is preferably 0.5 μm or more, more preferably 0.5 μm or more and 300 μm or less, further preferably 0.5 μm or more and 200 μm or less, and particularly preferably 0.5 μm or more and 150 μm or less.

As a method of applying a photosensitive composition onto a substrate, methods such as the spin coating method, the slit coat method, the roll coat method, the screen printing method and the applicator method can be employed. Pre-baking is preferably performed on a photosensitive layer. The conditions of pre-baking may differ depending on the components in a photosensitive composition, the blending ratio, the thickness of a coating film and the like. They are usually about 2 minutes or more and 120 minutes or less at 70° C. or more and 200° C. or less, and preferably 80° C. or more and 150° C. or less.

The photosensitive layer formed as described above is selectively irradiated (exposed) with an active ray or radiation, for example, an ultraviolet radiation or visible light with a wavelength of 300 nm or more and 500 nm or less through a mask having a predetermined pattern.

Low pressure mercury lamps, high pressure mercury lamps, super high pressure mercury lamps, metal halide lamps, argon gas lasers, etc. can be used for the light source of the radiation. The radiation may include micro waves, infrared rays, visible lights, ultraviolet rays, X-rays, γ-rays, electron beams, proton beams, neutron beams, ion beams, etc. The irradiation dose of the radiation may vary depending on the constituent of the photosensitive composition, the film thickness of the photosensitive layer, and the like. For example, when an ultra-high-pressure mercury lamp is used, the dose may be 100 mJ/cm$^2$ or more and 10,000 mJ/cm$^2$ or less. The radiation includes a light ray to activate the acid generator (A) in order to generate an acid.

After the exposure, the diffusion of acid is promoted by heating the photosensitive layer using a known method to change the alkali solubility of the photosensitive layer in developing solution such as an alkali developing solution at an exposed portion in the photosensitive resin film.

Subsequently, the exposed photosensitive layer is developed in accordance with a conventionally known method, and an unnecessary portion is dissolved and removed to form a template for forming a patterned resist film having predetermined pattern or plated articles. At this time, as the developing solution, an alkaline aqueous solution is used.

As the developing solution, an aqueous solution of an alkali such as, for example, sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5.4.0]-7-undecene or 1,5-diazabicyclo[4.3.0]-5-nonane can be used. Also, an aqueous solution prepared by adding an adequate amount of a water-soluble soluble organic solvent such as methanol or ethanol, or a surfactant to the above aqueous solution of the alkali can be used as the developing solution. Furthermore, depending on the composition of the photosensitive composition, developing by an organic solvent can be applied.

The developing time may vary depending on the composition of the photosensitive composition, the film thickness of the photosensitive layer, and the like. Usually, the developing time is 1 minute or more and 30 minutes or less. The method of the development may be any one of a liquid-filling method, a dipping method, a paddle method, a spray developing method, and the like.

After development, running water wash is performed for at least 30 seconds and no more than 90 seconds, and then dried using an air gun, oven or the like. By configuring in this way, the patterned resist film is formed in the desired shape on the surface of the substrate. In addition, by configuring in this way, it is possible to produce a substrate with a template including a patterned resist film which becomes the template, on the metal surface of the substrate having the metal surface.

In the case of forming a patterned resist film on the metal surface of a substrate which at least partly has a surface consisting of metal using the aforementioned photosensitive composition, variation in the dimensions of the patterned resist film caused by a slight film thickness difference in the resist film is suppressed. For this reason, the above-mentioned method can form a patterned resist film having high dimensional accuracy.

A conductor such as a metal may be embedded, by plating, into a nonresist portion (a portion removed with a developing solution) in the template formed by the above method on the substrate to form a plated article, for example, like a contacting terminal such as a bump and a metal post, or Cu rewiring. Note here that there is no particular limitation on the method of plate processing, and various conventionally known methods can be used. As a plating liquid, in particular, a solder plating liquid, a copper plating liquid, a gold plating liquid, and a nickel plating liquid are suitably used. The remaining template is removed with a stripping liquid and the like in accordance with a conventional method.

Upon producing a plated article, it is preferable to perform an ashing treatment on the metal surface exposed at a non-pattern part of the patterned resist film which becomes the template for the plated article. A plated article which is superior in adhesion to the metal surface tends to be formed in this case. This is because, by ashing, it is possible to reduce the adverse effect exerted by the compound (C1) or sulfur-containing compound (E) oriented to the metal surface, on adhesion of the plated article.

The ashing treatment is not particularly limited as long as long as it does not damage a resist pattern serving as a template for forming the plated article to such an extent that the plated article having a desired shape cannot be formed. Preferable ashing treatment methods include a method using oxygen plasma. For ashing with respect to the metal surface of the substrate using oxygen plasma, an oxygen plasma is generated using a known oxygen plasma generator, and the metal surface on the substrate is irradiated with the oxygen plasma.

Various gases which have conventionally been used for plasma treatment together with oxygen can be mixed into gas to be used for generating oxygen plasma within a range where the objects of the present invention are not impaired. Examples of such gas include nitrogen gas, hydrogen gas, $CF_4$ gas, and the like. Conditions of ashing using oxygen plasma are not particularly limited within a range where the objects of the present invention are not impaired, but treatment time is, for example, in a range of 10 seconds or more and 20 minutes or less, preferably in a range of 20 seconds or more and 18 minutes or less, and more preferably in a range of 30 seconds or more and 15 minutes or less. By setting the treatment time by oxygen plasma to the above range, an effect of improving the adhesiveness of the plated article can be easily achieved without changing a shape of the resist pattern.

It is possible to form a patterned resist film of high dimensional precision using the aforementioned photosensitive composition, and using this patterned resist film as a template for plated article formation, it is possible to form a plated article such as a bump electrode or metal post having high dimensional precision.

EXAMPLES

Hereinafter, the present invention will be explained in further detail by way of the Examples; however, the present invention is not to be limited to these Examples.

Example 1

DS2 of the following structure corresponding to the compound represented by the aforementioned Formula (C2) was produced in accordance with the following method.

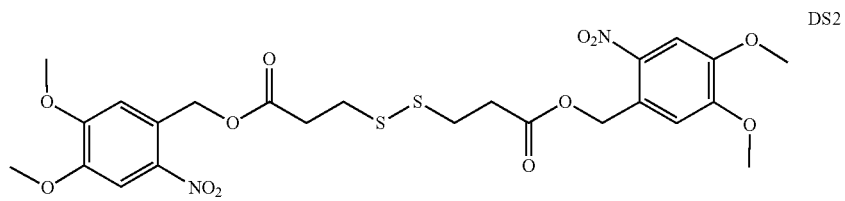
DS2

Into a three-necked flask of 300 mL capacity were charged 5.00 g of 4,5-dimethoxy-2-nitrobenzyl alcohol, and 2.46 g of 3,3'-dithiopropionic acid. After establishing inside the flask as a nitrogen environment, 50 g of methylene chloride was added into the flask. Subsequently, the contents of the flask were cooled in an ice bath, while stirring the contents of the flask with a magnetic stirrer. Next, 6.72 g of 1-(3-dimethylaminopropyl)-3-ethyl carbodiimide hydrochloride, and 0.01 g of N,N-dimethylaminopyridine were added into the flask. Subsequently, the reaction was carried out agitating the contents of the flask at room temperature for 16 hours. After reaction completion, 100 g of methylene chloride was added into the flask. The solution inside the flask was washed three times with aqueous hydrochloric acid of 1% by mass concentration. Furthermore, the solution inside the flask was washed three times with 100 g of purified water. Methylene chloride was distilled from the washed solution in the flask to obtain a crude article of DS2. The obtained crude article of DS2 was recrystallized in methylene chloride to obtain 4.57 g of purified DS2.

$^1$H-NMR measurement results of DS2 are noted below.

$^1$H-NMR(CDCl$_3$): δ 7.71 (s, 2H), 7.00 (s, 2H), 5.55 (s, 4H), 4.00 (s, 6H), 3.93 (s, 6H), 2.95 (m, 4H), 2.85 (m, 4H)

Example 2

The DS2 obtained in Example 1 was reduced in accordance with the following method to produce DS1 of the following structure.

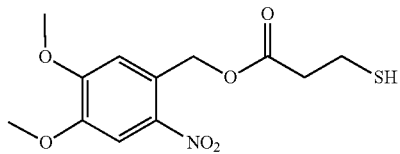
DS1

Into a three-necked flask of 300 mL capacity were added 4.00 g of DS2, 3.08 g of dithiothreitol, 1.00 g of triethylamine and 100 g of methylene chloride. The contents of the flask were agitated for 6 hours by a magnetic stirrer at room temperature under a nitrogen atmosphere, and the reduction reaction was carried out. After reaction, the solution in the flask was washed three times with aqueous hydrochloride acid of 1% by mass concentration. Furthermore, the solution in the flask was washed three time with 100 g of purified water. Methylene chloride was distilled from the washed solution in the flask to obtained a crude article of DS1. The obtained crude article of DS1 was recrystallized in methylene chloride to obtain 3.21 g of purified DS1.

$^1$H-NMR measurement results of DS1 are noted below.

$^1$H-NMR(CDCl$_3$): δ 7.71 (s, 2H), 7.00 (s, 2H), 5.55 (s, 4H), 4.00 (s, 6H), 3.93 (s, 6H), 2.97-2.73 (m, 9H)

Examples 3 to 20, and Comparative Examples 1 to 11

In Examples 3 to 20 and Comparative Examples 1 to 11, PAG1 of the following formula was used as the acid generator (A).

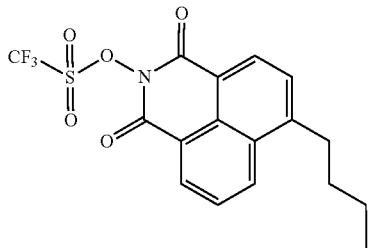
PAG1

In the Examples and Comparative Examples, the following Resin-B1, Resin-B2 and Resin-B3 as the resin (resin (B)) for which the solubility to alkali increases by action of acid, and the Resin-B4 which is a polyhydroxystyrene resin in which 25% of the constituent units derived from hydroxystyrene are crosslinked by 1,4-cyclohexanediol divinyl ether were used. The numerical character on the lower right of the parentheses in each constituent unit of the following structural formula represents the content (% by mass) of constituent unit in the resin. The mass average molecular weight of Resin-B1 is 10,000. The mass average molecular weight of Resin-B2 is 10,000. The mass average molecular weight of Resin-B3 is 40,000.

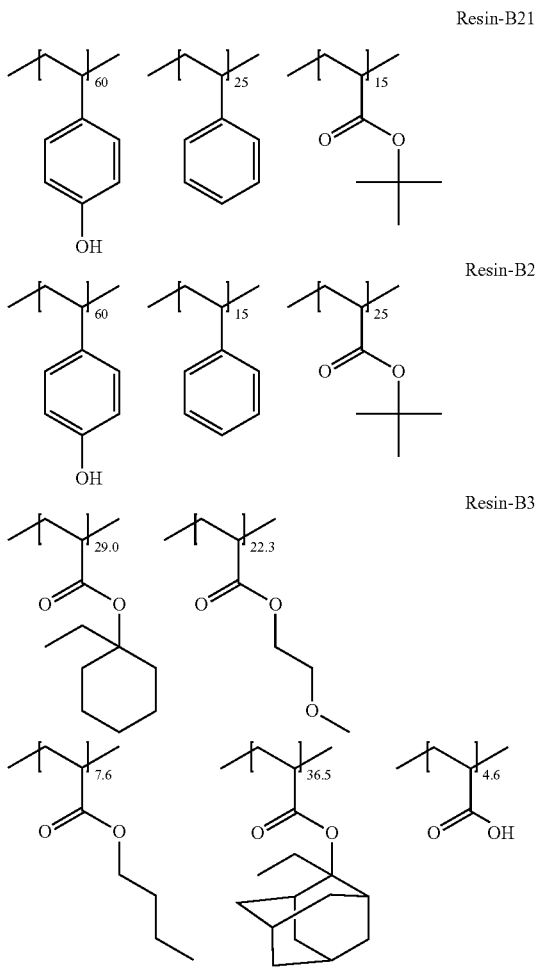

In Examples 3 to 20, the following C-1 to C-3 were used as the compound (C1) or precursor compound (C2). The compound of the following C3 was obtained based on the disclosure of US Patent Application Publication No. 2015/185158.

C-1: DS1 obtained in Example 2 (molar absorption coefficient ε at a wavelength of 365 nm of 5300)

C-2: DS2 obtained in Example 1 (reference value as precursor compound; molar absorption coefficient ε at a wavelength of 365 nm of 10500)

C-3: compound of following structure (molar absorption coefficient ε at a wavelength of 365 nm of 8343)

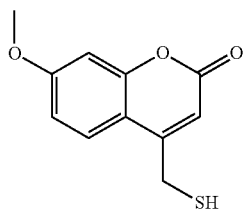

In Comparative Examples 2 to 11, the following C'-1 to C'-7 were used as compound (C'1) which is the comparison target of compound (C1). It should be noted that C'-1 to C'-5 are compounds having a molar absorption coefficient ε at a wavelength of 365 nm of at least 3000, but not having a metal coordination group. C'-6 is a compound having a mercapto group as a metal coordination group, but having a molar absorption coefficient ε at a wavelength of 365 nm of less than 3000.

C'-1: 2,2',4,4'-tetrahydroxybenzophenone (molar absorption coefficient ε at a wavelength of 365 nm of 11134)

C'-2: 1-[1-(4-hydroxyphenyl)isopropyl]-4-[1,1-bis(4-hydroxyphenyl)ethyl]benzene

C'-3: 4-dimethylamino-4'-hydroxyazobenzene

C'-4: benzophenone

C'-5: 4-diethylaminoazobenzene

C'-6: 2,4-dihydroxy-6-mercapto-1,3,5-triazine (molar absorption coefficient ε at a wavelength of 365 nm of 2.9)

In Examples 13 to 15 and Comparative Example 10, Resin D (novolac resin (m-cresol/p-cresol condensation product (m-cresol/p-cresol=40/60 (mass ratio)) was used as the alkali-soluble resin (D).

In the Examples and Comparative Examples, 2,4,6-triphenyl pyridine was used as the acid diffusion inhibitor (F).

The photosensitive compositions of each of the Examples and Comparative Examples were obtained by dissolving, in propylene glycol monomethyl ether acetate (PGMEA), 1.0 parts by mass of the acid generator (A), the resin (B) of the type and amount described in Table 1 and Table 2, 0.5 parts by mass of the compound (C1), precursor compound (C2) or compound (C'1) of the type described in Table 1 and Table 2, the alkali-soluble resin (D) of the type and amount described in Table 1, 0.5 parts by mass of acid diffusion inhibitor (F), and 0.05 parts by mass of surfactant (BYK310, manufactured by BYK-Chemie), so that the solid content concentration becomes 18% by mass. It should be noted that the compound (C') was not used in Comparative Example 1.

Using the obtained photosensitive composition, the Swing amount, which is the fluctuation range of pattern dimensions caused by differences in the thickness of the resist film, was evaluated in accordance with the following method. Evaluation results of these are noted in Table 1 and Table 2.

(Evaluation of Swing Amount)

A substrate on which a copper film of 200 nm thickness was provided by sputtering on a surface of Si substrate was prepared, the photosensitive compositions of the Examples and Comparative Examples were coated on the copper layer of this substrate, and dried for 90 seconds at 90° C. on a hot plate to form a photosensitive layer (coating film of photosensitive composition). For one type of photosensitive composition, the film thickness of the photosensitive layer was changed to 1.10 μm, 1.12 μm, 1.14 μm, 1.16 μm, 1.18 μm, 1.20 μm, 1.22 μm, 1.24 μm, 1.26 μm, 1.28 μm and 1.30 μm, to carry out formation of the photosensitive layer on eleven pieces of Si substrate. Next, on each photosensitive layer of different film thickness, using a mask of line-and-space pattern of 0.8-μm line width and 0.8-μm space width and a Canon FPA-5520iV (NA=0.18 manufactured by Canon), exposure was performed with an exposure amount by which a pattern of 0.8-μm line width and 0.8-μm space width was formed, in the case of the film thickness of the resist film being 1.20 μm. After exposure, post-exposure heating (PEB) was performed for 90 seconds at 90° C. by placing the substrate on a hot plate. Subsequently, the operation of dropping a 2.38% by weight aqueous solution of tetramethylammoniumhydroxide (TMAH) (developing solution, NMD-3, manufactured by Tokyo Ohka Kogyo Co., Ltd.) onto the exposed photosensitive layer, leaving to stand for 60 seconds at 23° C. (puddle development) was repeated a total of two times. Subsequently, after running water washing (rinse) the surface of the resist film patterned by development for 60 seconds, it was spin dried to obtain a patterned resist film. Based on the observation images obtained by observing each patterned resist film of different film thickness obtained with a transmission electron microscope (SEM), the width of space in patterned resist films was measured. Data related to each resist film was plotted on a coordinate plane defining the resist film thickness as the horizontal axis and the measured width of space as the vertical axis, and the relationship between the space width and the resist film thickness within the range of resist film thickness of 1.10 μm to 1.30 μm was derived. Based on the derived relationship between the resist film thickness and space width, the Swing amount was obtained as the difference between the maximum value for the space width and the minimum value for the space width within the range of resist film thicknesses of 1.10 μm to 1.30 μm. In the case of the Swing amount being no more than 0.3 μm, it was evaluated as very good, the case of the Swing amount being at least 0.3 μm and less than 0.4 μm was evaluated as good, and the case of the Swing amount being at least 0.4 μm was evaluated as bad.

TABLE 1

|  | Resin (B) Type/Parts by mass | Alkali-soluble resin (D) Parts by mass | Compound (C1) or Precursor compound (C2) Type | Evaluation of swing amount |
| --- | --- | --- | --- | --- |
| Example 3 | Resin-B1/100 | — | C-1 | Good |
| Example 4 | Resin-B1/100 | — | C-2 | Very good |
| Example 5 | Resin-B1/100 | — | C-3 | Very good |
| Example 6 | Resin-B2/100 | — | C-1 | Good |
| Example 7 | Resin-B2/100 | — | C-2 | Very good |
| Example 8 | Resin-B2/100 | — | C-3 | Very good |
| Example 9 | Resin-B3/100 | — | C-1 | Good |
| Example 10 | Resin-B3/100 | — | C-2 | Very good |
| Example 11 | Resin-B3/100 | — | C-3 | Very good |
| Example 12 | Resin-B1/50 Resin-B3/50 | — | C-1 | Good |
| Example 13 | Resin-B1/50 Resin-B3/50 | — | C-2 | Very good |
| Example 14 | Resin-B1/50 Resin-B3/50 | — | C-3 | Very good |
| Example 15 | Resin-B1/30 Resin-B3/50 | 20 | C-1 | Good |
| Example 16 | Resin-B1/30 Resin-B3/50 | 20 | C-2 | Very good |
| Example 17 | Resin-B1/30 Resin-B3/50 | 20 | C-3 | Very good |
| Example 18 | Resin-B4/100 | — | C-1 | Good |
| Example 19 | Resin-B4/100 | — | C-2 | Very good |
| Example 20 | Resin-B4/100 | — | C-3 | Very good |

TABLE 2

|  | Resin (B) Type/Parts by mass | Alkali-soluble resin (D) Parts by mass | Compound (C'1) Type | Evaluation of swing amount |
| --- | --- | --- | --- | --- |
| Comparative Example 1 | Resin-B1/100 | — | — | Bad |
| Comparative Example 2 | Resin-B1/100 | — | C'-1 | Bad |
| Comparative Example 3 | Resin-B1/100 | — | C'-2 | Bad |
| Comparative Example 4 | Resin-B1/100 | — | C'-3 | Bad |
| Comparative Example 5 | Resin-B1/100 | — | C'-4 | Bad |
| Comparative Example 6 | Resin-B1/100 | — | C'-5 | Bad |
| Comparative Example 7 | Resin-B1/100 | — | C'-6 | Bad |
| Comparative Example 8 | Resin-B2/100 | — | C'-1 | Bad |
| Comparative Example 9 | Resin-B3/100 | — | C'-1 | Bad |
| Comparative Example 10 | Resin-B1/30 Resin-B3/50 | 20 | C'-1 | Bad |
| Comparative Example 11 | Resin-B4/100 | — | C'-1 | Bad |

According to the Examples, in the case of forming a patterned resist film on a metal surface using a chemically amplified photosensitive composition including the compound (C1) or precursor compound (C2) satisfying predetermined requirements related to molar absorption coefficient and metal coordination group, it was found that the Swing amount was small, and variation in the pattern dimensions caused by slight differences in film thickness of the resist film is suppressed. On the other hand, according to the Comparative Examples, in the case of forming a patterned resist film on a metal surface using a chemically amplified photosensitive composition not including the aforementioned compound (C1) or precursor compound (C2), it was found that the Swing amount was large, and variation in the pattern dimensions caused by slight differences in film thickness of the resist film could not be suppressed.

What is claimed is:

1. A chemically amplified photosensitive composition used for forming a patterned resist film by photolithography on a metal surface of a substrate which at least partly has a surface consisting of metal, the composition comprising:

an acid generator (A) which generates an acid by irradiation of active rays or radioactive rays; and a compound (C1) and/or a precursor compound (C2), wherein a molar absorption coefficient c at a wavelength of 365 nm of the compound (C1) is at least 3000, the compound (C1) has a metal coordination group, and wherein the precursor compound (C2) is a compound which can produce the compound (C1) during formation of a patterned resist film using the composition, and the compound (C1) includes at least one compound selected from a compound represented by Formula (C1-1) below:

Ar—$Y^3$—$Y^2$—$Y^1$—SH        (C1-1), wherein $Y^1$ is a single bond or an alkylene group having 1 or more and 5 or fewer carbon atoms, $Y^2$ is —CO—O— or —O—CO—, $Y^3$ is a single bond or an alkylene group having 1 or more and 5 or fewer carbon atoms, and Ar is a phenyl group substituted by at least one group selected from a nitro group and an alkoxy group having 1 or more and 5 or fewer carbon atoms, or compounds represented by the following formula (W):

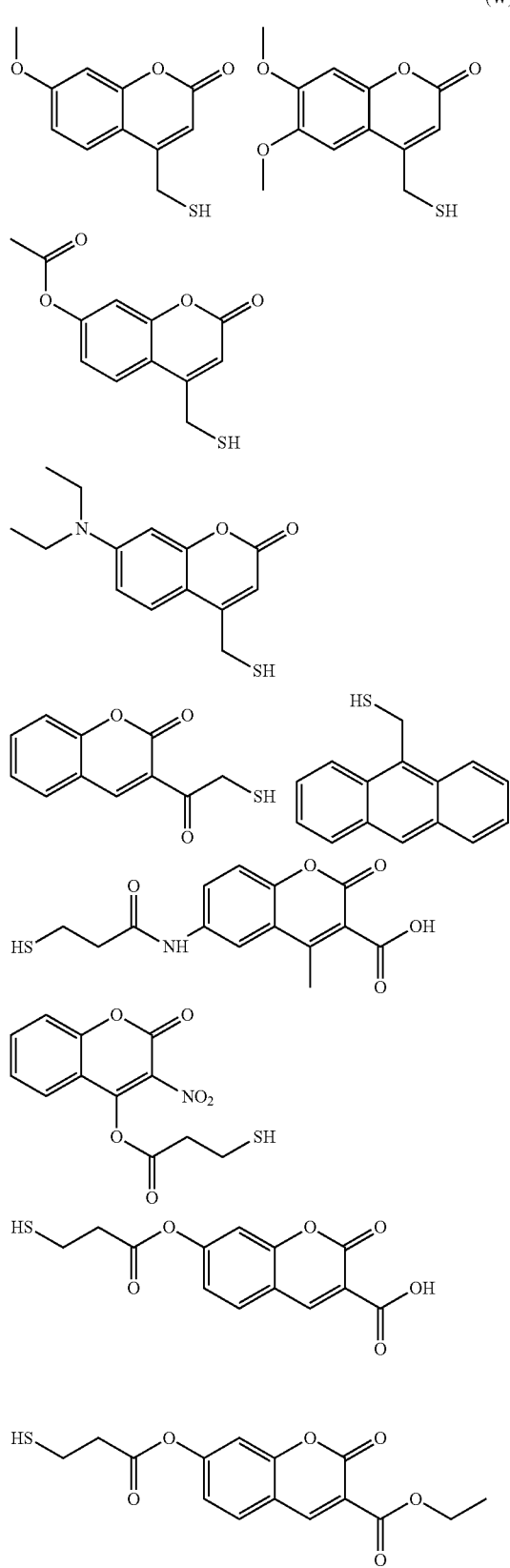

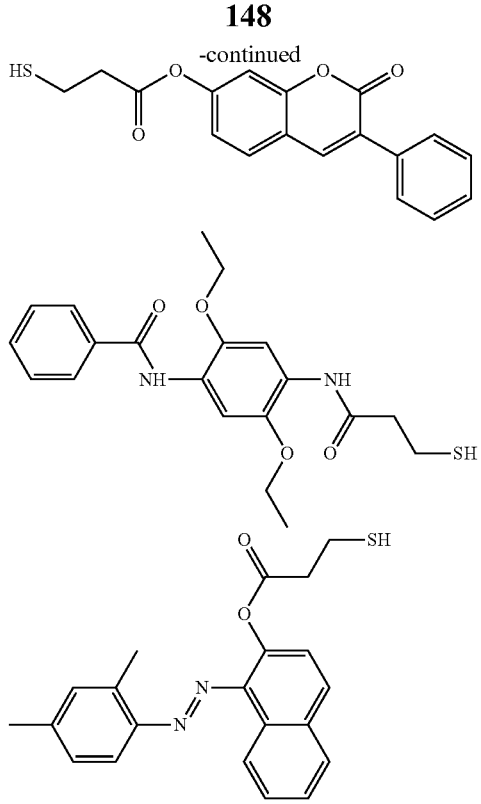

and further comprising a resin (B) for which solubility in alkali increases by action of acid, wherein the chemically amplified photosensitive composition is positive-type.

2. The chemically amplified photosensitive composition according to claim 1, wherein the metal is copper.

3. The chemically amplified photosensitive composition photosensitive composition according to claim 1, further comprising an alkali-soluble resin (D).

4. The chemically amplified photosensitive composition according to claim 3, wherein the alkali-soluble resin (D) comprises at least one type of resin selected from the group consisting of a novolac resin (D1), polyhydroxystyrene resin (D2) and acrylic resin (D3).

5. A photosensitive dry film comprising a base film, and a photosensitive layer formed on a surface of the base film, wherein the photosensitive layer comprises the chemically amplified photosensitive composition according to claim 1.

6. A production method for a patterned resist film, the method comprising:
  laminating a photosensitive layer consisting of the chemically amplified photosensitive composition according to claim 1 on a metal surface of a substrate which at least partly has a surface consisting of metal;
  position-selectively irradiating active rays or radioactive rays onto the photosensitive layer; and
  developing the photosensitive layer after exposure.

7. A production method for a plated article, the method comprising:
  producing a patterned resist film on a metal surface of a substrate which at least partly has a surface consisting of metal using the production method for a patterned resist film according to claim 6; and
  forming a plated article using the resist film which was patterned as a template.

8. The chemically amplified photosensitive composition according to claim 1, wherein the precursor compound (C2) includes a compound represented by Formula (C2-1) below:

$$Ar—Y^3—Y^2—Y^1—S—S—Y^1—Y^2—Y^3—Ar \quad (C2\text{-}1)$$

wherein $Y^1$ is a single bond or an alkylene group having 1 or more and 5 or fewer carbon atoms, $Y^2$ is —CO—O— or —O—CO—, $Y^3$ is a single bond or an alkylene group having 1 or more and 5 or fewer carbon atoms, and Ar is a phenyl group substituted by at least one group selected from a nitro group and an alkoxy group having 1 or more and 5 or fewer carbon atoms.

\* \* \* \* \*